US012713822B2

(12) United States Patent
Shin et al.

(10) Patent No.: US 12,713,822 B2
(45) Date of Patent: Aug. 18, 2026

(54) DISPLAY ADJUSTING VIEWING ANGLE AND ELECTRONIC DEVICE INCLUDING THE SAME

(71) Applicant: Samsung Electronics Co., Ltd., Suwon-si (KR)

(72) Inventors: Sungyoung Shin, Suwon-si (KR); Keehyon Park, Suwon-si (KR); Byungduk Yang, Suwon-si (KR); Haechang Lee, Suwon-si (KR); Seungryeol Kim, Suwon-si (KR); Daekeun Park, Suwon-si (KR); Seungheon Lee, Suwon-si (KR); Hunhee Lee, Suwon-si (KR); Sungmin Chu, Suwon-si (KR); Kwangtai Kim, Suwon-si (KR); Donghyun Yeom, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 19/425,088

(22) Filed: Dec. 18, 2025

(65) Prior Publication Data

US 2026/0157097 A1 Jun. 4, 2026

Related U.S. Application Data

(63) Continuation of application No. PCT/KR2025/010588, filed on Jul. 17, 2025.

(30) Foreign Application Priority Data

Sep. 6, 2024 (KR) ........................ 10-2024-0121926
Oct. 14, 2024 (KR) ........................ 10-2024-0139625
Mar. 11, 2025 (KR) ........................ 10-2025-0031701

(51) Int. Cl.
*H10K 59/80* (2023.01)
*H10K 59/131* (2023.01)
*H10K 59/35* (2023.01)

(52) U.S. Cl.
CPC ....... *H10K 59/8792* (2023.02); *H10K 59/131* (2023.02); *H10K 59/353* (2023.02)

(58) Field of Classification Search
CPC . H10K 59/8792; H10K 59/131; H10K 59/353
See application file for complete search history.

(56) References Cited

U.S. PATENT DOCUMENTS 9,250,446 B2 2/2016 Krijn et al.
10,325,959 B2 6/2019 Wang et al.
(Continued)

FOREIGN PATENT DOCUMENTS

CN 110824740 A 2/2020
KR 10-1875012 B1 7/2018
(Continued)

OTHER PUBLICATIONS

International Search Report dated Nov. 3, 2025, issued in International Application No. PCT/KR2025/010588.

*Primary Examiner* — John P. Dulka
(74) *Attorney, Agent, or Firm* — Jefferson IP Law, LLP

(57) ABSTRACT

A display is provided. The display includes gate driver circuitry, and a display panel including a first layer including a black matrix (BM) that defines first light transmittance portions and second light transmittance portions, wherein the first light transmittance portions and the second transmittance portions alternate with each other, and wherein each of the second light transmittance portions includes third light transmittance portions, smaller than the first light transmittance portions, and a second layer, disposed below the first layer, including light emitting diodes (LEDs), the LEDs including first groups of LEDs that are respectively (Continued)

disposed below the first light transmittance portions, and second groups of LEDs, wherein each of the second groups of LEDs includes LEDs respectively disposed below the third light transmittance portions included in each of the second light transmittance portions, wherein sub-pixels, respectively including the LEDs included in each of the second groups of LEDs, include a first sub-pixel electrically connected to the gate driver circuitry through a scan line, and second sub-pixels electrically connected to the gate driver circuitry through another scan line positioned alongside the scan line electrically connected to the first sub-pixel.

20 Claims, 38 Drawing Sheets

(56) References Cited

U.S. PATENT DOCUMENTS

| | | | | |
|---|---|---|---|---|
| 10,607,534 | B2 | 3/2020 | Tian et al. | |
| 12,108,649 | B2 | 10/2024 | Cho et al. | |
| 12,175,928 | B2 | 12/2024 | Wu et al. | |
| 2022/0301478 | A1 | 9/2022 | Jeong et al. | |
| 2023/0230521 | A1* | 7/2023 | Wu | G09G 3/2003 345/428 |
| 2024/0196690 | A1 | 6/2024 | Wu et al. | |
| 2024/0224683 | A1 | 7/2024 | Jeong et al. | |
| 2024/0260424 | A1* | 8/2024 | Mun | H10K 59/80 |
| 2024/0260432 | A1* | 8/2024 | Shin | H10K 59/38 |
| 2024/0407218 | A1* | 12/2024 | Zhu | H10K 59/60 |

FOREIGN PATENT DOCUMENTS

| | | | |
|---|---|---|---|
| KR | 10-2021-0003071 | A | 1/2021 |
| KR | 10-2022-0008699 | A | 1/2022 |
| KR | 10-2022-0043832 | A | 4/2022 |
| KR | 10-2022-0051683 | A | 4/2022 |
| KR | 10-2022-0130290 | A | 9/2022 |
| KR | 10-2023-0035992 | A | 3/2023 |
| KR | 10-2023-0052777 | A | 4/2023 |
| KR | 10-2024-0108846 | A | 7/2024 |
| KR | 10-2024-0120799 | A | 8/2024 |

* cited by examiner

DISPLAY ADJUSTING VIEWING ANGLE AND ELECTRONIC DEVICE INCLUDING THE SAME

CROSS-REFERENCE TO RELATED APPLICATION(S)

This application is a continuation application, claiming priority under 35 U.S.C. § 365(c), of an International application No. PCT/KR2025/010588, filed on Jul. 17, 2025, which is based on and claims the benefit of a Korean patent application number 10-2024-0121926, filed on Sep. 6, 2024, in the Korean Intellectual Property Office, of a Korean patent application number 10-2024-0139625, filed on Oct. 14, 2024, in the Korean Intellectual Property Office, and of a Korean patent application number 10-2025-0031701, filed on Mar. 11, 2025, in the Korean Intellectual Property Office, the disclosure of each of which is incorporated by reference herein in its entirety.

BACKGROUND

1. Field

The disclosure relates to a display adjusting a viewing angle and an electronic device including the same.

2. Description of Related Art

A display may display visual information. For example, the visual information may be displayed via pixels within a display panel included in the display. For example, each of the pixels may include at least one first sub-pixel emitting light having a first color, at least one second sub-pixel emitting light having a second color, and at least one third sub-pixel emitting light having a third color.

The above information is provided as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide a display adjusting a viewing angle and an electronic device including the same.

Additional aspects will be set forth in part in the description which follows and, in part, will be apparent from the description, or may be learned by practice of the presented embodiments.

In accordance with an aspect of the disclosure, a display is provided. The display includes gate driver circuitry, and a display panel including a first layer including a black matrix (BM) that defines first light transmittance portions and second light transmittance portions, wherein the first light transmittance portions and the second transmittance portions alternate with each other, and wherein each of the second light transmittance portions includes third light transmittance portions, smaller than the first light transmittance portions, and a second layer, disposed below the first layer, including light emitting diodes (LEDs), the LEDs including first groups of LEDs that are respectively disposed below the first light transmittance portions, and second groups of LEDs, wherein each of the second groups of LEDs includes LEDs respectively disposed below the third light transmittance portions included in each of the second light transmittance portions, wherein sub-pixels, respectively including the LEDs included in each of the second groups of LEDs, include a first sub-pixel electrically connected to the gate driver circuitry through a scan line, and second sub-pixels electrically connected to the gate driver circuitry through another scan line positioned alongside the scan line electrically connected to the first sub-pixel.

In accordance with another aspect of the disclosure, an electronic device is provided. The electronic device includes gate driver circuitry, and a display panel including a first layer including a black matrix (BM) that defines first light transmittance portions and second light transmittance portions wherein the first light transmittance portions and the second light transmittance portions alternate with each other, and wherein each of the second light transmittance portions includes third light transmittance portions, smaller than the first light transmittance portions, and a second layer, disposed below the first layer, including light emitting diodes (LEDs), the LEDs including first groups of LEDs that are respectively disposed below the first light transmittance portions, and second groups of LEDs, wherein each of the second groups of LEDs include LEDs respectively disposed below the third light transmittance portions included in each of the second light transmittance portions, wherein sub-pixels, respectively including the LEDs included in each of the second groups of LEDs, include a first sub-pixel electrically connected to the gate driver circuitry through a scan line, and second sub-pixels electrically connected to the gate driver circuitry through another scan line positioned alongside the scan line electrically connected to the first sub-pixel.

In accordance with another aspect of the disclosure, an electronic device is provided. The electronic device includes a display including first pixel groups and second pixel groups. When viewed from outside the display, the first pixel groups is viewable based on a first viewing angle, and the second pixel groups is viewable based on a second viewing angle wider than the first viewing angle. When viewed in a direction substantially perpendicular to the display, a center of one pixel group of the first pixel groups surrounded by a plurality of pixel groups of the second pixel groups may substantially coincide with a center of a virtual polygon connecting centers of the plurality of pixel groups of the second pixel groups.

In accordance with another aspect of the disclosure, an electronic device is provided. The electronic device includes a display configured to provide a first display mode viewable based on a first viewing angle and a second display mode viewable based on a second viewing angle narrower than the first viewing angle. The display includes a pixel layer that includes a first pixel group including a first sub-pixel configured to emit light of a designated color and a second pixel group including a second sub-pixel configured to emit light of the designated color, and a light blocking layer that defines a first light transmittance portion, disposed above the first sub-pixel, having a first width corresponding to the first viewing angle, and a second light transmittance portion, disposed above the second sub-pixel, having a second width corresponding to the second viewing angle, the second width smaller than the first width. As a first example, to the Nth and (N+1)th data lines, the first pixel group is be connected and the second pixel group is not connected, and to the (N+2)th data line, the first pixel group is not connected and the second pixel group is be connected. As a second example, to the Nth scan line, the first pixel group is connected and the second pixel group is not connected, and to the (N+1)th scan line, the first pixel group is not connected and the second pixel group may be connected. As a third example, to a scan line, a sub-pixel included in the first pixel group and a sub-pixel included in the second pixel group is alternately connected.

In accordance with another aspect of the disclosure, an electronic device is provided. The electronic device includes a display configured to provide a first display mode viewable based on a first viewing angle and a second display mode viewable based on at least one of a second viewing angle narrower than the first viewing angle or a third viewing angle narrower than the second viewing angle. The display includes a pixel layer that includes a first pixel group including a first sub-pixel configured to emit light of a designated color, a second pixel group including a second sub-pixel configured to emit light of the designated color, and a third pixel group including a third sub-pixel configured to emit light of the designated color, and a light blocking layer that defines a first light transmittance portion disposed above the first sub-pixel and having a first width corresponding to the first viewing angle, a second light transmittance portion disposed above the second sub-pixel and having a second width, corresponding to the second viewing angle, narrower than the first width, and a third light transmittance portion disposed above the third sub-pixel and having a third width, corresponding to the third viewing angle, narrower than the second width.

In accordance with another aspect of the disclosure, an electronic device is provided. The electronic device includes a display configured to provide a first display mode viewable based on a first viewing angle and a second display mode viewable based on a second viewing angle narrower than the first viewing angle. The display includes a pixel layer that includes a first pixel group including a first sub-pixel configured to emit light of a designated color, a second pixel group including a second sub-pixel configured to emit light of the designated color, and a third pixel group including a third sub-pixel configured to emit light of the designated color, and a light blocking layer that defines a first light transmittance portion disposed above the first sub-pixel and having a first width corresponding to the first viewing angle, a second light transmittance portion disposed above the second sub-pixel and having a second width, corresponding to the second viewing angle, narrower than the first width, and a third light transmittance portion disposed above the third sub-pixel and having a third width, corresponding to the second viewing angle, narrower than the first width. The light blocking layer includes a first light blocking portion disposed in a first direction with respect to the second light transmittance portion and a second light blocking portion disposed in a second direction different from the first direction with respect to the third light transmittance portion. A light blocking portion is not adjacently disposed in the second direction with respect to the second light transmittance portion, and a light blocking portion is not adjacently disposed in the first direction with respect to the third light transmittance portion.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms “a,” “an,” and “the” include plural referents unless the context clearly dictates otherwise. Thus, for example, reference to “a component surface” includes reference to one or more of such surfaces It should be appreciated that the blocks in each flowchart and combinations of the flowcharts may be performed by one or more computer programs which include instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g. a central processing unit (CPU)), a communication processor (CP, e.g., a modem), a graphics processing unit (GPU), a neural processing unit (NPU) (e.g., an artificial intelligence (AI) chip), a wireless fidelity (Wi-Fi) chip, a Bluetooth® chip, a global positioning system (GPS) chip, a near field communication (NFC) chip, connectivity chips, a sensor controller, a touch controller, a finger-print sensor controller, a display driver integrated circuit (IC), an audio CODEC chip, a universal serial bus (USB) controller, a camera controller, an image processing IC, a microprocessor unit (MPU), a system on chip (SoC), an IC, or the like.

Figure 1:
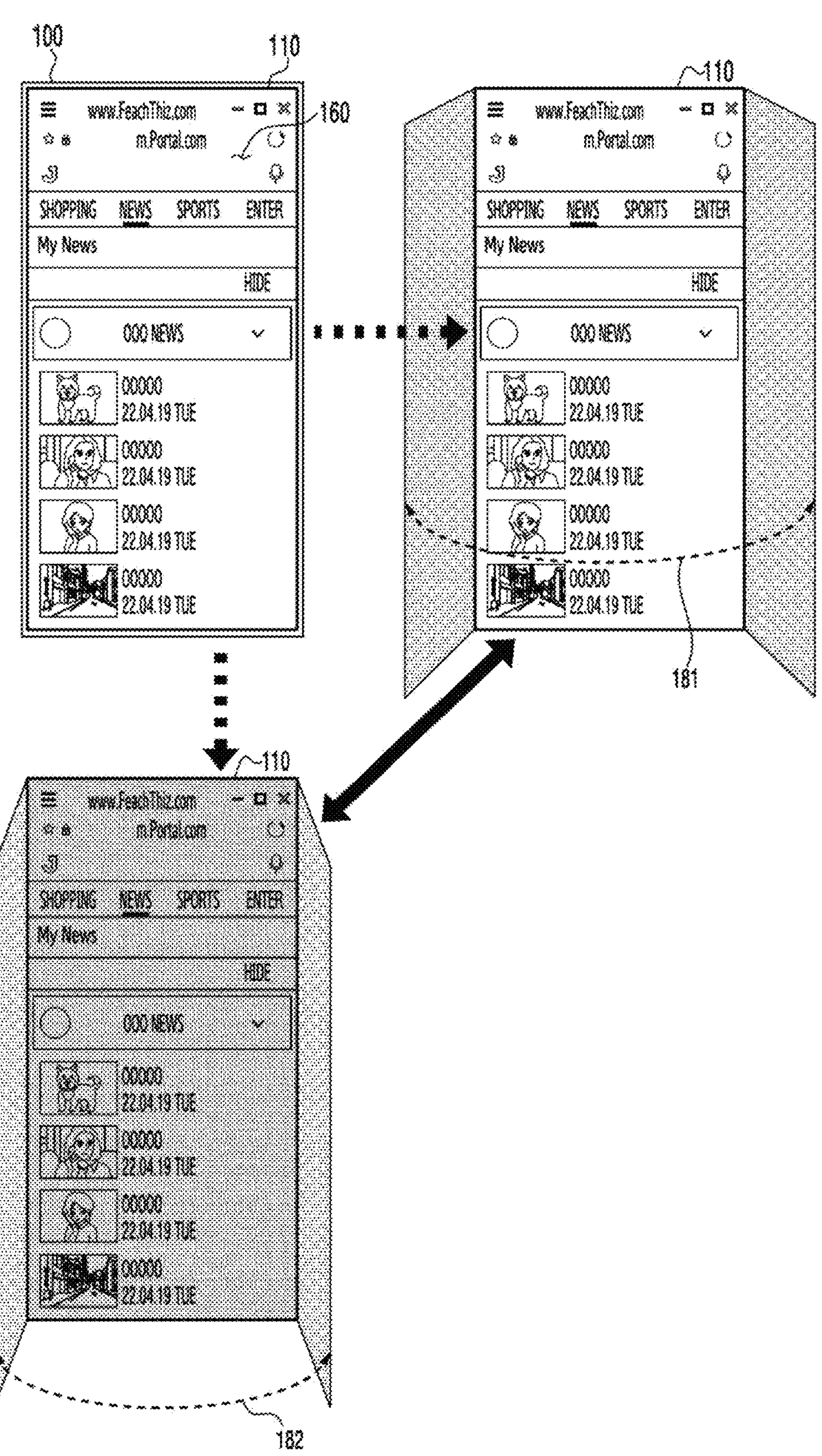
FIG. 1 illustrates an example of adjusting a viewing angle of a screen according to an embodiment of the disclosure.

FIG. 1 illustrates an example of adjusting a viewing angle of a screen according to an embodiment of the disclosure.

Figure 2:
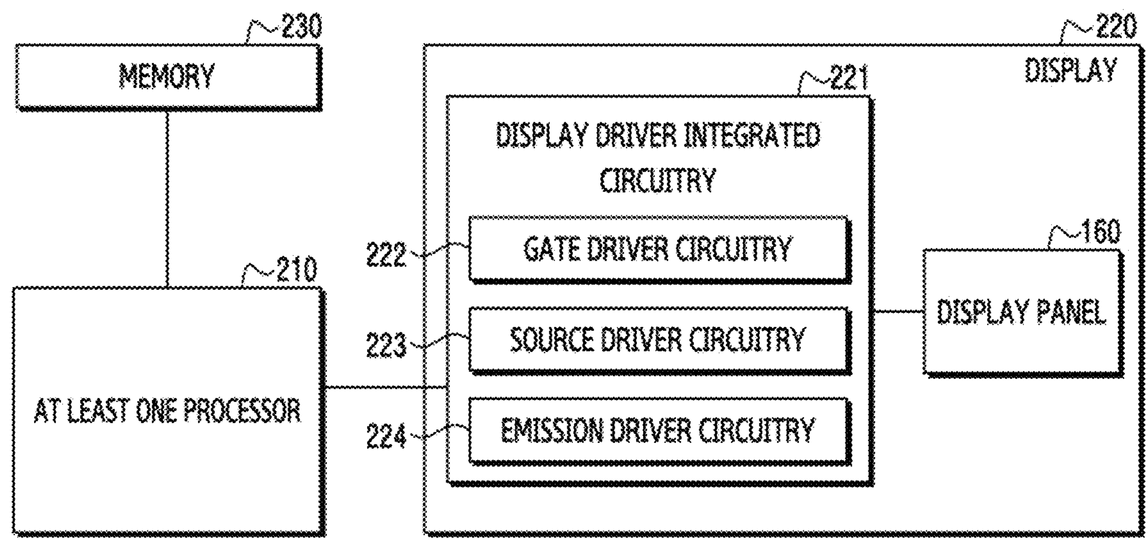
FIG. 2 is a schematic view of an electronic device according to an embodiment of the disclosure.
Figure 27:
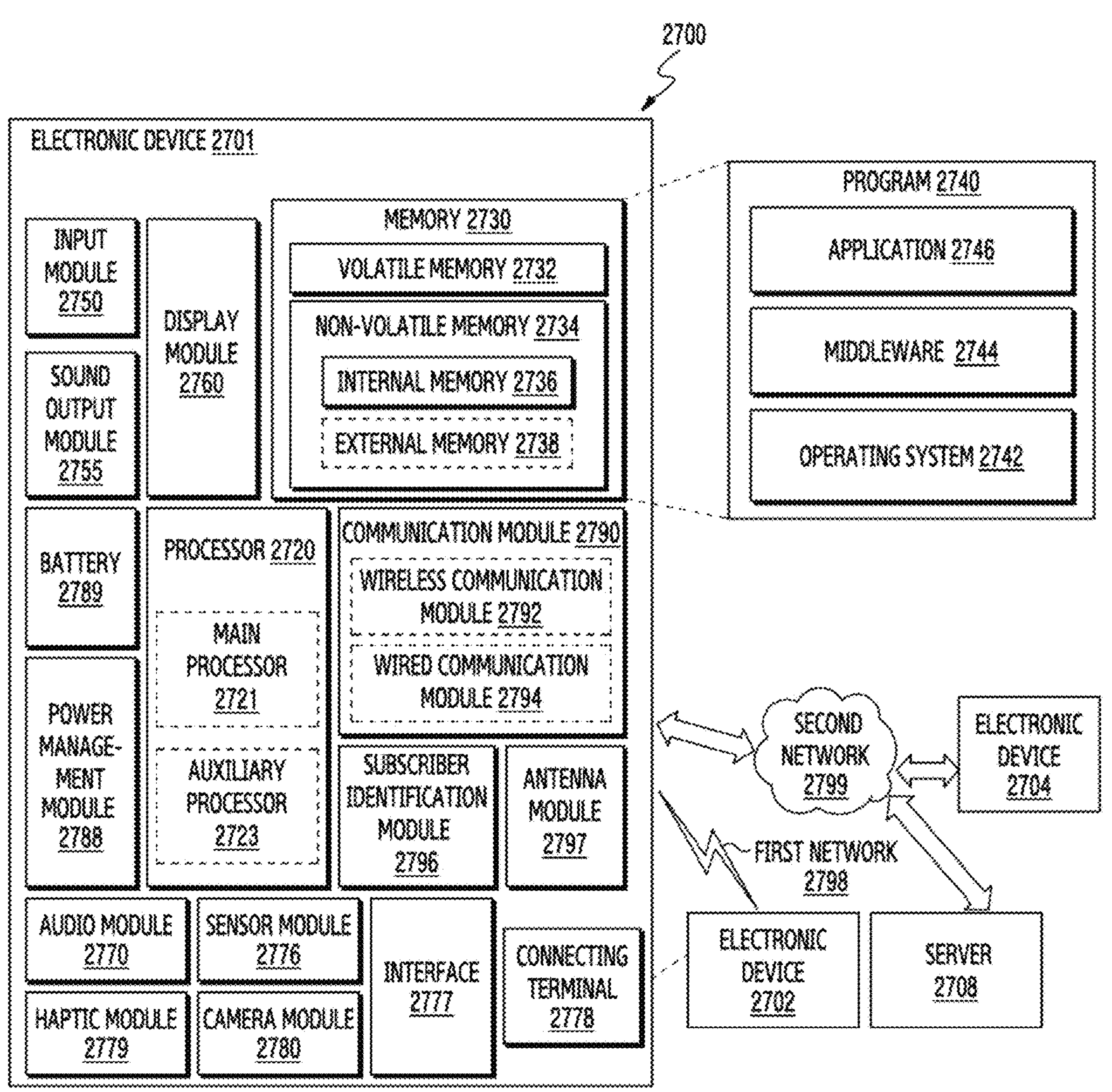
FIG. 27 is a block diagram of an electronic device in a network environment according to an embodiment of the disclosure.

Referring to FIG. 1, an electronic device 100 (e.g., an electronic device 2701 of FIG. 27) may display a screen 110 on a display panel 160 (e.g., a display panel 160 of FIG. 2 or a display 2710 of FIG. 27). The screen 110 may include one or more contents (or one or more media contents). The screen 110 may include one or more visual objects. The screen 110 may be displayed on the display panel 160 to provide information.

The electronic device 100 may display a screen 110 having a viewing angle 181 on the display panel 160. For example, the viewing angle 181 of the screen 110 may be wider than a viewing angle 182 of the screen 110 described below. For example, the screen 110 having the viewing angle 181 may be displayed on the display panel 160 according to a normal display mode. For example, the viewing angle 181 may be wider than a threshold viewing angle (e.g., the viewing angle 182).

The electronic device 100 may provide a function (or feature) for user privacy with respect to a display on the display panel 160. For example, the electronic device 100 may provide a display mode for narrowing a viewing angle of at least a portion of the screen 110 displayed on the display panel 160 for the function.

The display mode may include a privacy display mode. The privacy display mode may be described as a privacy display mode providing the threshold viewing angle (e.g., the viewing angle 182). As a non-limiting example, the threshold viewing angle may be described as a narrowest viewing angle that may be provided through the display panel 160. For example, the electronic device 100 may display, on the display panel 160, the screen 110 having the viewing angle 182, which is the threshold viewing angle, according to the privacy display mode. The privacy display mode may be changed or switched from the normal display mode. For example, the electronic device 100 may change displaying the screen 110 having the viewing angle 181 into displaying the screen 110 having the viewing angle 182, based on the privacy display mode changed from the normal display mode. For example, the electronic device 100 may cease (or terminate) (or disable) displaying the screen 110 having the viewing angle 181 and may display the screen 110 having the viewing angle 182, based on changing the normal display mode into the privacy display mode.

FIG. 1 illustrates a first display mode for displaying the screen 110 having the viewing angle 181 and the second display mode for displaying the screen 110 having the viewing angle 182, but this is only one embodiment. An electronic device 100 described below may further provide one or more display modes different from the first display mode and the second display mode. The one or more display modes may include a display mode for displaying the screen 110 having a viewing angle between the viewing angle 181 and the viewing angle 182. The one or more display modes may include a display mode displaying the screen 110 such that a viewing angle on a side (e.g., one of a top side, a bottom side, a left side, and a right side) of the display 160 and a viewing angle on another side (e.g., another one of the top side, the bottom side, the left side, and the right side) of the display 160 are different from each other. However, it is not limited thereto.

FIG. 2 is a schematic view of an electronic device according to an embodiment of the disclosure.

Referring to FIG. 2, the electronic device 100 may include at least one processor 210 comprising processing circuitry, a display 220, and memory 230. The electronic device 100 may include at least a portion of the electronic device 2701 of FIG. 27 or may correspond to at least a portion of the electronic device 2701 of FIG. 27.

The at least one processor 210 may include at least a portion of the processor 2720 of FIG. 27 or may correspond to at least a portion of the processor 2720 of FIG. 27. The at least one processor 210 may include a central processing unit (CPU) (e.g., including processing circuitry) and a display processing unit (DPU) (e.g., including processing circuitry). As a non-limiting example, the at least one processor 210 may further include a graphic processing unit (GPU) (e.g., including processing circuitry). The at least one processor 210 may be configured to individually and/or collectively execute one or more programs stored in the memory 230.

The at least one processor 210 may change the normal display mode into the privacy display mode. As a non-limiting example, the at least one processor 210 may transmit at least one first command indicating the privacy display mode to display driver integrated circuitry 221, based on a determination to change the normal display mode into the privacy display mode. For example, the display driver integrated circuitry 221 may change the normal display mode into the privacy display mode based on the at least one first command.

The at least one processor 210 may change the privacy display mode into the normal display mode. As a non-limiting example, the at least one processor 210 may transmit at least one second command indicating the normal display mode to display driver integrated circuitry 221, based on a determination to change the privacy display mode into the normal display mode. For example, the display driver integrated circuitry 221 may change the privacy display mode into the normal display mode based on the at least one second command.

The display 220 may operate or be driven for a command mode, a video mode, a hybrid video mode of a mobile industry processor interface (MIPI) display serial interface (DSI), and/or an adaptive refresh panel (ARP). The display 220 may include at least a portion of a display module 2760 of FIG. 27 or may correspond to at least a portion of the display module 2760 of FIG. 27. The display 220 may include display driver integrated circuitry (or display driver circuitry) 221 and a display panel 160.

Figure 28:
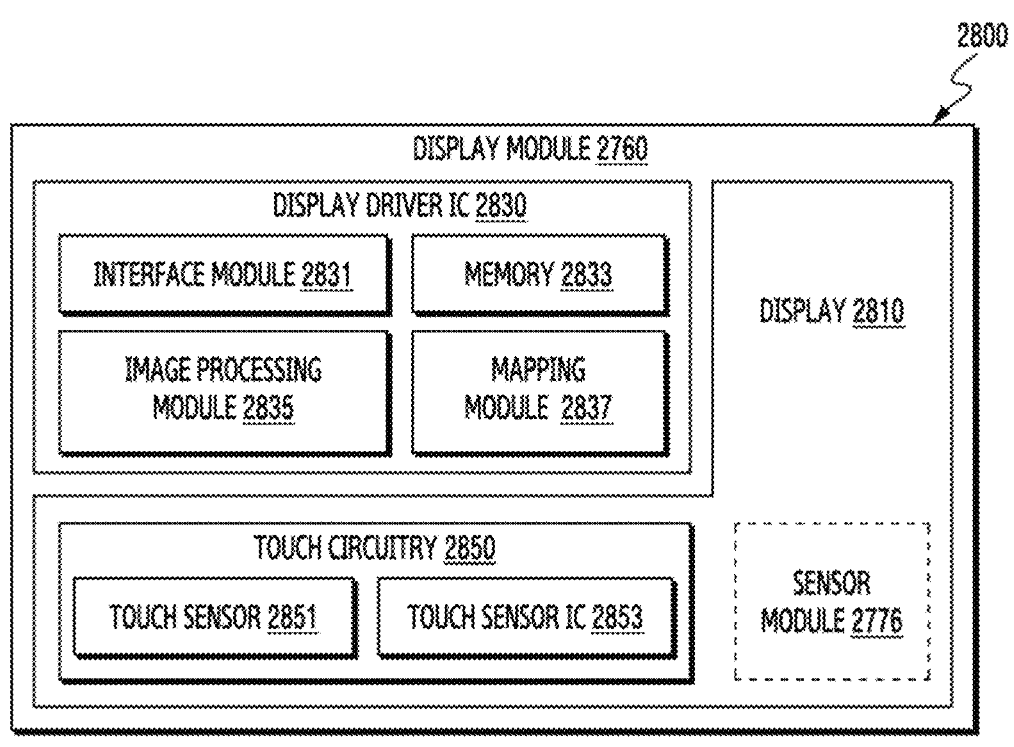
FIG. 28 is a block diagram of a display module according to an embodiment of the disclosure.

The display driver integrated circuitry 221 may include at least a portion of a display driver IC 2830 of FIG. 28 or may correspond to at least a portion of the display driver IC 2830 of FIG. 28.

The display driver integrated circuitry 221 may include gate driver circuitry 222, source driver circuitry 223, and emission driver circuitry 224. According to an example configuration, the gate driver circuitry 222, the source driver circuitry 223, and/or the emission driver circuitry 224 may be positioned outside the display driver integrated circuitry 221. For example, the gate driver circuitry 222, the source driver circuitry 223, and/or the emission driver circuitry 224 may be included in the display panel 160. For example, the gate driver circuitry 222, the source driver circuitry 223, and/or the emission driver circuitry 224 may be positioned outside the display driver integrated circuitry 221 and the display panel 160, and may be included in the display 220.

The display panel 160 may include pixels. Each of the pixels may include sub-pixels. The sub-pixels may be electrically connected to the gate driver circuitry 222 through scan lines (or gate lines). The sub-pixels may be electrically connected to the source driver circuitry 223 through data lines (or source lines). The sub-pixels may be electrically connected to the emission driver circuitry 224 through emission lines.

For example, each of the sub-pixels may include a light emitting element (or a light emitting portion) (e.g., a light emitting diode (LED) or an organic light emitting diode (OLED)) and a driving transistor (or a driving transistor for driving the light emitting element) for providing a current to the light emitting element (or for obtaining a current to be provided to the light emitting element) (or for generating a current to be provided to the light emitting element) (or for applying a current to be provided to the light emitting element). For example, each of the sub-pixels may include an operation control transistor including a drain electrode electrically connected to a source electrode of the driving transistor and a source electrode electrically connected to a driving voltage line transmitting a driving voltage (VDD). For example, each of the sub-pixels may include an emission control transistor including a source electrode electrically connected to a drain electrode of the driving transistor and a drain electrode electrically connected to an anode electrode of the light emitting element. For example, the display driver integrated circuitry 221 may provide an emission signal to each of a gate electrode of the operation control transistor and a gate electrode of the emission control transistor. When the emission signal is provided to each of the gate electrode of the operation control transistor and the gate electrode of the emission control transistor, the current obtained through the driving transistor may be provided to the light emitting element. For example, the light emitting element may emit light according to the current.

As a non-limiting example, each of the sub-pixels may further include one or more other transistors and one or more capacitors, in addition to the driving transistor, the operation control transistor, and the emission control transistor described above. An example configuration of each of the sub-pixels is described with reference to FIG. 3.

Figure 3:
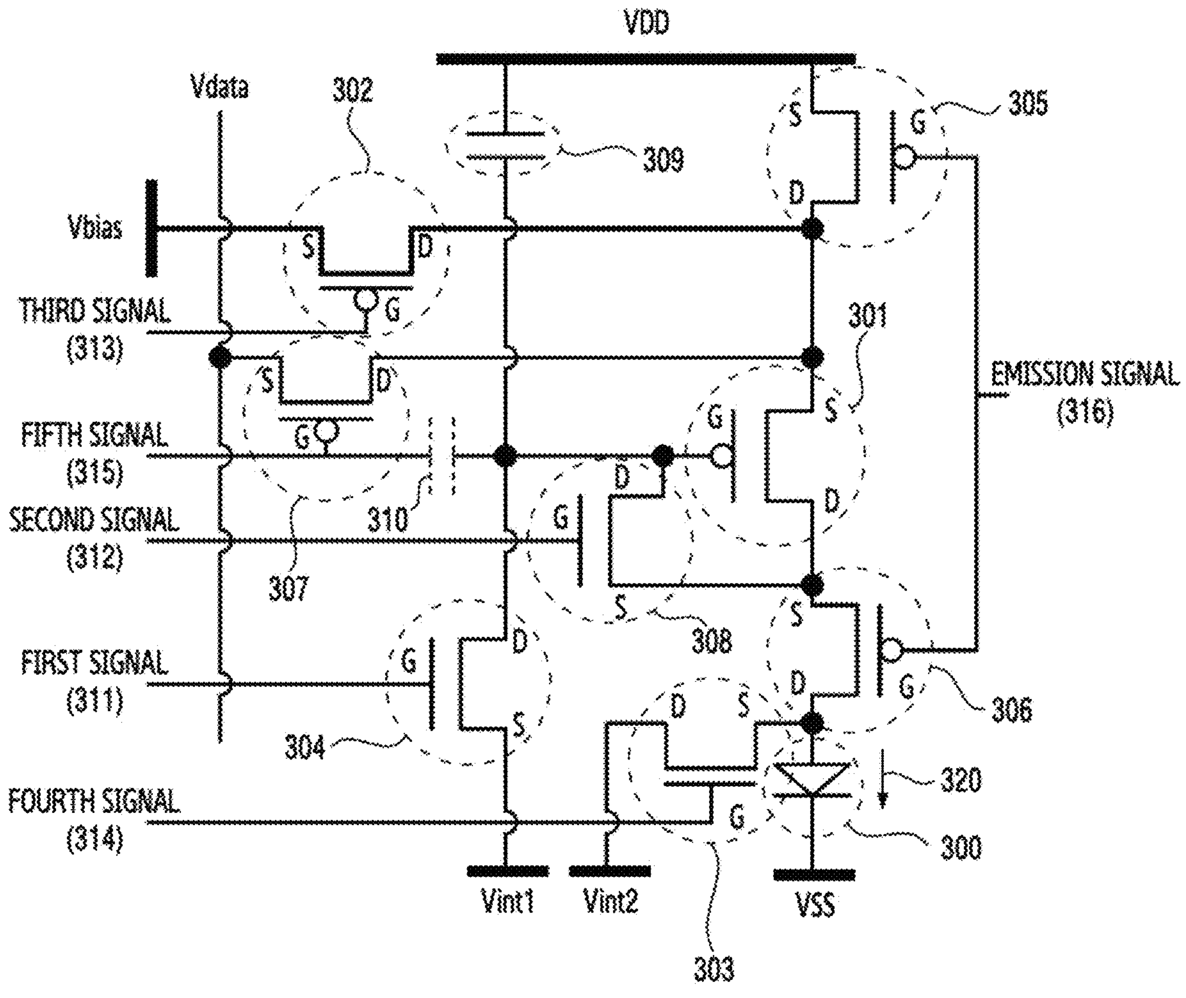
FIG. 3 illustrates an example of a sub-pixel in a display panel according to an embodiment of the disclosure.

FIG. 3 illustrates an example of a sub-pixel in a display panel according to an embodiment of the disclosure.

Referring to FIG. 3, each of the sub-pixels may include a light emitting element (e.g., a light emitting diode 300 or an OLED 300), a first transistor 301 (e.g., the driving transistor), a second transistor 302 (e.g., the threshold voltage adjustment transistor), a third transistor 303 (e.g., the bypass transistor), a fourth transistor 304 (e.g., an initialization transistor), a fifth transistor 305 (e.g., the operation control transistor), a sixth transistor 306 (e.g., the emission control transistor), a seventh transistor 307 (e.g., a switching transistor), an eighth transistor 308 (e.g., a compensation transistor), and a capacitor 309 (e.g., a storage capacitor). Components within each of the sub-pixels illustrated in FIG. 3, their relationships, and their functions are representative only and do not limit implementations (or configurations) described or claimed in this document. For example, the second transistor 302 may be omitted from each of the sub-pixels. For example, a first initialization voltage (Vint1) may be substantially the same as a second initialization voltage (Vint2). For example, the third transistor 303 may be an N-channel metal-oxide semiconductor (NMOS) transistor or a P-channel metal-oxide semiconductor (PMOS) transistor.

A gate electrode G of the first transistor 301 may be electrically connected to a drain electrode D of the eighth transistor 308. The gate electrode G of the first transistor 301 may also be electrically connected to a drain electrode D of the fourth transistor 304. The gate electrode G of the first transistor 301 may also be electrically connected to the capacitor 309 used to store a data voltage Vdata. The gate electrode G of the first transistor 301 may also be electrically connected to a capacitor 310 (optional) used to compensate for a voltage drop caused by a change in a state of a fifth signal 315 transmitted to the gate electrode G of the first transistor 301 (e.g., a change from a second state (e.g., a low state) to a first state (e.g., a high state)). The fifth signal 315 may be transmitted (or provided) to the gate electrode G of the first transistor 301 through scan lines described below. The scan lines may be configured to electrically connect the sub-pixels to the gate driver circuitry 222. The scan lines described below may also be used for another signal different from the fifth signal 315. For example, the scan lines may be used for transmission of a first signal 311, a second signal 312, a third signal 313, or a fourth signal 314.

A source electrode S of the first transistor 301 may be electrically connected to a drain electrode D of the seventh transistor 307. The source electrode S of the first transistor 301 may also be electrically connected to a drain electrode D of the fifth transistor 305. The source electrode S of the first transistor 301 may also be electrically connected to a drain electrode D of the second transistor 302.

A drain electrode D of the first transistor 301 may be electrically connected to a source electrode S of the eighth transistor 308. The drain electrode D of the first transistor 301 may also be electrically connected to a source electrode S of the sixth transistor 306.

The first transistor 301 may be used to provide a current 320 to the OLED 300.

A gate electrode G of the seventh transistor 307 may be configured to receive the fifth signal 315. A source electrode S of the seventh transistor 307 may be configured to obtain a data voltage Vdata.

A gate electrode G of the eighth transistor 308 may be configured to receive the second signal 312.

A gate electrode G of the fourth transistor 304 may be configured to receive the first signal 311. A source electrode S of the fourth transistor 304 may be configured to obtain a first initialization voltage Vint1 (e.g., about −3.5 (V)).

A gate electrode G of the fifth transistor 305 may be configured to receive an emission signal 316. A source electrode of the fifth transistor 305 may be configured to obtain a first driving voltage VDD.

A gate electrode G of the sixth transistor 306 may be configured to receive an emission signal 316. A drain electrode D of the sixth transistor 306 may be electrically connected to a source electrode S of the third transistor 303. The drain electrode D of the sixth transistor 306 may be electrically connected to an anode electrode of the OLED 300.

A gate electrode G of the third transistor 303 may be configured to receive the fourth signal 314. A drain electrode D of the third transistor 303 may be configured to obtain a second initialization voltage Vint2 (e.g., about −3 (V)).

A gate electrode G of the second transistor 302 may be configured to receive the third signal 313. A source electrode S of the second transistor 302 may be configured to obtain a bias voltage Vbias.

A cathode electrode of the OLED 300 may be configured to obtain a second driving voltage VSS.

For example, the display driver integrated circuitry 221 may display a screen on the display panel 160, based on performing a first scan (e.g., which may be described as an address scan) by providing the first signal 311, the second signal 312, the third signal 313, the fourth signal 314, the fifth signal 315, and the emission signal 316 to each of the sub-pixels. For example, the display driver integrated circuitry 221 may maintain an image on the display panel 160, based on performing a second scan (e.g., which may be described as a self-scan) by providing the third signal 313 and the emission signal 316 to each of the sub-pixels.

Referring back to FIG. 2, the display panel 160 may include at least a portion of a display 2810 of FIG. 28 or may correspond to at least a portion of the display 2810 of FIG. 28.

The memory 230 may include one or more storage media (or storage mediums). For example, the one or more storage media may include permanent memory such as a hard drive, flash memory, or read-only memory (ROM), semi-permanent memory such as random access memory (RAM), any other suitable type of storage assembly, or any combination thereof. The memory 230 may include cache memory, which is one or more different types of memory used to temporarily store data for a function (or feature) of the electronic device 100. The memory 230 may be fixedly embedded in the electronic device 100, or may be incorporated onto one or more suitable types of components (e.g., a subscriber identity module (SIM) card and/or a secure digital (SD) memory card) that may be repeatedly inserted into and removed from the electronic device 100. For example, the memory 230 may include at least a portion of memory 2730 of FIG. 27 or may correspond to at least a portion of the memory 2730 of FIG. 27.

The memory 230 may store one or more software applications (or one or more programs), such as an operating system software application, a firmware software application, a media playback software application, a media editing software application, a software application for communication with other users, a translation software application, a digital assistant software application, and/or any other suitable software applications. The one or more software applications may be configured to be individually and/or collectively executed by the at least one processor 210. The one or more software applications may include instructions causing an operation of the electronic device 100.

For example, the display panel 160 in the display 220 may have a structure for adjusting a viewing angle of a screen (e.g., the screen 110) displayed on the display panel 160. The structure may have various example configurations. The structure is described with reference to FIGS. 4 to 6, 7A, 7B, 8A, 8B, 9, 10A to 10D, 11 to 20, 21A, 21B, 22A to 22D, 23, 24A, 24B, 25, and 26.

Figure 4:
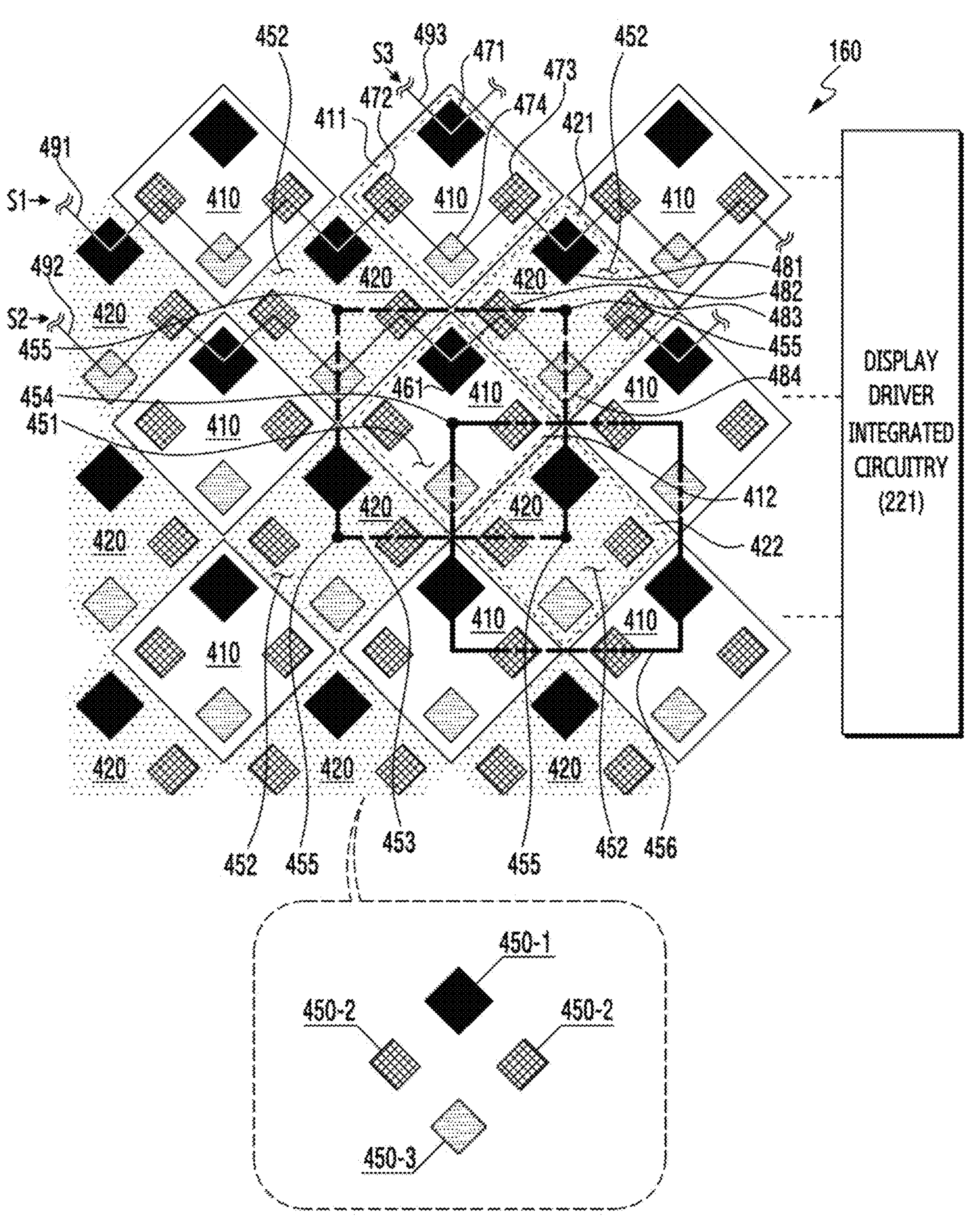
FIG. 4 illustrates a first example configuration of a display panel according to an embodiment of the disclosure.

FIG. 4 illustrates a first example configuration of a display panel according to an embodiment of the disclosure.

Referring to FIG. 4, a display panel 160 may include a plurality of pixels. Each of the pixels may include sub-pixels. The sub-pixels may include a sub-pixel 450-1 configured to emit light in a first color (e.g., a blue color), sub-pixels 450-2 configured to emit light in a second color (e.g., a green color), and a sub-pixel 450-3 configured to emit light in a third color (e.g., a red color). The pixels may include first pixels respectively including (or each including) the sub-pixel 450-1 and one of the sub-pixels 450-2, and second pixels respectively including (or each including) another one of the sub-pixels 450-2 and the sub-pixel 450-3.

The sub-pixels may include first sub-pixel groups and second sub-pixel groups. A field of illumination (FOI) of light emitted from sub-pixels included in each of the second sub-pixel groups may be narrower than an FOI of light emitted from sub-pixels included in each of the first sub-pixel groups. The sub-pixels included in each of the first sub-pixel groups may respectively include LEDs included in first groups of LEDs described below. The sub-pixels included in each of the second sub-pixel groups may respectively include LEDs included in second groups of LEDs described below.

For example, the first sub-pixel groups may include a sub-pixel group 411 and a sub-pixel group 412. For example, the second sub-pixel groups may include a sub-pixel group 421 and a sub-pixel group 422.

For example, the first sub-pixel groups may be positioned within (or inside) a first set 410 of areas in a display area (or an active area) of the display panel 160, such as the sub-pixel group 411 and the sub-pixel group 412. For example, the second sub-pixel groups may be positioned within (or inside) a second set 420 of areas in the display area (or the active area) of the display panel 160, such as the sub-pixel group 421 and the sub-pixel group 422.

As a non-limiting example, areas included within the first set 410 of areas and areas included within the second set 420 of areas may alternate with each other. As a non-limiting example, the areas included within the first set 410 of areas and the areas included within the second set 420 of areas may be included within the display area in an interleaved arrangement.

In order to narrow (or reduce) an FOI of light emitted from the second sub-pixel groups compared to an FOI of light emitted from the first sub-pixel groups, the display panel 160 may include an opaque member (or a black matrix (BM)) in another layer (e.g., another layer 602 of FIG. 6) of the display panel 160 positioned above a layer (e.g., a layer 601 of FIG. 6) of the display panel 160 including the pixels. The opaque member in the other layer of the display panel 160 may be a structure for narrowing a viewing angle of at least a portion of a screen (e.g., the screen 110) displayed on the display panel 160. The opaque member in the other layer of the display panel 160 may be partially overlying the second sub-pixel groups and may not be overlying the first sub-pixel groups.

The opaque member may define (or include) first light transmittance portions respectively defining areas included within the first set 410 of areas. The opaque member may define (or include) second light transmittance portions respectively defining areas included within the second set 420 of areas. The first light transmittance portions and the second light transmittance portions may alternate with each other. Each of the second light transmittance portions may include third light transmittance portions smaller than the first light transmittance portions.

The first light transmittance portions and the second light transmittance portions may be included within the display panel 160 in an interleaved arrangement to enhance a quality (e.g., visibility or readability) of a screen displayed according to the privacy display mode. For example, a center 454 of one 451 of the first light transmittance portions may substantially correspond to a center of a polygon 453 (e.g., a square or a rhombus) defined by connecting centers 455 of some 452 of the second light transmittance portions surrounding the one 451 of the first light transmittance portions. The center of the polygon 453 may be described as a position where diagonals of the polygon 453 are joined. For example, a center (not illustrated in FIG. 4) of one of the second light transmittance portions may substantially correspond to a center of a polygon 456 (e.g., a square or a rhombus) defined by connecting centers of some of the first light transmittance portions surrounding the one of the second light transmittance portions. The center of the polygon 456 may be described as a position where diagonals of the polygon 456 are joined.

The opaque member disposed in the other layer of the display panel 160 according to the first example configuration illustrated in FIG. 4 is described in more detail with reference to FIG. 6.

Figure 5:
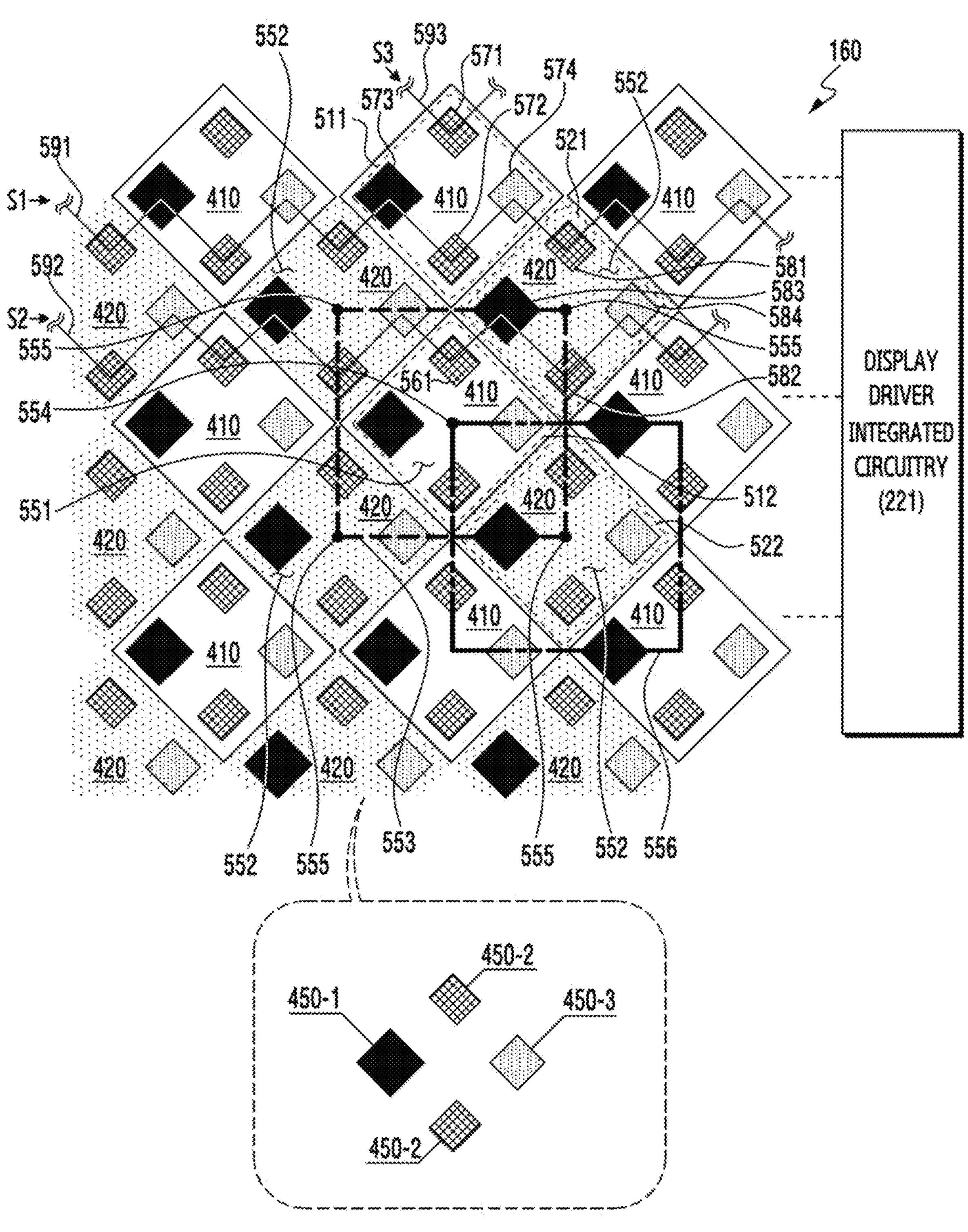
FIG. 5 illustrates a second example configuration of a display panel according to an embodiment of the disclosure.

FIG. 5 illustrates a second example configuration of a display panel according to an embodiment of the disclosure.

Referring to FIG. 5, an arrangement of LEDs respectively included in sub-pixels within each of the first sub-pixel groups of the display panel 160 according to the second example configuration may be (partially) different from an arrangement of LEDs respectively included in sub-pixels within each of the first sub-pixel groups of the display panel 160 according to the first example configuration illustrated in FIG. 4. An arrangement of LEDs respectively included in sub-pixels within each of the second sub-pixel groups of the display panel 160 according to the second example configuration may be (partially) different from an arrangement of LEDs respectively included in sub-pixels within each of the second sub-pixel groups of the display panel 160 according to the first example configuration illustrated in FIG. 4. As a non-limiting example, a power consumed by the display panel 160 according to the second example configuration to display a screen may be less than a power consumed by the display panel 160 according to the first example configuration to display a screen.

For example, the first sub-pixel groups of the display panel 160 according to the second example configuration may include a sub-pixel group 511 and a sub-pixel group 512. The second sub-pixel groups of the display panel 160 according to the second example configuration may include a sub-pixel group 521 and a sub-pixel group 522.

For example, a position of an LED included in the sub-pixel 450-1 of the sub-pixel group 511 may correspond to a position of an LED included in one of the sub-pixels 450-2 of the sub-pixel group 411. For example, a position of an LED included in the sub-pixel 450-3 of the sub-pixel group 511 may correspond to a position of an LED included in another one of the sub-pixels 450-2 of the sub-pixel group 411. For example, a position of an LED included in one of the sub-pixels 450-2 of the sub-pixel group 511 may correspond to a position of an LED included in the sub-pixel 450-1 of the sub-pixel group 411. For example, a position of an LED included in another one of the sub-pixels 450-2 of the sub-pixel group 511 may correspond to a position of an LED included in the sub-pixel 450-3 of the sub-pixel group 411.

For example, a position of an LED included in the sub-pixel 450-1 of the sub-pixel group 512 may correspond to a position of an LED included in one of the sub-pixels 450-2 of the sub-pixel group 412. For example, a position of an LED included in the sub-pixel 450-3 of the sub-pixel group 512 may correspond to a position of an LED included in another one of the sub-pixels 450-2 of the sub-pixel group 412. For example, a position of an LED included in one of the sub-pixels 450-2 of the sub-pixel group 512 may correspond to a position of an LED included in the sub-pixel 450-1 of the sub-pixel group 412. For example, a position of an LED included in another one of the sub-pixels 450-2 of the sub-pixel group 512 may correspond to a position of an LED included in the sub-pixel 450-3 of the sub-pixel group 412.

For example, a position of an LED included in the sub-pixel 450-1 of the sub-pixel group 521 may correspond to a position of an LED included in one of the sub-pixels 450-2 of the sub-pixel group 421. For example, a position of an LED included in the sub-pixel 450-3 of the sub-pixel group 521 may correspond to a position of an LED included in another one of the sub-pixels 450-2 of the sub-pixel group 421. For example, a position of an LED included in one of the sub-pixels 450-2 of the sub-pixel group 521 may correspond to a position of an LED included in the sub-pixel 450-1 of the sub-pixel group 421. For example, a position of an LED included in another one of the sub-pixels 450-2 of the sub-pixel group 521 may correspond to a position of an LED included in the sub-pixel 450-3 of the sub-pixel group 421.

For example, a position of an LED included in the sub-pixel 450-1 of the sub-pixel group 522 may correspond to a position of an LED included in one of the sub-pixels 450-2 of the sub-pixel group 422. For example, a position of an LED included in the sub-pixel 450-3 of the sub-pixel group 522 may correspond to a position of an LED included in another one of the sub-pixels 450-2 of the sub-pixel group 422. For example, a position of an LED included in one of the sub-pixels 450-2 of the sub-pixel group 522 may correspond to a position of an LED included in the sub-pixel 450-1 of the sub-pixel group 422. For example, a position of an LED included in another one of the sub-pixels 450-2 of the sub-pixel group 522 may correspond to a position of an LED included in the sub-pixel 450-3 of the sub-pixel group 422.

The display panel 160 according to the second example configuration may include the opaque member of the other layer included in the display panel 160 according to the first example configuration. The opaque member may define (or include) first light transmittance portions respectively defining areas included in the first set 410 of areas. The opaque member may define (or include) second light transmittance portions respectively defining areas included in the second set 420 of areas. The first light transmittance portions and the second light transmittance portions may alternate with each other. Each of the second light transmittance portions may include third light transmittance portions smaller than the first light transmittance portions.

The first light transmittance portions and the second light transmittance portions may be included in the display panel 160 according to the second example configuration in an interleaved arrangement to enhance a quality (e.g., visibility or readability) of a screen displayed according to the privacy display mode. For example, a center 554 of one 551 of the first light transmittance portions may substantially correspond to a center of a polygon 553 (e.g., a square or a rhombus) defined by connecting centers 555 of some 552 of the second light transmittance portions surrounding the one 551 of the first light transmittance portions. The center of the polygon 553 may be described as a position where diagonals of the polygon 553 are joined. For example, a center (not illustrated in FIG. 4) of one of the second light transmittance portions may substantially correspond to a center of a polygon 556 (e.g., a square or a rhombus) defined by connecting centers of some of the first light transmittance portions surrounding the one of the second light transmittance portions. The center of the polygon 556 may be described as a position where diagonals of the polygon 556 are joined.

The opaque member disposed in the other layer of the display panel 160 according to the second example configuration illustrated in FIG. 5 is described with reference to FIG. 6.

Figure 6:
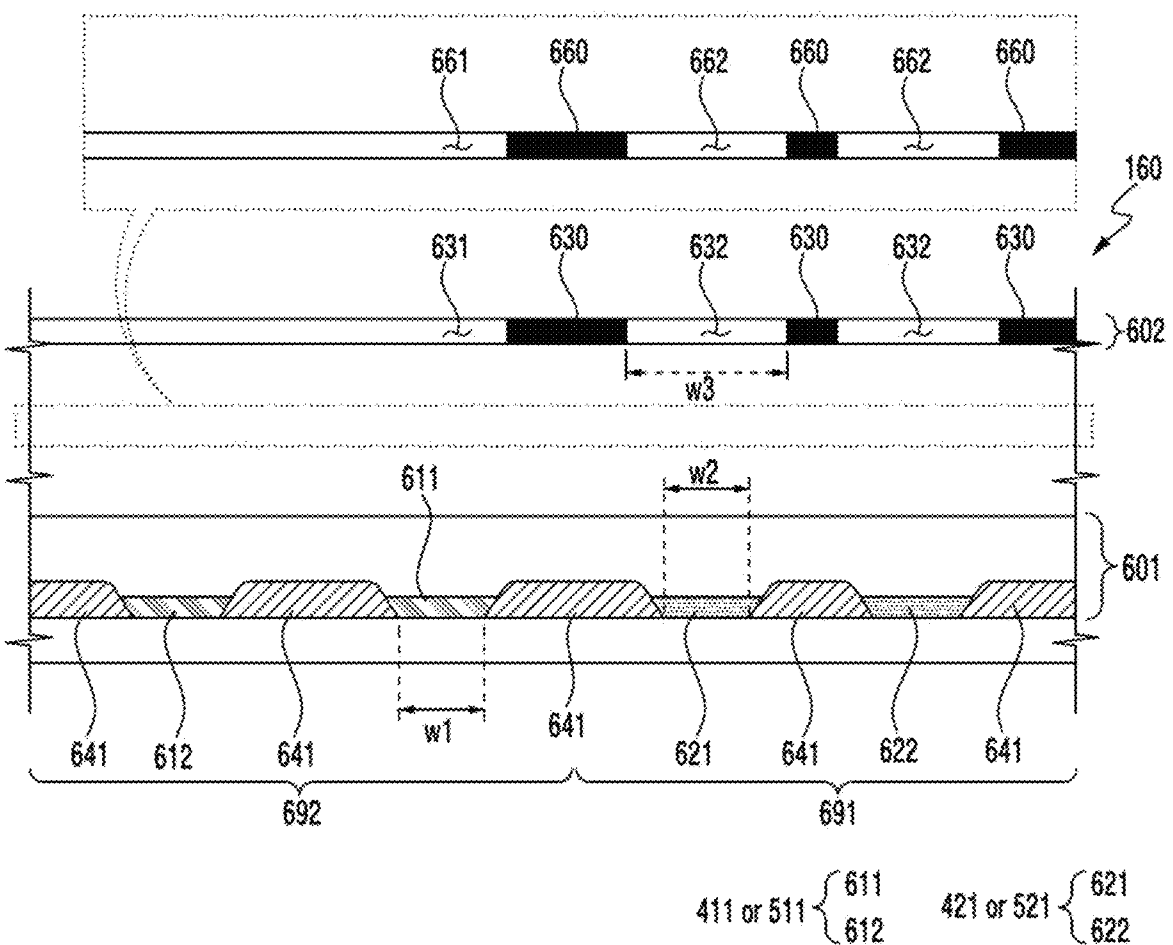
FIG. 6 is a cross-sectional view of a display panel according to a first example configuration or a second example configuration according to an embodiment of the disclosure.

FIG. 6 is a cross-sectional view of a display panel according to a first example configuration or the second example configuration according to an embodiment of the disclosure.

Referring to FIG. 6, the display panel 160 may include a layer 601 and another layer 602 disposed (or positioned) above the layer 601. The layer 601 of the display panel 160 may be described as an emission layer 601. The other layer 602 of the display panel 160 may be described as a masking layer 602 (or a mask layer 602) (or a black matrix layer 602).

The layer 601 of the display panel 160 may include a sub-pixel group 511 (or a sub-pixel group 411) (or a sub-pixel group 512) (or a sub-pixel group 412) positioned in an area 692 included in the first set 410 of areas and a sub-pixel group 521 (or a sub-pixel group 421) (or a sub-pixel group 522) (or a sub-pixel group 422) positioned in an area 691 included in the second set 420 of areas. The sub-pixel group 511 (or the sub-pixel group 411) (or the sub-pixel group 512) (or the sub-pixel group 412) may include a sub-pixel 611 and a sub-pixel 612. The sub-pixel group 521 (or the sub-pixel group 421) (or the sub-pixel group 522) (or the sub-pixel group 422) may include a sub-pixel 621 and a sub-pixel 622.

The layer 601 of the display panel 160 may include a pixel definition layer (PDL) 641. The PDL 641 may define a periphery of the sub-pixel group 511 (or the sub-pixel group 411 (hereinafter, omitted)) and a periphery of the sub-pixel group 521 (or the sub-pixel group 421 (hereinafter, omitted)). The PDL 641 may define a periphery of the sub-pixel 611 and a periphery of the sub-pixel 612 in the sub-pixel group 511. The PDL 641 may define a periphery of the sub-pixel 621 and a periphery of the sub-pixel 622 in the sub-pixel group 521. For example, the PDL 641 may be disposed between the sub-pixel group 511 and the sub-pixel group 521, disposed between the sub-pixel 611 and the sub-pixel 612, and disposed between the sub-pixel 621 and the sub-pixel 622.

As a non-limiting example, a width w1 of an LED (or a light emitting portion) of the sub-pixel 611 defined by the PDL 641 may be equal to a width w2 of an LED of the sub-pixel 621 defined by the PDL 641. For example, when a color of light emitted from the LED of the sub-pixel 611 is identical to a color of light emitted from the LED of the sub-pixel 621, the width w1 of the LED of the sub-pixel 611 may be equal to the width w2 of the LED of the sub-pixel 621. When a color of light emitted from the LED of the sub-pixel 611 is different from a color of light emitted from the LED of the sub-pixel 621, the width w1 of the LED of the sub-pixel 611 may be narrower than the width w2 of the LED of the sub-pixel 621. As a non-limiting example, the width w1 of the LED of the sub-pixel 611 defined by the PDL 641 may be wider than the width w2 of the LED of the sub-pixel 621 defined by the PDL 641. For example, when a color of light emitted from the LED of the sub-pixel 611 is identical to a color of light emitted from the LED of the sub-pixel 621, the width w1 of the sub-pixel 611 may be wider than the width w2 of the sub-pixel 621.

The other layer 602 of the display panel 160 may include an opaque member 630 (or a black matrix 630). The opaque member 630 may be included in the other layer 602 of the display panel 160 for the privacy display mode. For example, in order to narrow an FOI of light emitted from the LED of the sub-pixel 621 compared to an FOI of light emitted from the LED of the sub-pixel 611, the opaque member 630 may be partially overlying the sub-pixel group 521 and may not be overlying the sub-pixel group 511. For example, the opaque member 630 may be partially overlapped with the sub-pixel group 521 among the sub-pixel group 511 and the sub-pixel group 521. For example, the opaque member 630 may be disposed above (or over) a portion of the PDL 641 defining the sub-pixel group 521 and defining sub-pixels (e.g., the sub-pixel 621 and the sub-pixel 622) within the sub-pixel group 521, and may not be disposed above (or over) another portion of the PDL 641 defining the sub-pixel group 511 and defining sub-pixels (e.g., the sub-pixel 611 and the sub-pixel 612) within the sub-pixel group 511. For example, the opaque member 630 may include an opening 631 (or a first light transmittance portion 631 (or a first light transmittance area 631)) disposed above the sub-pixel group 511, and openings 632 (or third light transmittance portions 632 (or third light transmittance areas 632)) disposed above the sub-pixel group 521. The opening 631 may be one of the first light transmittance portions described with reference to FIGS. 4 and 5. The openings 632 may be some of the third light transmittance portions included in a group of the second light transmittance portions described with reference to FIGS. 4 and 5.

The opening 631 may be aligned with the sub-pixel group 511. The opening 631 may be overlapped with sub-pixels in the sub-pixel group 511. The opening 631 may surround sub-pixels in the sub-pixel group 511 when the display panel 160 is viewed from above. Sub-pixels in the sub-pixel group 511 may be positioned in the opening 631 when the display panel 160 is viewed from above. The openings 632 may be respectively aligned with sub-pixels in the sub-pixel group 521. The openings 632 may be respectively overlapped with sub-pixels in the sub-pixel group 521. The openings 632 may respectively surround sub-pixels in the sub-pixel group 521 when the display panel 160 is viewed from above. Sub-pixels in the sub-pixel group 521 may be respectively positioned in the openings 632 when the display panel 160 is viewed from above.

For example, a size of the opening 631 may be larger than a size of each of the openings 632. For example, LEDs respectively included in the sub-pixels (e.g., the sub-pixel 611 and the sub-pixel 612) in the sub-pixel group 511 may be positioned below the opening 631 (or the first light transmittance portion 631). For example, LEDs respectively included in the sub-pixels (e.g., the sub-pixel 621 and the sub-pixel 622) in the sub-pixel group 521 may be respectively positioned below the openings 632 (or the third light transmittance portions 632).

As a non-limiting example, a width w3 of one of the openings 632 may be equal to a width w2 of an LED of the sub-pixel 621. As a non-limiting example, a width w3 of one of the openings 632 may be wider than the width w2 of the LED of the sub-pixel 621. As a non-limiting example, a width w3 of one of the openings 632 may be narrower than the width w2 of the LED of the sub-pixel 621.

As a non-limiting example, the display panel 160 may further include at least one layer disposed between the layer 601 and the other layer 602.

For example, the at least one layer may include a color filter layer (not illustrated in FIG. 6). The color filter layer may include an opaque member 660 including opaque portions positioned between the PDL 641 and the opaque member 630. For example, the opaque member 660 included in the color filter layer of the display panel 160 may include (or define) an opening 661 (or a light transmittance portion 661) corresponding to the opening 631, and openings 662 (or light transmittance portions 662) respectively corresponding to the openings 632. The opaque member 660 defining the opening 661 and the openings 662 may be included in the display panel 160 to guide light emitted (or transmitted) toward each of the openings 632. For example, light from an LED of the sub-pixel 621 may be emitted (or transmitted) to an opening, among the openings 632, aligned with the sub-pixel 621, by the opaque member 660. For example, light from an LED of the sub-pixel 622 may be emitted (or transmitted) to an opening, among the openings 632, aligned with the sub-pixel 622, by the opaque member 660. The color filter layer may be disposed above (or on, or over) a touch layer between the layer 601 and the other layer 602. The touch layer may be used to identify a touch input on the display panel 160.

For example, the at least one layer may include a layer disposed above the color filter layer. The layer disposed above the color filter layer may include an opaque member 660 including opaque portions positioned between the PDL 641 and the opaque member 630. For example, the opaque member 660 included in the layer of the display panel 160 disposed above the color filter layer of the display panel 160 may include an opening 661 (or a light transmittance portion 661) corresponding to the opening 631, and openings 662 (or light transmittance portions 662) respectively corresponding to the openings 632. The opaque member 660 defining the opening 661 and the openings 662 may be included in the display panel 160 to guide light emitted (or transmitted) toward each of the openings 632. For example, light from an LED of the sub-pixel 621 may be emitted (or transmitted) to an opening, among the openings 632, aligned with the sub-pixel 621, by the opaque member 660. For example, light from the sub-pixel 622 may be emitted (or transmitted) to an opening, among the openings 632, aligned with the sub-pixel 622, by the opaque member 660. The color filter layer may be disposed between the layer including the opaque member 660 and a touch layer. The touch layer may be used to identify a touch input on the display panel 160.

Referring back to FIG. 4, the display panel 160 according to the first example configuration may include first groups of LEDs disposed respectively below the first light transmittance portions. The first groups of LEDs may be respectively positioned within areas included in the first set 410 of areas. For example, LEDs included in a group among the first groups of LEDs may be respectively included in sub-pixels included in the sub-pixel group 411. For example, LEDs included in another group among the first groups of LEDs may be respectively included in sub-pixels included in the sub-pixel group 412.

The display panel 160 according to the first example configuration may include second groups of LEDs. The second groups of LEDs may be respectively positioned in areas included in the second set 420 of areas. For example, each of the second groups of LEDs may include LEDs respectively disposed below the third light transmittance portions included in each of the second light transmittance portions. For example, LEDs included in a group among the second groups of LEDs may be respectively included in sub-pixels included in the sub-pixel group 421. For example, LEDs included in another group among the second groups of LEDs may be respectively included in sub-pixels included in the sub-pixel group 422.

The first groups of LEDs and the second groups of LEDs may be included in the display panel 160 according to the first example configuration in an interleaved arrangement to enhance a quality (e.g., visibility or readability) of a screen displayed according to the privacy display mode. For example, a center (e.g., corresponding to the center 454) of one (e.g., positioned below the one 451 of the first light transmittance portions) of the first groups of LEDs may substantially correspond to a center of a polygon (e.g., corresponding to the polygon 453) defined by connecting centers (e.g., corresponding to the centers 455) of some (e.g., respectively positioned below some 452 of the second light transmittance portions) of the second groups of LEDs surrounding the one of the first groups of LEDs. The center of the one of the first groups of LEDs may substantially correspond to a polygon (e.g., a square or a rhombus) defined by connecting centers of LEDs included in the one of the first groups of LEDs. For example, a center of one of the second groups of LEDs may substantially correspond to a center of a polygon (e.g., corresponding to the polygon 456) defined by connecting centers of some of the first groups of LEDs surrounding the one of the second groups of LEDs.

Sub-pixels included in the first sub-pixel groups of the display panel 160 according to the first example configuration and sub-pixels included in the second sub-pixel groups of the display panel 160 according to the first example configuration may be electrically connected to source driver circuitry 223. The sub-pixels included in the first sub-pixel groups of the display panel 160 according to the first example configuration and the sub-pixels included in the second sub-pixel groups of the display panel 160 according to the first example configuration may be electrically connected to emission driver circuitry 224. The sub-pixels included in the first sub-pixel groups of the display panel 160 according to the first example configuration and the sub-pixels included in the second sub-pixel groups of the display panel 160 according to the first example configuration may be configured to be electrically connected to gate driver circuitry 222. The sub-pixels included in the first sub-pixel groups of the display panel 160 according to the first example configuration and the sub-pixels included in the second sub-pixel groups of the display panel 160 according to the first example configuration may be electrically connected to the gate driver circuitry 222 through scan lines (e.g., the scan lines described with reference to FIGS. 2 and 3).

Sub-pixels respectively including the LEDs included in each of the second groups of LEDs may include a first sub-pixel electrically connected to the gate driver circuitry 222 through a scan line (e.g., one of the scan lines) and a second sub-pixel electrically connected to the gate driver circuitry 222 through another scan line (e.g., another one of the scan lines). The other scan line may be adjacent to the scan line. The other scan line may be positioned (or disposed) alongside the scan line. The other scan line may be positioned immediately next to the scan line. The other scan line may be described as a scan line immediately before the scan line or a scan line immediately after the scan line.

For example, the sub-pixel group 421 may include sub-pixels respectively including LEDs included in a group among the second groups of LEDs. The first sub-pixel, among the sub-pixels, including an LED 481 may be electrically connected to the gate driver circuitry 222 through a scan line 491. The first sub-pixel including the LED 481 may be scanned based on a signal S1 (e.g., the first signal 311, the second signal 312, the third signal 313, the fourth signal 314, or the fifth signal 315) received from the gate driver circuitry 222 through the scan line 491. The second sub-pixels, among the sub-pixels, respectively including an LED 482, an LED 483, and an LED 484 may be electrically connected to the gate driver circuitry 222 through a scan line 492 different from the scan line 491. The scan line 492 may be disposed alongside the scan line 491. The second sub-pixels respectively including the LED 482, the LED 483, and the LED 484 may be scanned based on a signal S2 (e.g., the first signal 311, the second signal 312, the third signal 313, the fourth signal 314, or the fifth signal 315) received from the gate driver circuitry 222 through the scan line 492.

As a non-limiting example, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry. For example, since a distance between the first sub-pixel including the LED 481 and the scan line 492 is farther than distances between each of the second sub-pixels respectively including the LEDs 482, 483, and 484 and the scan line 492, electrically connecting the first sub-pixel including the LED 481 to the scan line 492 may further require a space in the display panel 160 for a path electrically connecting the first sub-pixel including the LED 481 to the scan line 492. Since the space reduces the number of sub-pixels per unit area, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry.

Sub-pixels respectively including the LEDs included in each of the first groups of LEDs may include a third sub-pixel electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be adjacent to the scan line. The other scan line may be positioned (or disposed) alongside the scan line. The other scan line may be positioned immediately next to the scan line. The other scan line may be described as a scan line immediately before the scan line or a scan line immediately after the scan line.

For example, the sub-pixel group 411 may include sub-pixels respectively including LEDs included in a group among the first groups of LEDs. The third sub-pixel, among the sub-pixels, including an LED 471 may be electrically connected to the gate driver circuitry 222 through a scan line 493. The third sub-pixel including the LED 471 may be scanned based on a signal S3 (e.g., the first signal 311, the second signal 312, the third signal 313, the fourth signal 314, or the fifth signal 315) received from the gate driver circuitry 222 through the scan line 493. The fourth sub-pixels, among the sub-pixels, respectively including LEDs 472, 473, and 474 may be electrically connected to the gate driver circuitry 222 through a scan line 491 different from the scan line 493. The scan line 491 may be disposed alongside the scan line 493. The fourth sub-pixels respectively including the LEDs 472, 473, and 474 may be scanned based on a signal S1 received from the gate driver circuitry 222 through the scan line 491.

As a non-limiting example, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry. For example, since a distance between the third sub-pixel including the LED 471 and the scan line 491 is farther than a distance between each of the fourth sub-pixels respectively including the LEDs 472, 473, and 474 and the scan line 491, electrically connecting the third sub-pixel including the LED 471 to the scan line 493 may further require a space in the display panel 160 for a path electrically connecting the third sub-pixel including the LED 471 to the scan line 491. Since the space reduces the number of sub-pixels per unit area, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry.

The scan line electrically connected to the first sub-pixel may be further electrically connected to the fourth sub-pixels. For example, the scan line 491 electrically connected to the first sub-pixel including the LED 481 may be further electrically connected to the fourth sub-pixels respectively including the LEDs 472, 473, and 494. The first sub-pixel including the LED 481 and the fourth sub-pixels respectively including the LEDs 472, 473, and 474 may be scanned according to the signal S1.

The scan line electrically connected to the third sub-pixel may be further electrically connected to the second sub-pixels. For example, the scan line 492 electrically connected to the third sub-pixel including the LED 461 may be further electrically connected to the second sub-pixels respectively including the LEDs 482, 483, and 484. The third sub-pixel including the LED 461 and the second sub-pixels respectively including the LEDs 482, 483, and 484 may be scanned according to the signal S2.

As described above, the display driver integrated circuitry 221 may provide the privacy display mode by disabling to emit light from the LEDs included in each of the first groups of LEDs.

Disabling to emit light from the LEDs included in each of the first groups of LEDs may be performed based on controlling the source driver circuitry 223 to provide a data voltage (e.g., Vdata) corresponding to a black color to the fourth sub-pixels before controlling the gate driver circuitry 222 to perform scanning through a scan line (e.g., the scan line 491) electrically connected to the first sub-pixel and the fourth sub-pixels. Disabling to emit light from the LEDs included in each of the first groups of LEDs may be performed further based on controlling the source driver circuitry 223 to provide the data voltage (e.g., Vdata) to the third sub-pixel before controlling the gate driver circuitry 222 to perform scanning through a scan line (e.g., the scan line 492) electrically connected to the second sub-pixels and the third sub-pixel.

Alternatively, disabling to emit light from the LEDs included in each of the first groups of LEDs may be performed based on controlling the emission driver circuitry 224 to bypass providing an emission signal (e.g., the emission signal 316) to the fourth sub-pixels, after controlling the gate driver circuitry 222 to perform scanning through a scan line (e.g., the scan line 491) electrically connected to the first sub-pixel and the fourth sub-pixels. Disabling to emit light from the LEDs included in each of the first groups of LEDs may be performed based on controlling the emission driver circuitry 224 to bypass providing the emission signal to the third sub-pixel, after controlling the gate driver circuitry 222 to perform scanning through a scan line (e.g., the scan line 492) electrically connected to the second sub-pixels and the third sub-pixel.

Referring back to FIG. 5, the display panel 160 according to the second example configuration may include first groups of LEDs disposed respectively below the first light transmittance portions. The first groups of LEDs may be respectively positioned within areas included in the first set 410 of areas. For example, LEDs included in a group among the first groups of LEDs may be respectively included in sub-pixels included in the sub-pixel group 511. For example, LEDs included in another group among the first groups of LEDs may be respectively included in sub-pixels included in the sub-pixel group 512.

The display panel 160 according to the second example configuration may include second groups of LEDs. The second groups of LEDs may be respectively positioned within areas included in the second set 420 of areas. For example, each of the second groups of LEDs may include LEDs respectively disposed below the third light transmittance portions included in each of the second light transmittance portions. For example, LEDs included in a group among the second groups of LEDs may be respectively included in sub-pixels included in the sub-pixel group 521. For example, LEDs included in another group among the second groups of LEDs may be respectively included in sub-pixels included in the sub-pixel group 522.

The first groups of LEDs and the second groups of LEDs may be included in the display panel 160 according to the second example configuration in an interleaved arrangement to enhance quality (e.g., visibility or readability) of a screen displayed according to the privacy display mode. For example, a center (e.g., corresponding to the center 554) of one (e.g., positioned below the one 551 of the first light transmittance portions) among the second groups of LEDs may substantially correspond to a center of a polygon (e.g., corresponding to the polygon 553) defined by connecting centers (e.g., corresponding to the centers 555) of some (e.g., respectively positioned below some 552 of the second light transmittance portions) among the second groups of LEDs surrounding the one among the first groups of LEDs. The center of the one among the first groups of LEDs may substantially correspond to a polygon (e.g., a square or a rhombus) defined by connecting centers of the LEDs included in the one among the first groups of LEDs. For example, a center of one among the second groups of LEDs may substantially correspond to a center of a polygon (e.g., corresponding to the polygon 556) defined by connecting centers of some among the first groups of LEDs surrounding the one among the second groups of LEDs.

Sub-pixels included in the first sub-pixel groups of the display panel 160 according to the second example configuration and sub-pixels included in the second sub-pixel groups of the display panel 160 according to the second example configuration may be electrically connected to source driver circuitry 223. The sub-pixels included in the first sub-pixel groups of the display panel 160 according to the second example configuration and the sub-pixels included in the second sub-pixel groups of the display panel 160 according to the second example configuration may be electrically connected to emission driver circuitry 224. The sub-pixels included in the first sub-pixel groups of the display panel 160 according to the second example configuration and the sub-pixels included in the second sub-pixel groups of the display panel 160 according to the second example configuration may be configured to be electrically connected to gate driver circuitry 222. The sub-pixels included in the first sub-pixel groups of the display panel 160 according to the second example configuration and the sub-pixels included in the second sub-pixel groups of the display panel 160 according to the second example configuration may be electrically connected to the gate driver circuitry 222 through scan lines (e.g., the scan lines described with reference to FIGS. 2 and 3).

Sub-pixels respectively including the LEDs included in each of the second groups of LEDs may include a first sub-pixel electrically connected to gate driver circuitry 222 through a scan line (e.g., one of the scan lines) and second sub-pixels electrically connected to the gate driver circuitry 222 through another scan line (e.g., another one of the scan lines). The other scan line may be adjacent to the scan line. The other scan line may be positioned (or disposed) alongside the scan line. The other scan line may be positioned immediately next to the scan line. The other scan line may be described as a scan line immediately before the scan line or a scan line immediately after the scan line.

For example, the sub-pixel group 521 may include sub-pixels respectively including LEDs included in a group among the second groups of LEDs. The first sub-pixel, among the sub-pixels, including an LED 581 may be electrically connected to the gate driver circuitry 222 through a scan line 591. The first sub-pixel including the LED 581 may be scanned based on a signal S1 (e.g., the first signal 311, the second signal 312, the third signal 313, the fourth signal 314, or the fifth signal 315) received from the gate driver circuitry 222 through the scan line 591. The second sub-pixels, among the sub-pixels, respectively including LEDs 582, 583, and 584 may be electrically connected to the gate driver circuitry 222 through a scan line 592 different from the scan line 591. The scan line 592 may be disposed alongside the scan line 591. The second sub-pixels respectively including the LEDs 582, 583, and 584 may be scanned based on a signal S2 (e.g., the first signal 311, the second signal 312, the third signal 313, the fourth signal 314, or the fifth signal 315) received from the gate driver circuitry 222 through the scan line 592.

As a non-limiting example, the display panel 160 (or the display 220) including a scan line electrically connecting a portion of the sub-pixels to gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry. For example, since a distance between the first sub-pixel including the LED 581 and the scan line 592 is farther than distances between each of the second sub-pixels respectively including the LEDs 582, 583, and 584 and the scan line 592, electrically connecting the first sub-pixel including the LED 581 to the scan line 592 may further require a space in the display panel 160 for a path electrically connecting the first sub-pixel including the LED 581 to the scan line 592. Since the space reduces the number of sub-pixels per unit area, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry.

Sub-pixels respectively including the LEDs included in each of the first groups of LEDs may include a third sub-pixel electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be adjacent to the scan line. The other scan line may be positioned (or disposed) alongside the scan line. The other scan line may be positioned immediately next to the scan line. The other scan line may be described as a scan line immediately before the scan line or a scan line immediately after the scan line.

For example, the sub-pixel group 511 may include sub-pixels respectively including LEDs included in a group among the first groups of LEDs. The third sub-pixel, among the sub-pixels, including an LED 571 may be electrically connected to the gate driver circuitry 222 through the scan line 593. The third sub-pixel including the LED 571 may be scanned based on a signal S3 (e.g., the first signal 311, the second signal 312, the third signal 313, the fourth signal 314, or the fifth signal 315) received from the gate driver circuitry 222 through the scan line 593. The fourth sub-pixels respectively including LEDs 572, 573, and 574 among the sub-pixels may be electrically connected to the gate driver circuitry 222 through the scan line 591 different from the scan line 593. The scan line 591 may be disposed alongside the scan line 593. The fourth sub-pixels respectively including the LEDs 572, 573, and 574 may be scanned based on a signal S1 received from the gate driver circuitry 222 through the scan line 591.

As a non-limiting example, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry. For example, since a distance between the third sub-pixel including an LED 571 and a scan line 591 is farther than a distance between each of the fourth sub-pixels respectively including LEDs 572, 573, and 574 and the scan line 591, electrically connecting the third sub-pixel including the LED 571 to the scan line 593 may further require a space in the display panel 160 for a path electrically connecting the third sub-pixel including the LED 571 to the scan line 591. Since the space reduces the number of sub-pixels per unit area, the display panel 160 (or the display 220) including a scan line electrically connecting a portion of the sub-pixels to the gate driver circuitry 222 and a scan line electrically connecting a remaining portion of the sub-pixels to the gate driver circuitry 222 may support a higher resolution than a display panel including a single scan line electrically connecting all of the sub-pixels to gate driver circuitry.

The scan line electrically connected to the first sub-pixel may be further electrically connected to the fourth sub-pixels. For example, the scan line 591 electrically connected to the first sub-pixel including the LED 581 may be further electrically connected to the fourth sub-pixels respectively including the LEDs 572, 573, and 574. The first sub-pixel including the LED 581 and the fourth sub-pixels respectively including the LEDs 572, 573, and 574 may be scanned according to the signal S1.

The scan line electrically connected to the third sub-pixel may be further electrically connected to the second sub-pixels. For example, the scan line 592 electrically connected to the third sub-pixel including the LED 561 may be further electrically connected to the second sub-pixels respectively including the LEDs 582, 583, and 584. The third sub-pixel including the LED 561 and the second sub-pixels respectively including the LEDs 582, 583, and 584 may be scanned according to the signal S2.

As described above, the display driver integrated circuitry 221 may provide the privacy display mode by disabling to emit light from the LEDs included in each of the first groups of LEDs.

Disabling to emit light from the LEDs respectively included in each of the first groups of LEDs may be performed based on controlling the source driver circuitry 223 to provide a data voltage (e.g., Vdata) corresponding to a black color to the fourth sub-pixels before controlling the gate driver circuitry 222 to perform scanning through a scan line (e.g., the scan line 591) electrically connected to the first sub-pixel and the fourth sub-pixels. Disabling to emit light from the LEDs respectively included in each of the first groups of LEDs may be performed further based on controlling the source driver circuitry 223 to provide the data voltage (e.g., Vdata) to the third sub-pixel before controlling the gate driver circuitry 222 to perform scanning through a scan line (e.g., the scan line 592) electrically connected to the second sub-pixels and the third sub-pixel.

Alternatively, disabling to emit light from the LEDs respectively included in each of the first groups of LEDs may be performed based on controlling the emission driver circuitry 224 to bypass providing an emission signal (e.g., the emission signal 316) to the fourth sub-pixels after controlling the gate driver circuitry 222 to perform scanning through a scan line (e.g., the scan line 591) electrically connected to the first sub-pixel and the fourth sub-pixels. Disabling to emit light from the LEDs respectively included in each of the first groups of LEDs may be performed based on controlling the emission driver circuitry 224 to bypass providing the emission signal to the third sub-pixel after controlling the gate driver circuitry 222 to perform scanning through a scan line (e.g., the scan line 592) electrically connected to the second sub-pixels and the third sub-pixel.

Figure 7A:
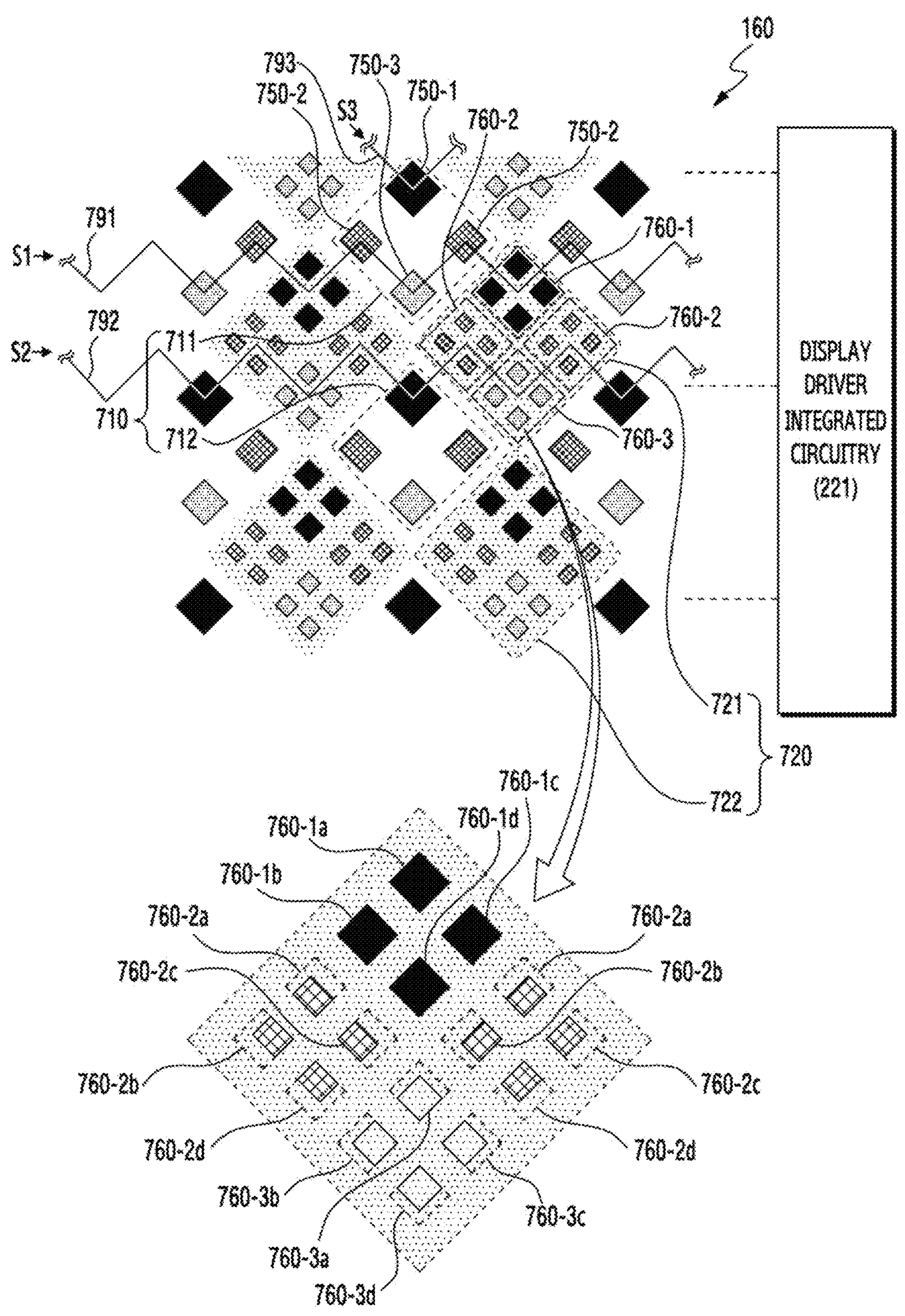
FIG. 7A illustrates a third example configuration of a display panel according to an embodiment of the disclosure.

FIG. 7A illustrates a third example configuration of a display panel according to an embodiment of the disclosure.

At least a portion of the structure of the display panel 160 and at least a portion of the operations of the display driver integrated circuitry 221 described with reference to FIGS. 1 to 6 may be applied to a display panel 160 illustrated in FIG. 7A.

Referring to FIG. 7A, the display panel 160 may include a plurality of pixels. Each of the pixels may include sub-pixels.

The sub-pixels may include first sub-pixel groups 710 and second sub-pixel groups 720. For example, the first sub-pixel groups 710 may include a sub-pixel group 711 and a sub-pixel group 712. For example, the second sub-pixel groups 720 may include a sub-pixel group 721 and a sub-pixel group 722. As a non-limiting example, the first sub-pixel groups 710 and the second sub-pixel groups 720 may alternate with each other. As a non-limiting example, the first sub-pixel groups 710 and the second sub-pixel groups 720 may be disposed in an interleaved arrangement.

Each of the first sub-pixel groups 710 may include sub-pixels. The sub-pixels may include a first sub-pixel 750-1 configured to emit light in a first color (e.g., a blue color), a second sub-pixel 750-2 configured to emit light in a second color (e.g., a green color), and a third sub-pixel 750-3 configured to emit light in a third color (e.g., a red color).

Each of the second sub-pixel groups 720 may include sub-pixels. The sub-pixels may include a first sub-pixel 760-1 configured to emit light in a first color (e.g., a blue color), a second sub-pixel 760-2 configured to emit light in a second color (e.g., a green color), and a third sub-pixel 760-3 configured to emit light in a third color (e.g., a red color).

Each of the sub-pixels included in each of the second sub-pixel groups 720 may include portions spaced apart from each other. For example, the first sub-pixel 760-1 may include a first portion **760-1*a* of the first sub-pixel 760-1, a second portion 760-1*b* of the first sub-pixel 760-1, a third portion 760-1*c* of the first sub-pixel 760-1, and a fourth portion 760-1*d* of the first sub-pixel 760-1. The first portion 760-1*a* of the first sub-pixel 760-1, the second portion 760-1*b* of the first sub-pixel 760-1, the third portion 760-1*c* of the first sub-pixel 760-1, and the fourth portion 760-1*d* of the first sub-pixel 760-1 may be spaced apart from each other. The first portion 760-1*a* of the first sub-pixel 760-1, the second portion 760-1*b* of the first sub-pixel 760-1, the third portion 760-1*c* of the first sub-pixel 760-1, and the fourth portion 760-1*d* of the first sub-pixel 760-1 may be described as micro-pixels of the first sub-pixel 760-1. Each of the micro-pixels of the first sub-pixel 760-1 may be electrically connected to the same transistors. For example, the micro-pixels of the first sub-pixel 760-1 may be controlled through a single set of transistors. For example, a second sub-pixel 760-2 may include a first portion 760-2*a* of the second sub-pixel 760-2, a second portion 760-2*b* of the second sub-pixel 760-2, a third portion 760-2*c* of the second sub-pixel 760-2, and a fourth portion 760-2*d* of the second sub-pixel 760-2. The first portion 760-2*a* of the second sub-pixel 760-2, the second portion 760-2*b* of the second sub-pixel 760-2, the third portion 760-2*c* of the second sub-pixel 760-2, and the fourth portion 760-2*d* of the second sub-pixel 760-2 may be spaced apart from each other. For example, the first portion 760-2*a* of the second sub-pixel 760-2, the second portion 760-2*b*** of the second sub-pixel 760-2, the third portion 760-2*c* of the second sub-pixel 760-2, and the fourth portion 760-2*d* of the second sub-pixel 760-2 may be described as micro-pixels of the second sub-pixel 760-2. Each of the micro-pixels of the second sub-pixel 760-2 may be electrically connected to the same transistors. For example, the micro-pixels of the second sub-pixel 760-2 may be controlled through a single set of transistors. For example, a third sub-pixel 760-3 may include a first portion 760-3*a* of the third sub-pixel 760-3, a second portion 760-3*b* of the third sub-pixel 760-3, a third portion 760-3*c* of the third sub-pixel 760-3, and a fourth portion 760-3*d* of the third sub-pixel 760-3. The first portion 760-3*a* of the third sub-pixel 760-3, the second portion 760-3*b* of the third sub-pixel 760-3, the third portion 760-3*c* of the third sub-pixel 760-3, and the fourth portion 760-3*d* of the third sub-pixel 760-3 may be spaced apart from each other. For example, the first portion 760-3*a* of the third sub-pixel 760-3, the second portion 760-3*b* of the third sub-pixel 760-3, the third portion 760-3*c* of the third sub-pixel 760-3, and the fourth portion 760-3*d* of the third sub-pixel 760-3 may be described as micro-pixels of the third sub-pixel 760-3.

For example, an FOI of light emitted from the second sub-pixel groups 720 may be narrower than an FOI of light emitted from the first sub-pixel groups 710. For example, in order to narrow (or reduce) the FOI of light emitted from the second sub-pixel groups 720 compared to the FOI of light emitted from the first sub-pixel groups 710, a layer of the display panel 160 including the pixels may include a PDL further defining the micro-pixels of the first sub-pixel 760-1, the micro-pixels of the second sub-pixel 760-2, and the micro-pixels of the third sub-pixel 760-3. For example, in order to narrow (or reduce) the FOI of light emitted from the second sub-pixel groups 720 compared to the FOI of light emitted from the first sub-pixel groups 710, another layer (e.g., another layer 802 of FIG. 8A) of the display panel 160 disposed above the layer (e.g., the layer 801 of FIG. 8A) of the display panel 160 including the pixels may include an opaque member. The opaque member in the other layer of the display panel 160 may be partially overlying the one or more of the plurality of pixels and may not be overlying the other one or more of the plurality of pixels. The PDL in the layer of the display panel 160 and the opaque member in the other layer of the display panel 160 may be a structure to narrow a viewing angle of at least a portion of a screen (e.g., the screen 110) displayed on the display panel 160. The opaque member disposed in the other layer of the display panel 160 according to the third example configuration is described in more detail with reference to FIG. 8A.

Figure 8A:
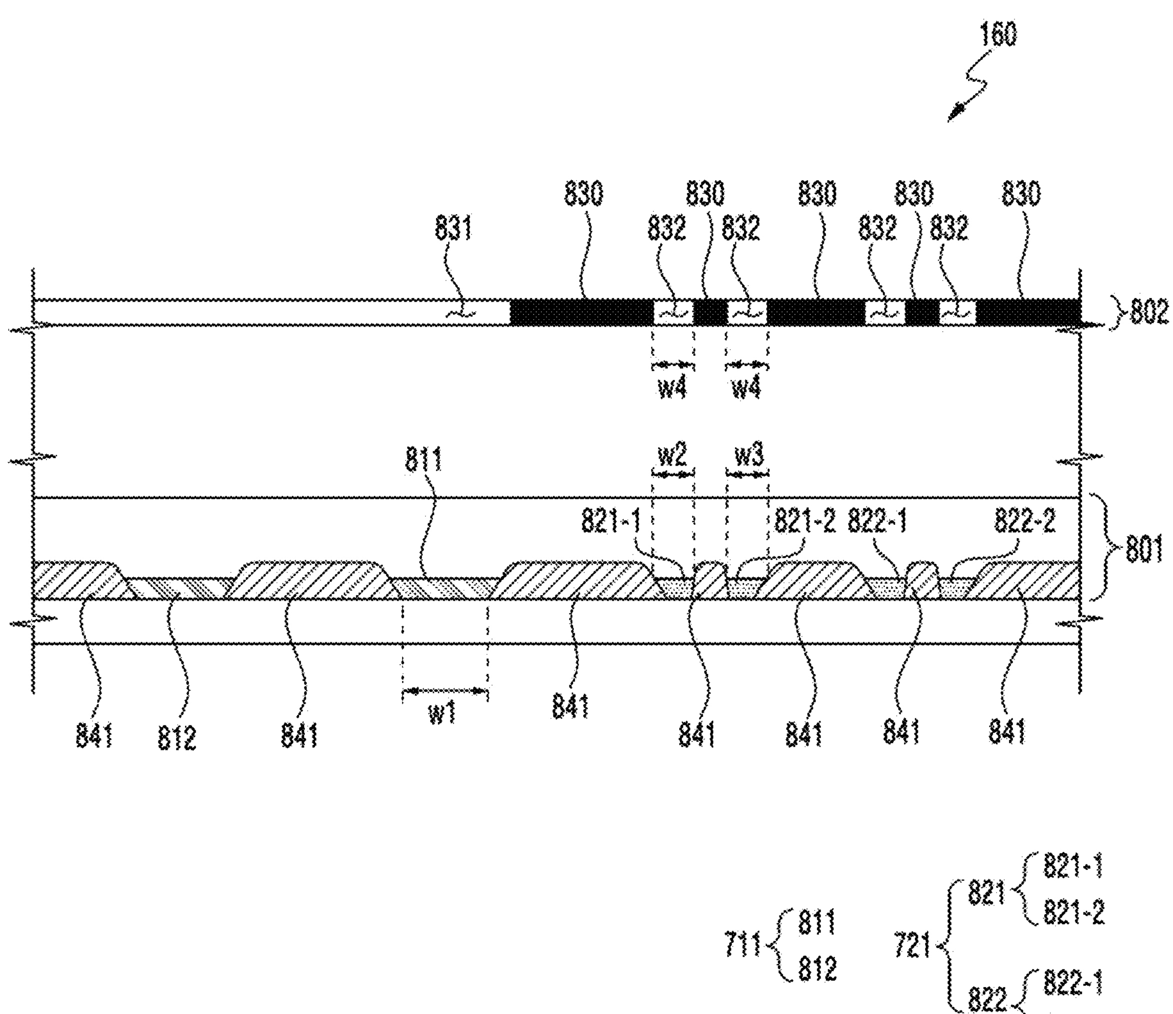
FIG. 8A is a cross-sectional view of a display panel according to a third example configuration according to an embodiment of the disclosure.

FIG. 8A is a cross-sectional view of a display panel according to the third example configuration according to an embodiment of the disclosure.

Referring to FIG. 8A, a display panel 160 may include a layer 801 and another layer 802 disposed (or positioned) above the layer 801. The layer 801 of the display panel 160 may be described as an emission layer 801. The other layer 802 of the display panel 160 may be described as a masking layer 802 (or a mask layer 802) (or a black matrix layer 802).

The layer 801 of the display panel 160 may include first sub-pixel groups 710 and second sub-pixel groups 720. The first sub-pixel groups 710 may include a sub-pixel group 711. The sub-pixel group 711 may include a sub-pixel 811 and a sub-pixel 812. The second sub-pixel groups 720 may include a sub-pixel group 721. The sub-pixel group 721 may include a sub-pixel 821 and a sub-pixel 822. The sub-pixel 821 may include a first portion 821-1 of the sub-pixel 821 and a second portion 821-2 of the sub-pixel 821. The sub-pixel 822 may include a first portion 822-1 of the sub-pixel 822 and a second portion 822-2 of the sub-pixel 822.

The layer 801 of the display panel 160 may include a pixel definition layer (PDL) 841. The PDL 841 may define a periphery of the sub-pixel group 711 and a periphery of the sub-pixel group 721. The PDL 841 may define a periphery of the sub-pixel 811 in the sub-pixel group 711 and a periphery of the sub-pixel 812 in the sub-pixel group 711. The PDL 841 may define a periphery of the sub-pixel 821 in the sub-pixel group 721 and a periphery of the sub-pixel 822 in the sub-pixel group 721. The PDL 841 may further define a periphery of the first portion 821-1 of the sub-pixel 821 and a periphery of the second portion 821-2 of the sub-pixel 821, relative to the PDL 641. The PDL 841 may further define a periphery of the first portion 822-1 of the sub-pixel 822 and a periphery of the second portion 822-2 of the sub-pixel 822, relative to the PDL 641. For example, the PDL 841 may be disposed between the sub-pixel group 711 and the sub-pixel group 721, disposed between the sub-pixel 811 and the sub-pixel 812, disposed between the sub-pixel 821 and the sub-pixel 822, disposed between the first portion 821-1 of the sub-pixel 821 and the second portion 821-2 of the sub-pixel 821, and disposed between the first portion 822-1 of the sub-pixel 822 and the second portion 822-2 of the sub-pixel 822.

As a non-limiting example, a width w1 of the sub-pixel 811 defined by the PDL 841 may be wider than a width w2 of the first portion 821-1 of the sub-pixel 821 defined by the PDL 841 and a width w3 of the second portion 821-2 of the sub-pixel 821 defined by the PDL 841.

The other layer 802 of the display panel 160 may include an opaque member 830 (or a black matrix 830). The opaque member 830 may be included in the other layer 802 of the display panel 160 for the privacy display mode. For example, in order to narrow an FOI of light emitted from the sub-pixel group 721 compared to an FOI of light emitted from the sub-pixel group 711, the opaque member 830 may be partially overlying the sub-pixel group 721 and may not be overlying the sub-pixel group 711. For example, the opaque member 830 may be partially overlapped with the sub-pixel group 721 among the sub-pixel group 711 and the sub-pixel group 721. For example, the opaque member 830 may be disposed above (or over) a portion of the PDL 841 defining the sub-pixel group 721 and defining sub-pixels (e.g., the sub-pixel 821 and the sub-pixel 822) in the sub-pixel group 721, and may not be disposed above (or over) another portion of the PDL 841 defining the sub-pixel group 711 and defining sub-pixels (e.g., the sub-pixel 811 and the sub-pixel 812) in the sub-pixel group 711. For example, the opaque member 830, relative to the opaque member 630, may be further disposed above a portion of the PDL 841 defining the first portion 821-1 of the sub-pixel 821 and the second portion 821-2 of the sub-pixel 821, and a portion of the PDL 841 defining the first portion 822-1 of the sub-pixel 822 and the second portion 822-2 of the sub-pixel 822.

For example, the opaque member 830 may include an opening 831 (or a light transmittance portion 831) disposed above the sub-pixel group 711 and openings 832 (or light transmittance portions 832) disposed above the sub-pixel group 721. For example, a size of the opening 831 may be larger than a size of each of the openings 832.

As a non-limiting example, a width w4 of an opening of the openings 832 may be equal to a width w2 of the first portion 821-1 of the sub-pixel 821 (or a width w3 of the second portion 821-2 of the sub-pixel 821). As a non-limiting example, a width w4 of an opening among the openings 832 may be wider than the width w2 of the first portion 821-1 of the sub-pixel 821 (or the width w3 of the second portion 821-2 of the sub-pixel 821). As a non-limiting example, a width w4 of an opening among the openings 832 may be narrower than the width w2 of the first portion 821-1 of the sub-pixel 821 (or a width w3 of the second portion 821-2 of the sub-pixel 821).

Referring back to FIG. 7, sub-pixels included in the first sub-pixel groups 710 of the display panel 160 according to the third example configuration and sub-pixels included in the second sub-pixel groups 720 of the display panel 160 according to the third example configuration may be electrically connected to source driver circuitry 223. The sub-pixels included in the first sub-pixel groups 710 of the display panel 160 according to the third example configuration and the sub-pixels included in the second sub-pixel groups 720 of the display panel 160 according to the third example configuration may be electrically connected to emission driver circuitry 224. The sub-pixels included in the first sub-pixel groups 710 of the display panel 160 according to the third example configuration and the sub-pixels included in the second sub-pixel groups 720 of the display panel 160 according to the third example configuration may be configured to be electrically connected to gate driver circuitry 222. The sub-pixels included in the first sub-pixel groups 710 of the display panel 160 according to the third example configuration and the sub-pixels included in the second sub-pixel groups 720 of the display panel 160 according to the third example configuration may be electrically connected to the gate driver circuitry 222 through scan lines (the scan lines described with reference to FIGS. 2 and 3).

Sub-pixels included in each of the second sub-pixel groups 720 may include a first sub-pixel electrically connected to the gate driver circuitry 222 through a scan line (e.g., one of the scan lines) and second sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, a first sub-pixel (e.g., a sub-pixel configured to emit light of the first color) among sub-pixels in the sub-pixel group 721 in the second sub-pixel group 720 may be electrically connected to the gate driver circuitry 222 through a scan line 791. The first sub-pixel may be scanned based on a signal S1 (e.g., the first signal 311, the second signal 312, the third signal 313, the fourth signal 314, or the fifth signal 315) received through the scan line 791 from the gate driver circuitry 222. Second sub-pixels (e.g., sub-pixels configured to emit light of the second color and a sub-pixel configured to emit light of the third color) among the sub-pixels may be electrically connected to the gate driver circuitry 222 through a scan line 792. The second sub-pixels may be scanned based on a signal S2 (e.g., the first signal 311, the second signal 312, the third signal 313, the fourth signal 314, or the fifth signal 315) received from the gate driver circuitry 222 through the scan line 792.

Sub-pixels included in each of the first sub-pixel groups 710 may include a third sub-pixel electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, a third sub-pixel (e.g., a sub-pixel configured to emit light of the first color) among sub-pixels in the sub-pixel group 711 in the first sub-pixel group 710 may be electrically connected to the gate driver circuitry 222 through a scan line 793. The third sub-pixel may be scanned based on a signal S3 (e.g., the first signal 311, the second signal 312, the third signal 313, the fourth signal 314, or the fifth signal 315) received from the gate driver circuitry 222 through the scan line 793. Fourth sub-pixels (e.g., sub-pixels configured to emit light of the second color and a sub-pixel configured to emit light of the third color) among the sub-pixels may be electrically connected to the gate driver circuitry 222 through the scan line 791. The fourth sub-pixels may be scanned based on a signal S3 (e.g., the first signal 311, the second signal 312, the third signal 313, the fourth signal 314, or the fifth signal 315) received from the gate driver circuitry 222 through the scan line 791.

The scan line electrically connected to the first sub-pixel may be further electrically connected to the fourth sub-pixels. For example, the scan line 791 electrically connected to the first sub-pixel in the sub-pixel group 721 may be further electrically connected to the fourth sub-pixels in the sub-pixel group 711. The scan line electrically connected to the third sub-pixel may be further electrically connected to the second sub-pixels. For example, the scan line 792 electrically connected to the third sub-pixel in the sub-pixel group 712 may be further electrically connected to the second sub-pixels in the sub-pixel group 721.

Figure 7B:
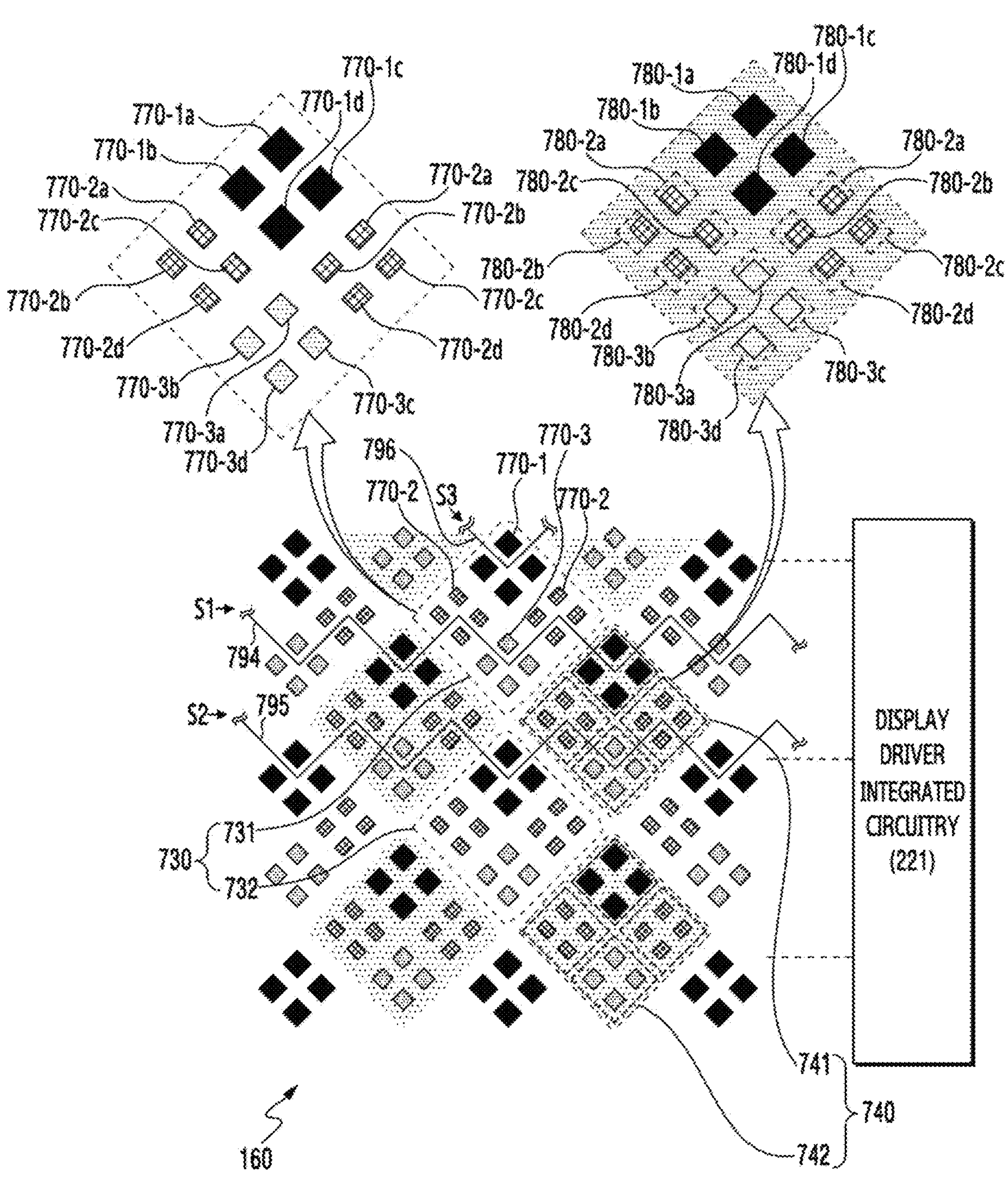
FIG. 7B illustrates a fourth example configuration of a display panel according to an embodiment of the disclosure.

FIG. 7B illustrates a fourth example configuration of a display panel according to an embodiment of the disclosure.

At least a portion of the structure of the display panel 160 and at least a portion of the operations of the display driver integrated circuitry 221 described with reference to FIGS. 1 to 6, and 7A may be applied to a display panel 160 illustrated in FIG. 7B.

Referring to FIG. 7B, the display panel 160 may include a plurality of pixels. Each of the pixels may include sub-pixels.

The sub-pixels may include first sub-pixel groups 730 and second sub-pixel groups 740. For example, the first sub-pixel groups 730 may include a sub-pixel group 731 and a sub-pixel group 732. For example, the second sub-pixel groups 740 may include a sub-pixel group 741 and a sub-pixel group 742. As a non-limiting example, the first sub-pixel groups 730 and the second sub-pixel groups 740 may alternate with each other. As a non-limiting example, the first sub-pixel groups 730 and the second sub-pixel groups 740 may be disposed in an interleaved arrangement.

Each of the first sub-pixel groups 730 may include sub-pixels. The sub-pixels may include a first sub-pixel 770-1 configured to emit light of a first color (e.g., a blue color), a second sub-pixel 770-2 configured to emit light of a second color (e.g., a green color), and a third sub-pixel 770-3 configured to emit light of a third color (e.g., a red color).

Each of the sub-pixels in each of the first sub-pixel groups 730 may include portions spaced apart from each other. For example, the first sub-pixel 770-1 may include a first portion 770-1*a* of the first sub-pixel 770-1, a second portion 770-1*b* of the first sub-pixel 770-1, a third portion 770-1*c* of the first sub-pixel 770-1, and a fourth portion 770-1*d* of the first sub-pixel 770-1. The first portion 770-1*a* of the first subpixel 770-1, the second portion 770-1*b* of the first sub-pixel 770-1, the third portion 770-1*c* of the first sub-pixel 770-1, and the fourth portion 770-1*d* of the first sub-pixel 770-1 may be spaced apart from each other. The first portion 770-1*a* of the first sub-pixel 770-1, the second portion 770-1*b* of the first sub-pixel 770-1, the third portion 770-1*c* of the first sub-pixel 770-1, and the fourth portion 770-1*d* of the first sub-pixel 770-1 may be described as micro-pixels of the first sub-pixel 770-1. Each of the micro-pixels of the first sub-pixel 770-1 may be electrically connected to the same transistors. For example, the micro-pixels of the first sub-pixel 770-1 may be controlled through a single set of transistors. For example, the second sub-pixel 770-2 may include a first portion 770-2*a* of the second sub-pixel 770-2, a second portion 770-2*b* of the second sub-pixel 770-2, a third portion 770-2*c* of the second sub-pixel 770-2, and a fourth portion 770-2*d* of the second sub-pixel 770-2. The first portion 770-2*a* of the second sub-pixel 770-2, the second portion 770-2*b* of the second sub-pixel 770-2, the third portion 770-2*c* of the second sub-pixel 770-2, and the fourth portion 770-2*d* of the second sub-pixel 770-2 may be spaced apart from each other. For example, the first portion 770-2*a* of the second sub-pixel 770-2, the second portion 770-2*b* of the second sub-pixel 770-2, the third portion 770-2*c* of the second sub-pixel 770-2, and the fourth portion 770-2*d* of the second sub-pixel 770-2 may be described as micro-pixels of the second sub-pixel 770-2. Each of the micro-pixels of the second sub-pixel 770-2 may be electrically connected to the same transistors. For example, the micro-pixels of the second sub-pixel 770-2 may be controlled through a single set of transistors. For example, the third sub-pixel 770-3 may include a first portion 770-3*a* of the third sub-pixel 770-3, a second portion 770-3*b* of the third sub-pixel 770-3, a third portion 770-3*c* of the third sub-pixel 770-3, and a fourth portion 770-3*d* of the third sub-pixel 770-3. The first portion 770-3*a* of the third sub-pixel 770-3, the second portion 770-3*b* of the third sub-pixel 770-3, the third portion 770-3*c* of the third sub-pixel 770-3, and the fourth portion 770-3*d* of the third sub-pixel 770-3 may be spaced apart from each other. For example, the first portion 770-3*a* of the third sub-pixel 770-3, the second portion 770-3*b* of the third sub-pixel 770-3, the third portion 770-3*c* of the third sub-pixel 770-3, and the fourth portion 770-3*d* of the third sub-pixel 770-3 may be described as micro-pixels of the third sub-pixel 770-3. Each of the micro-pixels of the third sub-pixel 770-3 may be electrically connected to the same transistors. For example, the micro-pixels of the third sub-pixel 770-3 may be controlled through a single set of transistors.

Each of the second sub-pixel groups 740 may include sub-pixels. The sub-pixels may include a first sub-pixel 780-1 configured to emit light of a first color (e.g., a blue color), a second sub-pixel 780-2 configured to emit light of a second color (e.g., a green color), and a third sub-pixel 780-3 configured to emit light of a third color (e.g., a red color).

Each of the sub-pixels in each of the second sub-pixel groups 740 may include portions spaced apart from each other. For example, the first sub-pixel 780-1 may include a first portion 780-1*a* of the first sub-pixel 780-1, a second portion 780-1*b* of the first sub-pixel 780-1, a third portion 780-1*c* of the first sub-pixel 780-1, and a fourth portion 780-1*d* of the first sub-pixel 780-1. The first portion 780-1*a* of the first sub-pixel 780-1, the second portion 780-1*b* of the first sub-pixel 780-1, the third portion 780-1*c* of the first sub-pixel 780-1, and the fourth portion 780-1*d* of the first sub-pixel 780-1 may be spaced apart from each other. The first portion 780-1*a* of the first sub-pixel 780-1, the second portion 780-1*b* of the first sub-pixel 780-1, the third portion 780-1*c* of the first sub-pixel 780-1, and the fourth portion 780-1*d* of the first sub-pixel 780-1 may be described as micro-pixels of the first sub-pixel 780-1. Each of the micro-pixels of the first sub-pixel 780-1 may be electrically connected to the same transistors. For example, the micro-pixels of the first sub-pixel 780-1 may be controlled through a single set of transistors. For example, the second sub-pixel 780-2 may include a first portion 780-2*a* of the second sub-pixel 780-2, a second portion 780-2*b* of the second sub-pixel 780-2, a third portion 780-2*c* of the second sub-pixel 780-2, and a fourth portion 780-2*d* of the second sub-pixel 780-2. The first portion 780-2*a* of the second sub-pixel 780-2, the second portion 780-2*b* of the second sub-pixel 780-2, the third portion 780-2*c* of the second sub-pixel 780-2, and the fourth portion 780-2*d* of the second sub-pixel 780-2 may be spaced apart from each other. For example, the first portion 780-2*a* of the second sub-pixel 780-2, the second portion 780-2*b* of the second sub-pixel 780-2, the third portion 780-2*c* of the second sub-pixel 780-2, and the fourth portion 780-2*d* of the second sub-pixel 780-2 may be described as micro-pixels of the second sub-pixel 780-2. Each of the micro-pixels of the second sub-pixel 780-2 may be electrically connected to the same transistors. For example, the micro-pixels of the second sub-pixel 780-2 may be controlled through a single set of transistors. For example, the third sub-pixel 780-3 may include a first portion 780-3*a* of the third sub-pixel 780-3, a second portion 780-3*b* of the third sub-pixel 780-3, a third portion 780-3*c* of the third sub-pixel 780-3, and a fourth portion 780-3*d* of the third sub-pixel 780-3. The first portion 780-3*a* of the third sub-pixel 780-3, the second portion 780-3*b* of the third sub-pixel 780-3, the third portion 780-3*c* of the third sub-pixel 780-3, and the fourth portion 780-3*d* of the third sub-pixel 780-3 may be spaced apart from each other. For example, the first portion 780-3*a* of the third sub-pixel 780-3, the second portion 780-3*b* of the third sub-pixel 780-3, the third portion 780-3*c* of the third sub-pixel 780-3, and the fourth portion 780-3*d* of the third sub-pixel 780-3 may be described as micro-pixels of the third sub-pixel 780-3. Each of the micro-pixels of the third sub-pixel 780-3 may be electrically connected to the same transistors. For example, the micro-pixels of the third sub-pixel 780-3 may be controlled through a single set of transistors.

A layer of the display panel 160 including the first sub-pixel groups 730 and the second sub-pixel groups 740 (or a layer of the display panel 160 according to the fourth example configuration) may include a PDL further defining the micro-pixels of the first sub-pixel 770-1, the micro-pixels of the second sub-pixel 770-2, the micro-pixels of the third sub-pixel 770-3, the micro-pixels of the first sub-pixel 780-1, the micro-pixels of the second sub-pixel 780-2, and the micro-pixels of the third sub-pixel 780-3.

For example, an FOI of light emitted from the second sub-pixel groups 740 may be narrower than an FOI of light emitted from the first sub-pixel groups 730. For example, in order to narrow (or reduce) the FOI of light emitted from the second sub-pixel groups 740 compared to the FOI of light emitted from the first sub-pixel groups 730, another layer (e.g., another layer 852 of FIG. 8B) of the display panel 160 disposed above the layer (e.g., a layer 851 of FIG. 8B) of the display panel 160 including the pixels may include an opaque member. The opaque member in the other layer of the display panel 160 may be partially overlying the one or more of the plurality of pixels and may not be overlying the other one or more of the plurality of pixels. The PDL in the layer of the display panel 160 and the opaque member in the other layer of the display panel 160 may be a structure to narrow a viewing angle of at least a portion of a screen (e.g., the screen 110) displayed on the display panel 160. The opaque member disposed in the other layer of the display panel 160 according to the fourth example configuration is described in more detail with reference to FIG. 8B.

Figure 8B:
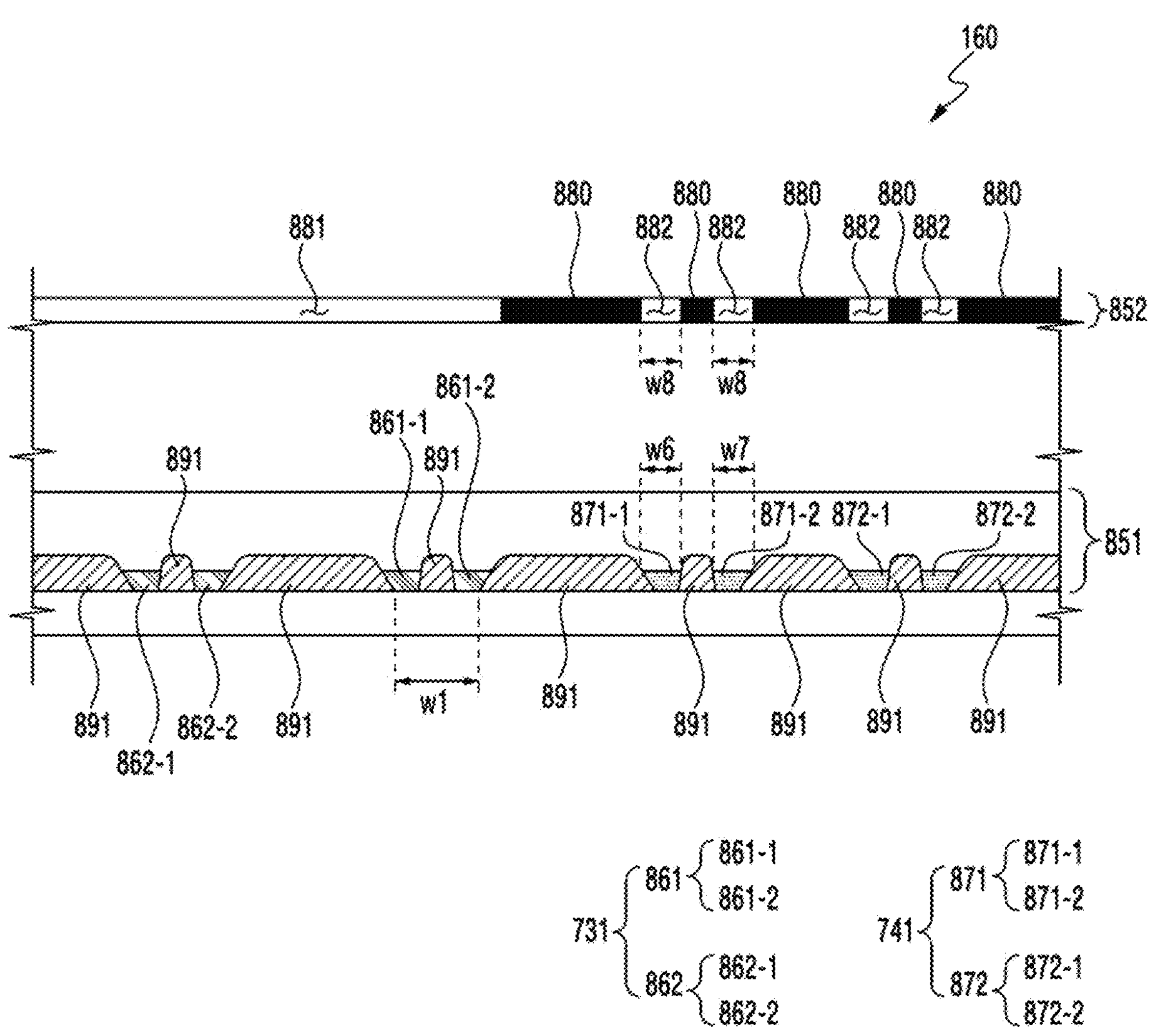
FIG. 8B is a cross-sectional view of a display panel according to a fourth example configuration according to an embodiment of the disclosure.

FIG. 8B is a cross-sectional view of a display panel according to the fourth example configuration according to an embodiment of the disclosure.

Referring to FIG. 8B, the display panel 160 may include a layer 851 and another layer 852 disposed (or positioned) above the layer 851. The layer 851 of the display panel 160 may be described as an emission layer 851. The other layer 852 of the display panel 160 may be described as a masking layer 852 (or a mask layer 852) (or a black matrix layer 852).

The layer 851 of the display panel 160 may include first sub-pixel groups 730 and second sub-pixel groups 740.

The first sub-pixel groups 730 may include a sub-pixel group 731. The sub-pixel group 731 may include a sub-pixel 861 and a sub-pixel 862. The sub-pixel 861 may include a first portion 861-1 of the sub-pixel 861 and a second portion 861-2 of the sub-pixel 861. The sub-pixel 862 may include a first portion 862-1 of the sub-pixel 862 and a second portion 862-2 of the sub-pixel 862.

The second sub-pixel groups 740 may include a sub-pixel group 741. The sub-pixel group 741 may include a sub-pixel 871 and a sub-pixel 872. The sub-pixel 871 may include a first portion 871-1 of the sub-pixel 871 and a second portion 871-2 of the sub-pixel 871. The sub-pixel 872 may include a first portion 872-1 of the sub-pixel 872 and a second portion 872-2 of the sub-pixel 872.

The layer 851 of the display panel 160 may include a pixel definition layer (PDL) 891. The PDL 891 may define a periphery of the sub-pixel group 731 and a periphery of the sub-pixel group 741. The PDL 891 may define a periphery of the sub-pixel 861 in the sub-pixel group 731 and a periphery of the sub-pixel 862 in the sub-pixel group 731. The PDL 891 may define a periphery of the sub-pixel 871 in the sub-pixel group 741 and a periphery of the sub-pixel 872 in the sub-pixel group 741. The PDL 891 may further define a periphery of the first portion 861-1 of the sub-pixel 861 and a periphery of the second portion 861-2 of the sub-pixel 861, relative to the PDL 641. The PDL 891 may further define a periphery of the first portion 862-1 of the sub-pixel 862 and a periphery of the second portion 862-2 of the sub-pixel 862, relative to the PDL 641. The PDL 891 may further define a periphery of the first portion 871-1 of the sub-pixel 871 and a periphery of the second portion 871-2 of the sub-pixel 871, relative to the PDL 641. The PDL 891 may further define a periphery of the first portion 872-1 of the sub-pixel 872 and a periphery of the second portion 872-2 of the sub-pixel 872, relative to the PDL 641. For example, the PDL 891 may be disposed between the sub-pixel group 731 and the sub-pixel group 741, disposed between the sub-pixel 861 and the sub-pixel 862, disposed between the sub-pixel 871 and the sub-pixel 872, disposed between the first portion 861-1 of the sub-pixel 861 and the second portion 861-2 of the sub-pixel 861, disposed between the first portion 862-1 of the sub-pixel 862 and the second portion 862-2 of the sub-pixel 862, disposed between the first portion 871-1 of the sub-pixel 871 and the second portion 871-2 of the sub-pixel 871, and disposed between the first portion 872-1 of the sub-pixel 872 and the second portion 872-2 of the sub-pixel 872.

The other layer 852 of the display panel 160 may include an opaque member 880 (or a black matrix 880). The opaque member 880 may be included in the other layer 852 of the display panel 160 for the privacy display mode. For example, in order to narrow an FOI of light emitted from the sub-pixel group 741 compared to an FOI of light emitted from the sub-pixel group 731, the opaque member 880 may be partially overlying the sub-pixel group 741 and may not be overlying the sub-pixel group 731. For example, the opaque member 880 may be partially overlapped with the sub-pixel group 741 among the sub-pixel group 731 and the sub-pixel group 741. For example, the opaque member 880 may be disposed above (or over) a portion of the PDL 891 defining the sub-pixel group 741 and defining sub-pixels (e.g., the sub-pixel 871 and the sub-pixel 872) in the sub-pixel group 741, and may not be disposed above (or over) another portion of the PDL 891 defining the sub-pixel group 731 and defining sub-pixels (e.g., the sub-pixel 861 and the sub-pixel 862) in the sub-pixel group 731. For example, the opaque member 880 may be further disposed above a portion of the PDL 891 defining the first portion 871-1 of the sub-pixel 871 and the second portion 871-2 of the sub-pixel 871, and a portion of the PDL 891 defining the first portion 872-1 of the sub-pixel 872 and the second portion 872-2 of the sub-pixel 872, relative to the opaque member 630.

For example, the opaque member 880 may include an opening 881 (or a light transmittance portion 881) disposed above the sub-pixel group 731 and openings 882 (or light transmittance portions 882) disposed above the sub-pixel group 741. For example, a size of the opening 881 may be larger than a size of each of the openings 882.

As a non-limiting example, a width w8 of an opening among the openings 882 may be equal to a width w6 of the first portion 871-1 of the sub-pixel 871 (or a width w7 of the second portion 871-2 of the sub-pixel 871). As a non-limiting example, the width w8 of the opening among the openings 882 may be larger than the width w6 of the first portion 871-1 of the sub-pixel 871 (or the width w7 of the second portion 871-2 of the sub-pixel 871). As a non-limiting example, the width w8 of the opening among the openings 882 may be smaller than the width w6 of the first portion 871-1 of the sub-pixel 871 (or the width w7 of the second portion 871-2 of the sub-pixel 871).

As a non-limiting example, since the display panel 160 according to the fourth example configuration (or the display panel 160 illustrated in FIG. 8B) may further include micro-pixels (e.g., the micro-pixels of the first sub-pixel 770-1, the micro-pixels of the second sub-pixel 770-2, or the micro-pixels of the third sub-pixel 770-3) that are spaced apart (or divided) from each other, relative to the display panel 160 according to the first example configuration or the third example configuration (or the display panel 160 illustrated in FIG. 6 or the display panel 160 illustrated in FIG. 8A), a thickness of the display panel 160 according to the fourth example configuration (or the display panel 160 illustrated in FIG. 8B) may be less than a thickness of the display panel 160 according to the first example configuration or the third example configuration (or the display panel 160 illustrated in FIG. 6 or the display panel 160 illustrated in FIG. 8A). For example, since a sum of widths of portions of the sub-pixel 861 (e.g., a sum of a width of the first portion 861-1 of the sub-pixel 861 and a width of the second portion 861-2 of the sub-pixel 861) is smaller than the width w1 of the sub-pixel 611, a first FOI of light emitted from the portions of the sub-pixel 861 may be narrower than a second FOI of light emitted from the sub-pixel 611. For example, since the first FOI is narrower than the second FOI, a first thickness of one or more layers disposed between the layer 851 and the other layer 852 may be thinner than a second thickness of one or more layers disposed between the layer 601 and the layer 602 by the first FOI narrower than the second FOI. Since the first thickness is thinner than the second thickness, a thickness of the display panel 160 according to the fourth example configuration (or the display panel 160 illustrated in FIG. 8B) may be less than a thickness of the display panel 160 according to the first example configuration or the third example configuration (or the display panel 160 illustrated in FIG. 6 or the display panel 160 illustrated in FIG. 8A).

Referring back to FIG. 7B, sub-pixels included in the first sub-pixel groups 730 of the display panel 160 according to the fourth example configuration and sub-pixels included in the second sub-pixel groups 740 of the display panel 160 according to the fourth example configuration may be electrically connected to source driver circuitry 223. The sub-pixels included in the first sub-pixel groups 730 of the display panel 160 according to the fourth example configuration and the sub-pixels included in the second sub-pixel groups 740 of the display panel 160 according to the fourth example configuration may be electrically connected to emission driver circuitry 224. The sub-pixels included in the first sub-pixel groups 730 of the display panel 160 according to the fourth example configuration and the sub-pixels included in the second sub-pixel groups 740 of the display panel 160 according to the fourth example configuration may be configured to be electrically connected to gate driver circuitry 222. The sub-pixels included in the first sub-pixel groups 730 of the display panel 160 according to the fourth example configuration and the sub-pixels included in the second sub-pixel groups 740 of the display panel 160 according to the fourth example configuration may be electrically connected to the gate driver circuitry 222 through scan lines (the scan lines described with reference to FIGS. 2 and 3).

Sub-pixels included in each of the second sub-pixel groups 740 may include a first sub-pixel electrically connected to gate driver circuitry 222 through a scan line (e.g., one of the scan lines) and second sub-pixels electrically connected to the gate driver circuitry 222 through another scan line (e.g., another of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, a first sub-pixel (e.g., a sub-pixel configured to emit light of the first color), among sub-pixels in the sub-pixel group 741 in the second sub-pixel group 740, may be electrically connected to gate driver circuitry 222 through a scan line 794. The first sub-pixel may be scanned based on a signal S1 (e.g., the first signal 311, the second signal 312, the third signal 313, the fourth signal 314, or the fifth signal 315) received from the gate driver circuitry 222 through the scan line 794. Second sub-pixels (e.g., sub-pixels configured to emit light of the second color and a sub-pixel configured to emit light of the third color), among the sub-pixels, may be electrically connected to the gate driver circuitry 222 through a scan line 795. The second sub-pixels may be scanned based on a signal S2 (e.g., the first signal 311, the second signal 312, the third signal 313, the fourth signal 314, or the fifth signal 315) received from the gate driver circuitry 222 through the scan line 795.

Sub-pixels included in each of the first sub-pixel groups 730 may include a third sub-pixel electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, among sub-pixels in the sub-pixel group 731 in the first sub-pixel group 730, a third sub-pixel (e.g., a sub-pixel configured to emit light of the first color) may be electrically connected to gate driver circuitry 222 through a scan line 796. The third sub-pixel may be scanned based on a signal S3 (e.g., a first signal 311, a second signal 312, a third signal 313, a fourth signal 314, or a fifth signal 315) received from the gate driver circuitry 222 through the scan line 796. Among the sub-pixels, fourth sub-pixels (e.g., sub-pixels configured to emit light of the second color and sub-pixels configured to emit light of the third color) may be electrically connected to the gate driver circuitry 222 through a scan line 794. The fourth sub-pixels may be scanned based on a signal S1 (e.g., the first signal 311, the second signal 312, the third signal 313, the fourth signal 314, or the fifth signal 315) received from the gate driver circuitry 222 through the scan line 794.

The scan line electrically connected to the first sub-pixel may be further electrically connected to the fourth sub-pixels. For example, the scan line 794 electrically connected to the first sub-pixel in the sub-pixel group 741 may be further electrically connected to the fourth sub-pixels in the sub-pixel group 731. The scan line electrically connected to the third sub-pixel may be further electrically connected to the second sub-pixels. For example, the scan line 795 electrically connected to the third sub-pixel in the sub-pixel group 732 may be further electrically connected to the second sub-pixels in the sub-pixel group 741.

Figure 9:
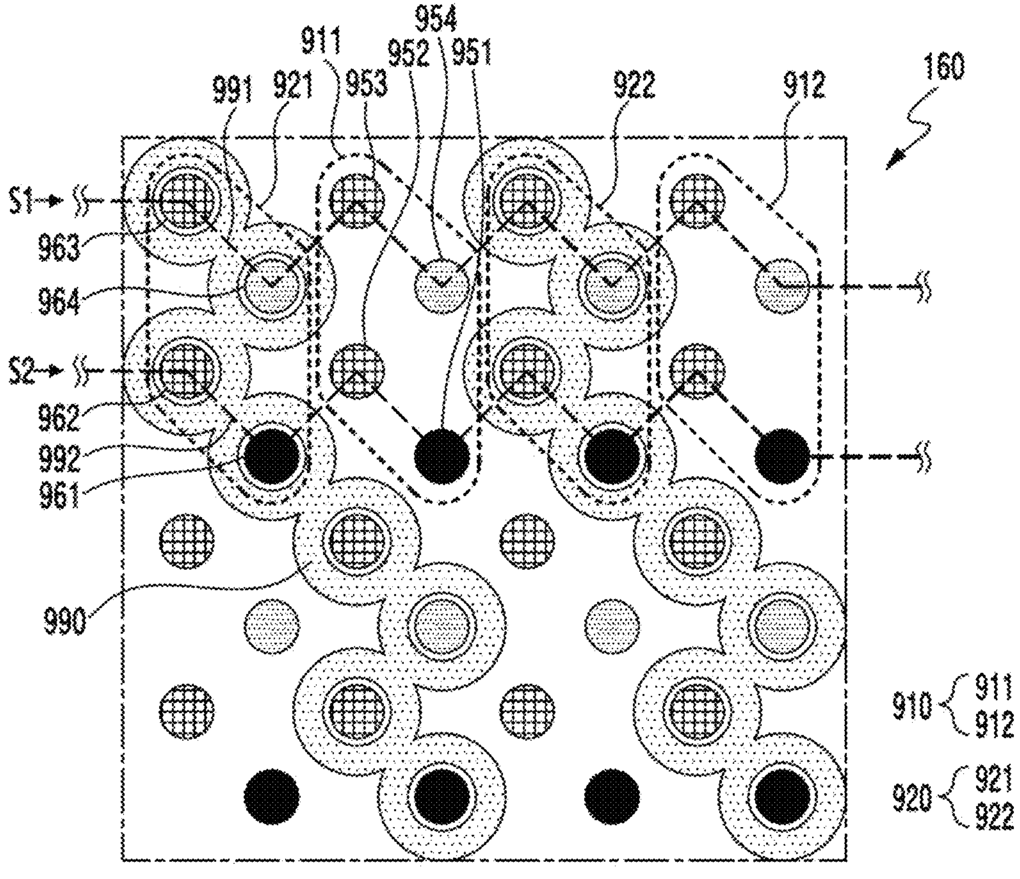
FIG. 9 illustrates a fifth example configuration of a display panel according to an embodiment of the disclosure.

A shape of the sub-pixels (or a shape of the micro-pixels of each of the sub-pixels) illustrated in FIGS. 4, 5, 7A, and 7B is rhombus, but this is only one embodiment. For example, the sub-pixels (or the micro-pixels) illustrated in FIGS. 4, 5, 7A, and 7B may have a shape having curvature. For example, a shape of the sub-pixels (or the micro-pixels) illustrated in FIGS. 4, 5, 7A, and 7B may be circular as illustrated in FIG. 9. For example, a shape of the sub-pixels (or the micro-pixels) illustrated in FIGS. 4, 5, 7A, and 7B may be elliptical.

The first sub-pixel (e.g., configured to emit the first color) (or micro-pixels in the first sub-pixel), the second sub-pixel (e.g., configured to emit the second color) (or micro-pixels in the second sub-pixel), and the third sub-pixel (e.g., configured to emit the third color) (or micro-pixels in the third sub-pixel) illustrated in FIGS. 4, 5, 7A, and 7B have the same shape, but it is only one embodiment. For example, a shape of the first sub-pixel (or a shape of the micro-pixels in the first sub-pixel) may be different from a shape of the second sub-pixel (or a shape of the micro-pixels in the second sub-pixel) and/or a shape of the third sub-pixel (or a shape of the micro-pixels in the third sub-pixel). For example, a shape of the second sub-pixel (or a shape of the micro-pixels in the second sub-pixel) may be different from a shape of the third sub-pixel (or a shape of the micro-pixels in the third sub-pixel).

FIG. 9 illustrates a fifth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 9.

Referring to FIG. 9, the display panel 160 may include a plurality of pixels. Each of the pixels may include sub-pixels.

The sub-pixels may include first sub-pixel groups 910 and second sub-pixel groups 920. The first sub-pixel groups 910 and the second sub-pixel groups 920 may be included in the display panel 160 in an interleaved arrangement as illustrated in FIG. 9.

The first sub-pixel groups 910 may include a sub-pixel group 911 and a sub-pixel group 912. Each of the first sub-pixel groups 910 may include a sub-pixel 951 configured to emit light of the first color, a sub-pixel 952 configured to emit light of the second color, a sub-pixel 953 configured to emit light of the second color, and a sub-pixel 954 configured to emit light of the third color.

The second sub-pixel groups 920 may include a sub-pixel group 921 and a sub-pixel group 922. Each of the second sub-pixel groups 920 may include a sub-pixel 961 configured to emit light of the first color, a sub-pixel 962 configured to emit light of the second color, a sub-pixel 963 configured to emit light of the second color, and a sub-pixel 964 configured to emit light of the third color.

In order to support the privacy display mode, light emitted from the second sub-pixel groups 920 may be partially blocked by an opaque member 990, such as the opaque member in the other layer described above. For example, a viewing angle according to light emitted from the second sub-pixel groups 920 may be narrower than a viewing angle according to light emitted from the first sub-pixel groups 910.

Sub-pixels included in the first sub-pixel groups 910 of the display panel 160 according to the fifth example configuration and sub-pixels included in the second sub-pixel groups 920 of the display panel 160 according to the fifth example configuration may be electrically connected to source driver circuitry 223. The sub-pixels included in the first sub-pixel groups 910 of the display panel 160 according to the fifth example configuration and the sub-pixels included in the second sub-pixel groups 920 of the display panel 160 according to the fifth example configuration may be electrically connected to emission driver circuitry 224. The sub-pixels included in the first sub-pixel groups 910 of the display panel 160 according to the fifth example configuration and the sub-pixels included in the second sub-pixel groups 920 of the display panel 160 according to the fifth example configuration may be configured to be electrically connected to gate driver circuitry 222. The sub-pixels included in the first sub-pixel groups 910 of the display panel 160 according to the fifth example configuration and the sub-pixels included in the second sub-pixel groups 920 of the display panel 160 according to the fifth example configuration may be electrically connected to the gate driver circuitry 222 through scan lines (the scan lines described with reference to FIGS. 2 and 3).

Sub-pixels included in each of the second sub-pixel groups 920 may include first sub-pixels electrically connected to the gate driver circuitry 222 through a scan line (e.g., one of the scan lines) and second sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the first sub-pixels (e.g., the sub-pixel 963 and the sub-pixel 964 in the sub-pixel group 921) among the sub-pixels in the sub-pixel group 921 in the second sub-pixel group 920 may be electrically connected to the gate driver circuitry 222 through a scan line 991. The first sub-pixels may be scanned based on a signal S1 (e.g., the first signal 311, the second signal 312, the third signal 313, the fourth signal 314, or the fifth signal 315) received from the gate driver circuitry 222 through the scan line 991. The second sub-pixels (e.g., the sub-pixel 961 and the sub-pixel 962 in the sub-pixel group 921) among the sub-pixels may be electrically connected to the gate driver circuitry 222 through a scan line 992. The second sub-pixels may be scanned based on a signal S2 (e.g., the first signal 311, the second signal 312, the third signal 313, the fourth signal 314, or the fifth signal 315) received from the gate driver circuitry 222 through the scan line 992.

Sub-pixels included in each of the first sub-pixel groups 910 may include third sub-pixels electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the third sub-pixels (e.g., the sub-pixel 953 and the sub-pixel 954 in the sub-pixel group 911) among the sub-pixels in the sub-pixel group 911 in the first sub-pixel group 910 may be electrically connected to the gate driver circuitry 222 through a scan line 991. The third sub-pixels may be scanned based on a signal S1 received from the gate driver circuitry 222 through the scan line 991. The fourth sub-pixels (e.g., the sub-pixel 951 and the sub-pixel 952 in the sub-pixel group 911) among the sub-pixels may be electrically connected to the gate driver circuitry 222 through a scan line 992. The fourth sub-pixels may be scanned based on a signal S2 received from the gate driver circuitry 222 through the scan line 992.

The scan line electrically connected to the first sub-pixels may be further electrically connected to the third sub-pixels. For example, the scan line 991 electrically connected to the first sub-pixels in the sub-pixel group 921 may be further electrically connected to the third sub-pixels in the sub-pixel group 911. The scan line electrically connected to the second sub-pixel may be further electrically connected to the fourth sub-pixels. For example, the scan line 992 electrically connected to the second sub-pixels in the sub-pixel group 921 may be further electrically connected to the fourth sub-pixels in the sub-pixel group 911.

Figure 10A:
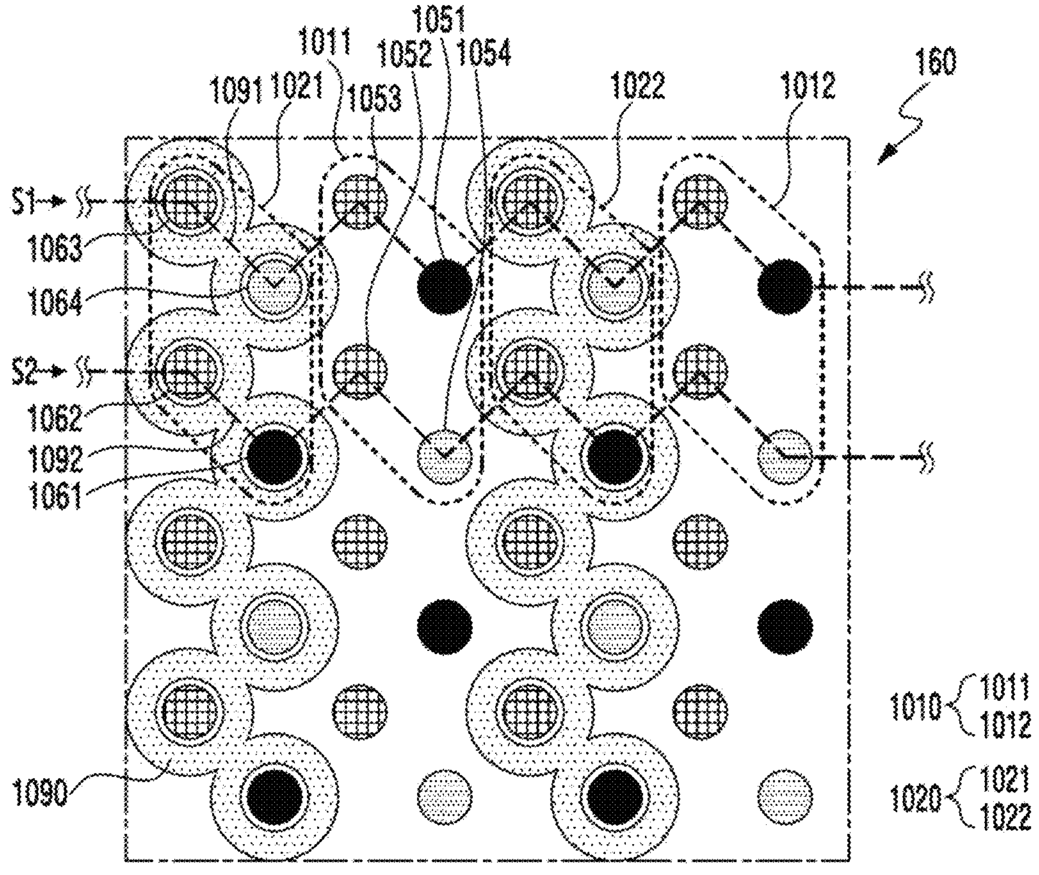
FIG. 10A illustrates a sixth example configuration of a display panel according to an embodiment of the disclosure.

FIG. 10A illustrates a sixth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 10A.

Referring to FIG. 10A, the display panel 160 may include a plurality of pixels. Each of the pixels may include sub-pixels.

The sub-pixels may include first sub-pixel groups 1010 and second sub-pixel groups 1020. The first sub-pixel groups 1010 and the second sub-pixel groups 1020 may be included in the display panel 160 in an interleaved arrangement as illustrated in FIG. 10A.

The first sub-pixel groups 1010 may include a sub-pixel group 1011 and a sub-pixel group 1012. Each of the first sub-pixel groups 1010 may include a sub-pixel 1051 configured to emit light of the first color, a sub-pixel 1052 configured to emit light of the second color, a sub-pixel 1053 configured to emit light of the second color, and a sub-pixel 1054 configured to emit light of the third color.

The second sub-pixel groups 1020 may include a sub-pixel group 1021 and a sub-pixel group 1022. Each of the second sub-pixel groups 1020 may include a sub-pixel 1061 configured to emit light of the first color, a sub-pixel 1062 configured to emit light of the second color, a sub-pixel 1063 configured to emit light of the second color, and a sub-pixel 1064 configured to emit light of the third color.

In order to support the privacy display mode, light emitted from the second sub-pixel groups 1020 may be partially blocked by an opaque member 1090, such as the opaque member in the other layer described above. For example, a viewing angle according to light emitted from the second sub-pixel groups 1020 may be narrower than a viewing angle according to light emitted from the first sub-pixel groups 1010.

Sub-pixels included in the first sub-pixel groups 1010 of the display panel 160 according to the sixth example configuration and sub-pixels included in the second sub-pixel groups 1020 of the display panel 160 according to the sixth example configuration may be electrically connected to source driver circuitry 223. The sub-pixels included in the first sub-pixel groups 1010 of the display panel 160 according to the sixth example configuration and the sub-pixels included in the second sub-pixel groups 1020 of the display panel 160 according to the sixth example configuration may be electrically connected to emission driver circuitry 224. The sub-pixels included in the first sub-pixel groups 1010 of the display panel 160 according to the sixth example configuration and the sub-pixels included in the second sub-pixel groups 1020 of the display panel 160 according to the sixth example configuration may be configured to be electrically connected to gate driver circuitry 222. The sub-pixels included in the first sub-pixel groups 1010 of the display panel 160 according to the sixth example configuration and the sub-pixels included in the second sub-pixel groups 1020 of the display panel 160 according to the sixth example configuration may be electrically connected to the gate driver circuitry 222 through scan lines (the scan lines described with reference to FIGS. 2 and 3).

Sub-pixels included in each of the second sub-pixel groups 1020 may include first sub-pixels electrically connected to the gate driver circuitry 222 through a scan line (e.g., one of the scan lines) and second sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the first sub-pixels (e.g., the sub-pixel 1063 and the sub-pixel 1064 in the sub-pixel group 1021) among the sub-pixels in the sub-pixel group 1021 in the second sub-pixel group 1020 may be electrically connected to the gate driver circuitry 222 through a scan line 1091. The first sub-pixels may be scanned based on a signal S1 (e.g., the first signal 311, the second signal 312, the third signal 313, the fourth signal 314, or the fifth signal 315) received from the gate driver circuitry 222 through the scan line 1091. The second sub-pixels (e.g., the sub-pixel 1061 and the sub-pixel 1062 in the sub-pixel group 1021) among the sub-pixels may be electrically connected to the gate driver circuitry 222 through a scan line 1092. The second sub-pixels may be scanned based on a signal S2 (e.g., the first signal 311, the second signal 312, the third signal 313, the fourth signal 314, or the fifth signal 315) received from the gate driver circuitry 222 through the scan line 1092.

Sub-pixels included in each of the first sub-pixel groups 1010 may include third sub-pixels electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the third sub-pixels (e.g., the sub-pixel 1051 and the sub-pixel 1053 in the sub-pixel group 1011) among the sub-pixels in the sub-pixel group 1011 in the first sub-pixel group 1010 may be electrically connected to the gate driver circuitry 222 through a scan line 1091. The third sub-pixels may be scanned based on a signal S1 received from the gate driver circuitry 222 through the scan line 1091. The fourth sub-pixels (e.g., the sub-pixel 1052 and the sub-pixel 1054 in the sub-pixel group 1011) among the sub-pixels may be electrically connected to the gate driver circuitry 222 through a scan line 1092. The fourth sub-pixels may be scanned based on a signal S2 received from the gate driver circuitry 222 through the scan line 1092.

The scan line electrically connected to the first sub-pixels may be further electrically connected to the third sub-pixels. For example, the scan line 1091 electrically connected to the first sub-pixels in the sub-pixel group 1021 may be further electrically connected to the third sub-pixels in the sub-pixel group 1011. The scan line electrically connected to the second sub-pixels may be further electrically connected to the fourth sub-pixels. For example, the scan line 1092 electrically connected to the second sub-pixels in the sub-pixel group 1021 may be further electrically connected to the fourth sub-pixels in the sub-pixel group 1011.

Figure 10B:
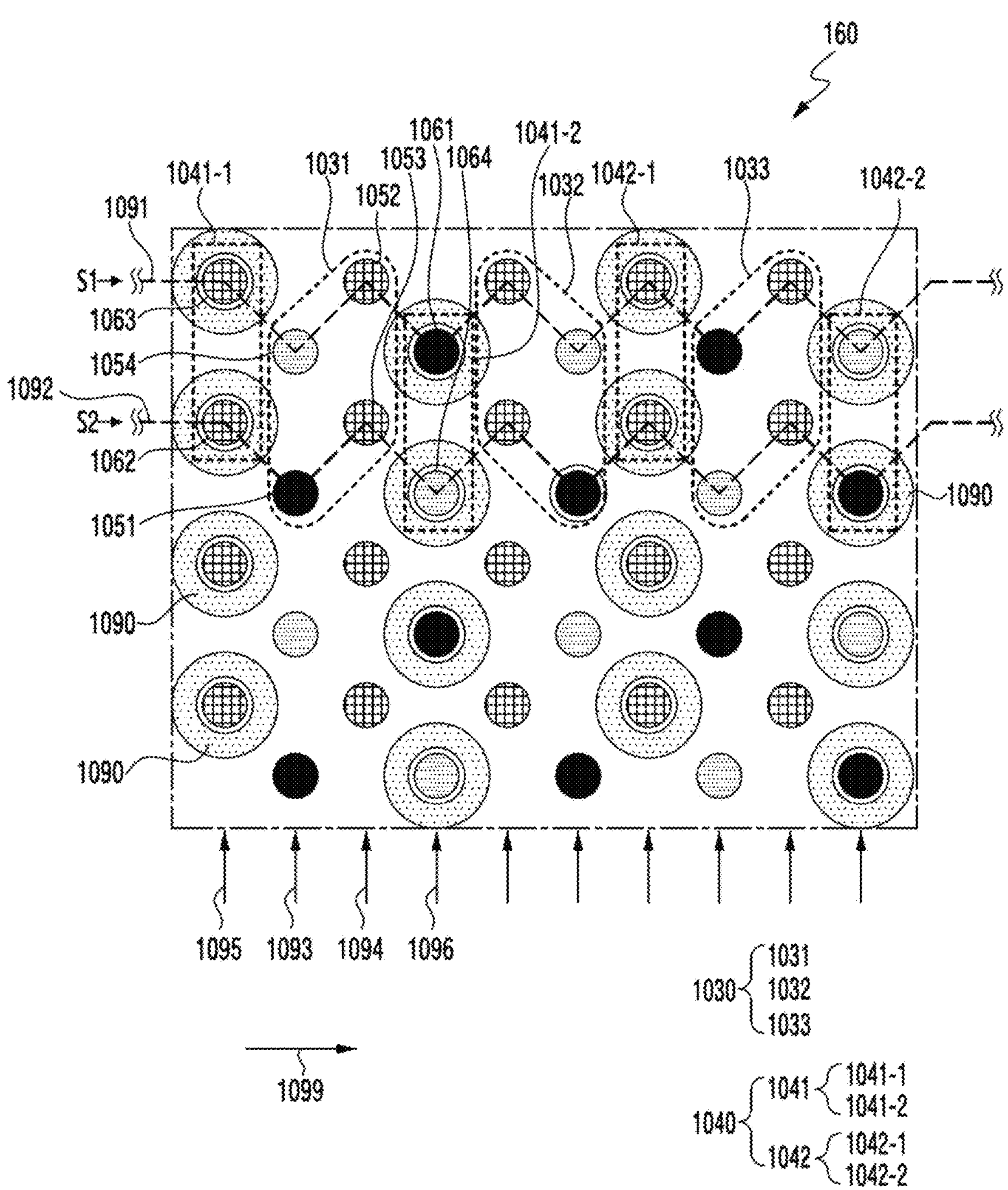
FIG. 10B illustrates a seventh example configuration of a display panel according to an embodiment of the disclosure.

FIG. 10B illustrates a seventh example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 10B.

Referring to FIG. 10B, the display panel 160 may include a plurality of pixels. Each of the pixels may include sub-pixels.

The sub-pixels may include first sub-pixel groups 1030 and second sub-pixel groups 1040.

The first sub-pixel groups 1030 may include a sub-pixel group 1031, a sub-pixel group 1032, and a sub-pixel group 1033. Each of the first sub-pixel groups 1030 may include a sub-pixel 1051 configured to emit light of the first color, a sub-pixel 1052 configured to emit light of the second color, a sub-pixel 1053 configured to emit light of the second color, and a sub-pixel 1054 configured to emit light of the third color.

The second sub-pixel groups 1040 may include a sub-pixel group 1041 and a sub-pixel group 1042. Each of the second sub-pixel groups 1040 may include a sub-pixel 1061 configured to emit light of the first color, a sub-pixel 1062 configured to emit light of the second color, a sub-pixel 1063 configured to emit light of the second color, and a sub-pixel 1064 configured to emit light of the third color.

A portion of the first sub-pixel groups 1030 may be disposed, in a direction 1099 (or in a horizontal direction 1099), between a portion of a sub-pixel group in the second sub-pixel groups 1040 and another portion of the sub-pixel group in the second sub-pixel groups 1040. For example, the sub-pixel group 1031 may be disposed, in the direction 1099, between a portion 1041-1 of the sub-pixel group 1041 including the sub-pixel 1062 and the sub-pixel 1063 and a portion 1041-2 of the sub-pixel group 1041 including the sub-pixel 1061 and the sub-pixel 1064. For example, the sub-pixel group 1033 may be disposed, in the direction 1099, between a portion 1042-1 of the sub-pixel group 1042 including the sub-pixel 1062 and the sub-pixel 1063 and a portion 1042-2 of the sub-pixel group 1042 including the sub-pixel 1061 and the sub-pixel 1064.

Another portion of the first sub-pixel groups 1030 may be disposed, in a direction 1099 (or in a horizontal direction 1099), between a portion of a sub-pixel group in the second sub-pixel groups 1040 and a portion of another sub-pixel group in the second sub-pixel groups 1040. For example, the sub-pixel group 1032 may be disposed, in the direction 1099, between a portion 1041-2 of the sub-pixel group 1041 including the sub-pixel 1061 and the sub-pixel 1064 and a portion 1042-1 of the sub-pixel group 1042 including the sub-pixel 1062 and the sub-pixel 1063.

In order to support the privacy display mode, light emitted from the second sub-pixel groups 1040 may be partially blocked by an opaque member 1090, such as the opaque member in the other layer described above. For example, a viewing angle according to light emitted from the second sub-pixel groups 1040 may be narrower than a viewing angle according to light emitted from the first sub-pixel groups 1030.

Sub-pixels included in the first sub-pixel groups 1030 of the display panel 160 according to the seventh example configuration and sub-pixels included in the second sub-pixel groups 1040 of the display panel 160 according to the seventh example configuration may be electrically connected to source driver circuitry 223. For example, an Nth data line 1093 and an (N+1)th data line 1094 may be connected to the sub-pixel group 1031 and may not be connected to the sub-pixel group 1041. For example, an (N−1)th data line 1095 and an (N+2)th data line 1096 may be connected to the sub-pixel group 1041 and may not be connected to the sub-pixel group 1031.

The sub-pixels included in the first sub-pixel groups 1030 of the display panel 160 according to the seventh example configuration and the sub-pixels included in the second sub-pixel groups 1040 of the display panel 160 according to the seventh example configuration may be electrically connected to emission driver circuitry 224. The sub-pixels included in the first sub-pixel groups 1030 of the display panel 160 according to the seventh example configuration and the sub-pixels included in the second sub-pixel groups 1040 of the display panel 160 according to the seventh example configuration may be configured to be electrically connected to gate driver circuitry 222. The sub-pixels included in the first sub-pixel groups 1030 of the display panel 160 according to the seventh example configuration and the sub-pixels included in the second sub-pixel groups 1040 of the display panel 160 according to the seventh example configuration may be electrically connected to the gate driver circuitry 222 through scan lines (the scan lines described with reference to FIGS. 2 and 3).

Sub-pixels included in each of the second sub-pixel groups 1040 may include first sub-pixels electrically connected to the gate driver circuitry 222 through a scan line (e.g., one of the scan lines) and second sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the first sub-pixels (e.g., the sub-pixel 1061 and the sub-pixel 1063 in the sub-pixel group 1041) among the sub-pixels in the sub-pixel group 1041 in the second sub-pixel group 1040 may be electrically connected to the gate driver circuitry 222 through a scan line 1091. The first sub-pixels may be scanned based on a signal S1 (e.g., the first signal 311, the second signal 312, the third signal 313, the fourth signal 314, or the fifth signal 315) received from the gate driver circuitry 222 through the scan line 1091. The second sub-pixels (e.g., the sub-pixel 1062 and the sub-pixel 1064 in the sub-pixel group 1041) among the sub-pixels may be electrically connected to the gate driver circuitry 222 through a scan line 1092. The second sub-pixels may be scanned based on a signal S2 (e.g., the first signal 311, the second signal 312, the third signal 313, the fourth signal 314, or the fifth signal 315) received from the gate driver circuitry 222 through the scan line 1092.

Sub-pixels included in each of the first sub-pixel groups 1030 may include third sub-pixels electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the third sub-pixels (e.g., the sub-pixel 1052 and the sub-pixel 1054 in the sub-pixel group 1031) among the sub-pixels in the sub-pixel group 1031 in the first sub-pixel groups 1030 may be electrically connected to the gate driver circuitry 222 through a scan line 1091. The third sub-pixels may be scanned based on a signal S1 received from the gate driver circuitry 222 through the scan line 1091. The fourth sub-pixels (e.g., the sub-pixel 1051 and the sub-pixel 1053 in the sub-pixel group 1031) among the sub-pixels may be electrically connected to the gate driver circuitry 222 through a scan line 1092. The fourth sub-pixels may be scanned based on a signal S2 received from the gate driver circuitry 222 through the scan line 1092.

The scan line electrically connected to the first sub-pixels may be further electrically connected to the third sub-pixels. For example, the scan line 1091 electrically connected to the first sub-pixels in the sub-pixel group 1041 may be further electrically connected to the third sub-pixels in the sub-pixel group 1031. The scan line electrically connected to the second sub-pixel may be further electrically connected to the fourth sub-pixels. For example, the scan line 1092 electrically connected to the second sub-pixels in the sub-pixel group 1041 may be further electrically connected to the fourth sub-pixels in the sub-pixel group 1031.

The second sub-pixel groups 1040 used for the privacy display mode in the display panel 160 according to the seventh example configuration may be more dispersed relative to the second sub-pixel groups 1020 used for the privacy display mode in the display panel 160 according to the sixth example configuration.

Figure 10C:
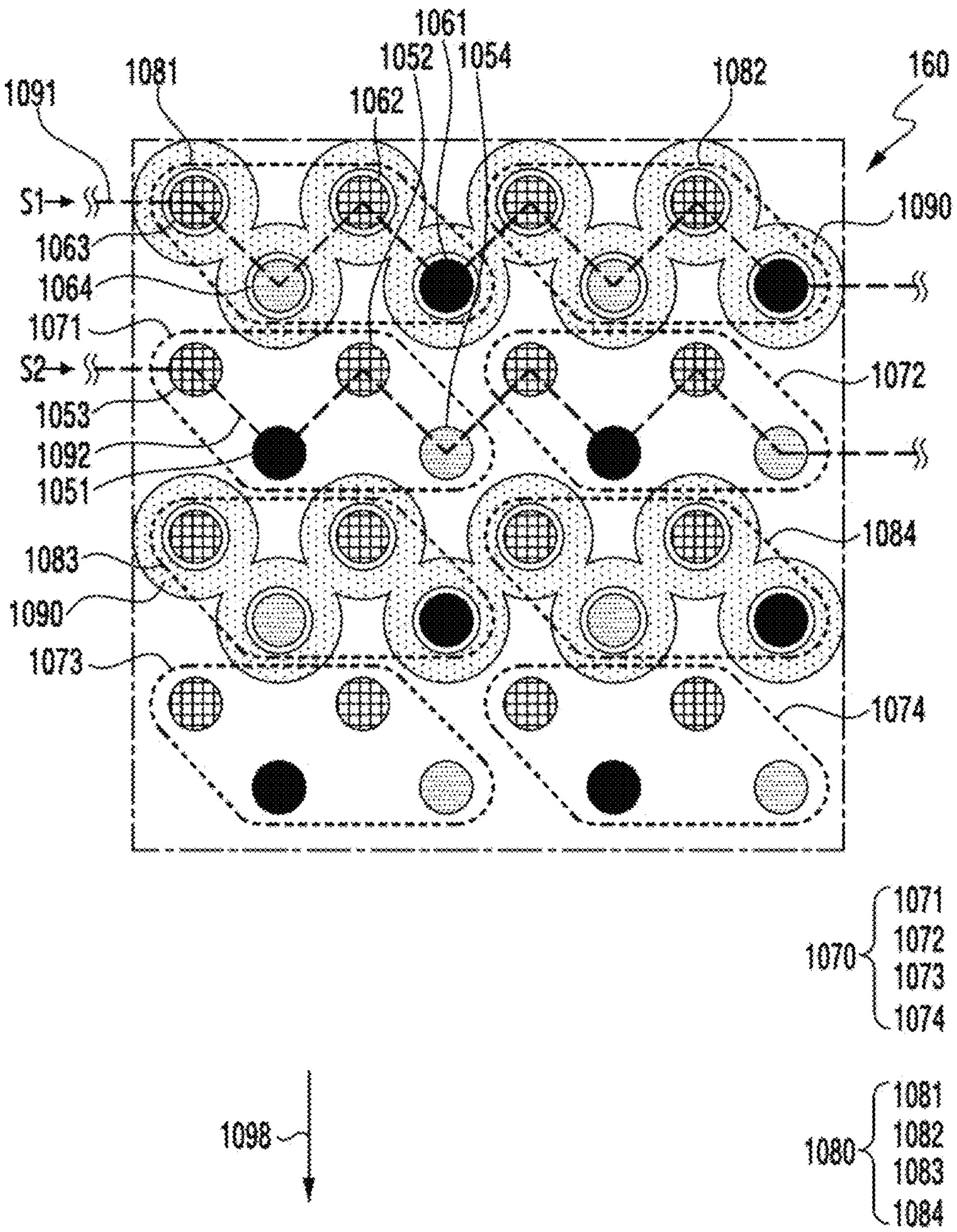
FIG. 10C illustrates an eighth example configuration of a display panel according to an embodiment of the disclosure.

FIG. 10C illustrates an eighth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 10C.

Referring to FIG. 10C, the display panel 160 may include a plurality of pixels. Each of the pixels may include sub-pixels.

The sub-pixels may include first sub-pixel groups 1070 and second sub-pixel groups 1080. The first sub-pixel groups 1070 and the second sub-pixel groups 1080 may be included in the display panel 160 in an interleaved arrangement as illustrated in FIG. 10C.

The first sub-pixel groups 1070 may include a sub-pixel group 1071, a sub-pixel group 1072, a sub-pixel group 1073, and a sub-pixel group 1074. Each of the first sub-pixel groups 1070 may include a sub-pixel 1051 configured to emit light of the first color, a sub-pixel 1052 configured to emit light of the second color, a sub-pixel 1053 configured to emit light of the second color, and a sub-pixel 1054 configured to emit light of the third color.

The second sub-pixel groups 1080 may include a sub-pixel group 1081, a sub-pixel group 1082, a sub-pixel group 1083, and a sub-pixel group 1084. Each of the second sub-pixel groups 1080 may include a sub-pixel 1061 configured to emit light of the first color, a sub-pixel 1062 configured to emit light of the second color, a sub-pixel 1063 configured to emit light of the second color, and a sub-pixel 1064 configured to emit light of the third color.

At least a portion of the first sub-pixel groups 1070 may be disposed, in a direction 1098 (or a vertical direction 1098) perpendicular to the direction 1099 illustrated in FIG. 10B, between a sub-pixel group in the second sub-pixel groups 1080 and another sub-pixel group in the second sub-pixel groups 1080. For example, the sub-pixel group 1071 may be disposed, in the direction 1098, between the sub-pixel group 1081 and the sub-pixel group 1083. For example, the sub-pixel group 1072 may be disposed, in the direction 1098, between the sub-pixel group 1082 and the sub-pixel group 1084.

At least a portion of the second sub-pixel groups 1080 may be disposed, in the direction 1098, between a sub-pixel group in the first sub-pixel groups 1070 and another sub-pixel group in the first sub-pixel groups 1070. For example, the sub-pixel group 1083 may be disposed, in the direction 1098, between the sub-pixel group 1071 and the sub-pixel group 1073. For example, the sub-pixel group 1084 may be disposed, in the direction 1098, between the sub-pixel group 1072 and the sub-pixel group 1074.

In order to support the privacy display mode, light emitted from the second sub-pixel groups 1080 may be partially blocked by an opaque member 1090, such as the opaque member in the other layer described above. For example, a viewing angle according to light emitted from the second sub-pixel groups 1080 may be narrower than a viewing angle according to light emitted from the first sub-pixel groups 1070.

Sub-pixels included in the first sub-pixel groups 1070 of the display panel 160 according to the eighth example configuration and the sub-pixels included in the second sub-pixel groups 1080 of the display panel 160 according to the eighth example configuration may be electrically connected to source driver circuitry 223. The sub-pixels included in the first sub-pixel groups 1070 of the display panel 160 according to the eighth example configuration and the sub-pixels included in the second sub-pixel groups 1080 of the display panel 160 according to the eighth example configuration may be electrically connected to emission driver circuitry 224. The sub-pixels included in the first sub-pixel groups 1070 of the display panel 160 according to the eighth example configuration and the sub-pixels included in the second sub-pixel groups 1080 of the display panel 160 according to the eighth example configuration may be configured to be electrically connected to gate driver circuitry 222. The sub-pixels included in the first sub-pixel groups 1070 of the display panel 160 according to the eighth example configuration and the sub-pixels included in the second sub-pixel groups 1080 of the display panel 160 according to the eighth example configuration may be electrically connected to the gate driver circuitry 222 through scan lines (the scan lines described with reference to FIGS. 2 and 3).

Sub-pixels included in each of the second sub-pixel groups 1080 may be electrically connected to the gate driver circuitry 222 through a scan line (e.g., one of the scan lines). The sub-pixels included in each of the first sub-pixel groups 1070 may be electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, sub-pixels in the sub-pixel group 1081 in the second sub-pixel groups 1080 may be electrically connected to the gate driver circuitry 222 through a scan line 1091 (or an (N−1)th scan line 1091). The scan line 1091 may not be connected to the sub-pixel group 1071. The sub-pixels in the sub-pixel group 1081 may be scanned based on a signal S1 (e.g., the first signal 311, the second signal 312, the third signal 313, the fourth signal 314, or the fifth signal 315) received from the gate driver circuitry 222 through the scan line 1091.

For example, sub-pixels in the sub-pixel group 1071 in the first sub-pixel groups 1070 may be electrically connected to the gate driver circuitry 222 through a scan line 1092 (or an Nth scan line 1092). The scan line 1092 may not be connected to the sub-pixel group 1081. The sub-pixels in the sub-pixel group 1071 may be scanned based on a signal S2 (e.g., the first signal 311, the second signal 312, the third signal 313, the fourth signal 314, or the fifth signal 315) received from the gate driver circuitry 222 through the scan line 1092.

Figure 10D:
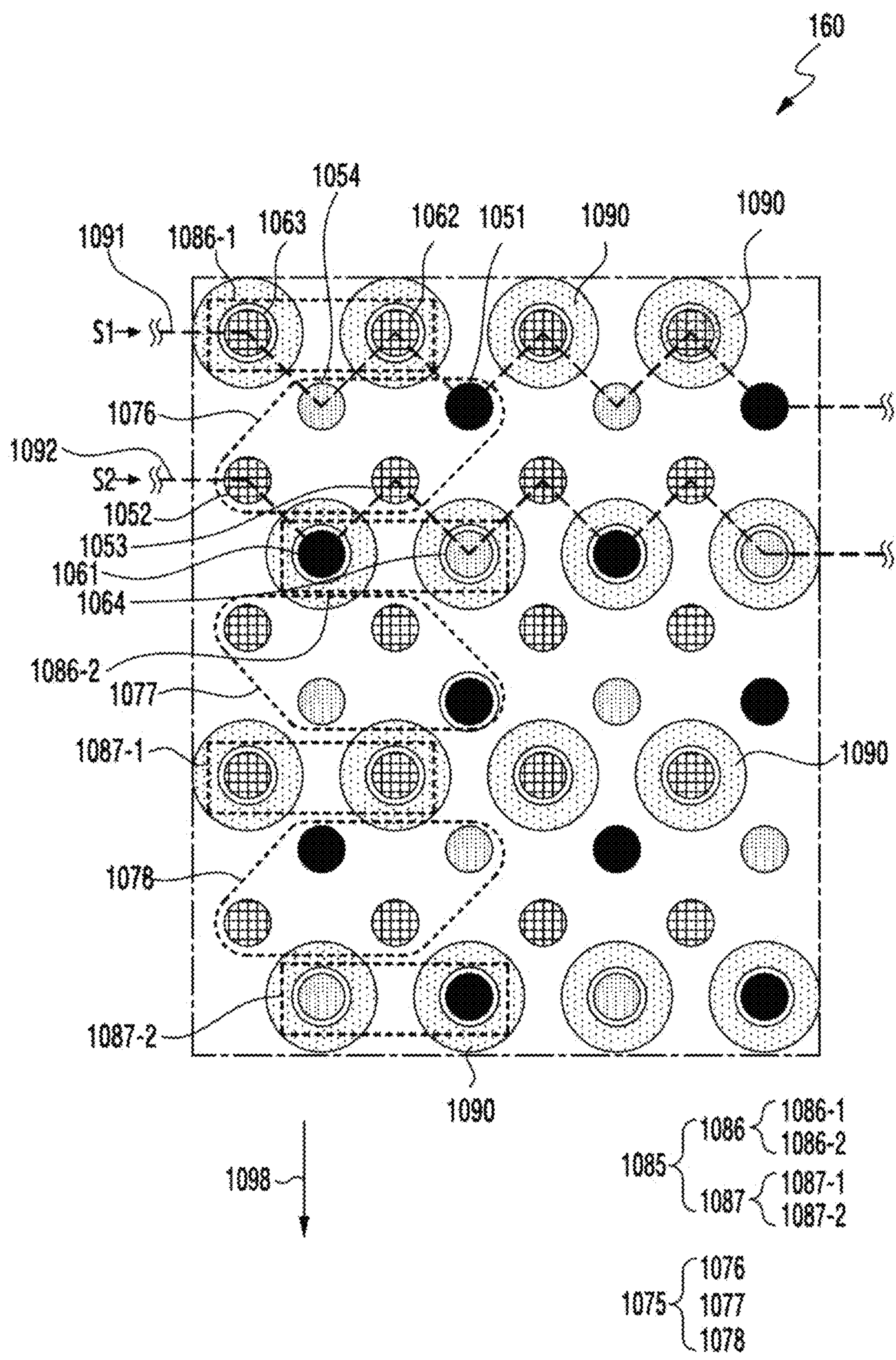
FIG. 10D illustrates a ninth example configuration of a display panel according to an embodiment of the disclosure.

FIG. 10D illustrates a ninth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 10D.

Referring to FIG. 10D, the display panel 160 may include a plurality of pixels. Each of the pixels may include sub-pixels.

The sub-pixels may include first sub-pixel groups 1075 and second sub-pixel groups 1085.

The first sub-pixel groups 1075 may include a sub-pixel group 1076, a sub-pixel group 1077, and a sub-pixel group 1078. Each of the first sub-pixel groups 1075 may include a sub-pixel 1051 configured to emit light of the first color, a sub-pixel 1052 configured to emit light of the second color, a sub-pixel 1053 configured to emit light of the second color, and a sub-pixel 1054 configured to emit light of the third color.

The second sub-pixel groups 1085 may include a sub-pixel group 1086 and a sub-pixel group 1087. Each of the second sub-pixel groups 1085 may include a sub-pixel 1061 configured to emit light of the first color, a sub-pixel 1062 configured to emit light of the second color, a sub-pixel 1063 configured to emit light of the second color, and a sub-pixel 1064 configured to emit light of the third color.

A portion of the first sub-pixel groups 1075 may be disposed, in the direction 1098 described with reference to FIG. 10C, between a portion of a sub-pixel group in the second sub-pixel groups 1085 and another portion of the sub-pixel group in the second sub-pixel groups 1085. For example, the sub-pixel group 1076 may be disposed, in the direction 1098, between a portion 1086-1 of the sub-pixel group 1086 including the sub-pixel 1062 and the sub-pixel 1063 and a portion 1086-2 of the sub-pixel group 1086 including the sub-pixel 1061 and the sub-pixel 1064. For example, the sub-pixel group 1078 may be disposed, in the direction 1098, between a portion 1087-1 of the sub-pixel group 1087 including the sub-pixel 1062 and the sub-pixel 1063 and a portion 1087-2 of the sub-pixel group 1087 including the sub-pixel 1061 and the sub-pixel 1064.

Another portion of the first sub-pixel groups 1075 may be disposed, in the direction 1098, between a portion of a sub-pixel group in the second sub-pixel groups 1085 and a portion of another sub-pixel group in the second sub-pixel groups 1085. For example, the sub-pixel group 1077 may be disposed, in the direction 1098, between a portion 1086-2 of the sub-pixel group 1086 including the sub-pixel 1061 and the sub-pixel 1064 and a portion 1087-1 of the sub-pixel group 1087 including the sub-pixel 1062 and the sub-pixel 1063.

In order to support the privacy display mode, light emitted from the second sub-pixel groups 1085 may be partially blocked by an opaque member 1090, such as the opaque member in the other layer described above. For example, a viewing angle according to light emitted from the second sub-pixel groups 1085 may be narrower than a viewing angle according to light emitted from the first sub-pixel groups 1075.

Sub-pixels included in the first sub-pixel groups 1075 of the display panel 160 according to the ninth example configuration and sub-pixels included in the second sub-pixel groups 1085 of the display panel 160 according to the ninth example configuration may be electrically connected to source driver circuitry 223. The sub-pixels included in the first sub-pixel groups 1075 of the display panel 160 according to the ninth example configuration and the sub-pixels included in the second sub-pixel groups 1085 of the display panel 160 according to the ninth example configuration may be electrically connected to emission driver circuitry 224. The sub-pixels included in the first sub-pixel groups 1075 of the display panel 160 according to the ninth example configuration and the sub-pixels included in the second sub-pixel groups 1085 of the display panel 160 according to the ninth example configuration may be configured to be electrically connected to gate driver circuitry 222. The sub-pixels included in the first sub-pixel groups 1075 of the display panel 160 according to the ninth example configuration and the sub-pixels included in the second sub-pixel groups 1085 of the display panel 160 according to the ninth example configuration may be electrically connected to the gate driver circuitry 222 through scan lines (the scan lines described with reference to FIGS. 2 and 3).

Sub-pixels included in each of the second sub-pixel groups 1085 may include first sub-pixels electrically connected to the gate driver circuitry 222 through a scan line (e.g., one of the scan lines) and second sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the first sub-pixels (e.g., the sub-pixel 1062 and the sub-pixel 1063 in the sub-pixel group 1086) among sub-pixels in the sub-pixel group 1086 in the second sub-pixel groups 1085 may be electrically connected to the gate driver circuitry 222 through a scan line 1091. The first sub-pixels may be scanned based on a signal S1 (e.g., the first signal 311, the second signal 312, the third signal 313, the fourth signal 314, or the fifth signal 315) received from the gate driver circuitry 222 through the scan line 1091. The second sub-pixels (e.g., the sub-pixel 1061 and the sub-pixel 1064 in the sub-pixel group 1086) among the sub-pixels may be electrically connected to the gate driver circuitry 222 through a scan line 1092. The second sub-pixels may be scanned based on a signal S2 (e.g., the first signal 311, the second signal 312, the third signal 313, the fourth signal 314, or the fifth signal 315) received from the gate driver circuitry 222 through the scan line 1092.

Sub-pixels included in each of the first sub-pixel groups 1075 may include third sub-pixels electrically connected to the gate driver circuitry 222 through a scan line (e.g., one of the scan lines) and fourth sub-pixels electrically connected to the gate driver circuitry 222 through another scan line (e.g., another one of the scan lines). The other scan line may be positioned (or disposed) alongside the scan line. The other scan line may be positioned immediately next to the scan line. The other scan line may be described as a scan line immediately before the scan line or a scan line immediately after the scan line.

For example, the third sub-pixels (e.g., the sub-pixel 1051 and the sub-pixel 1054 in the sub-pixel group 1076) among sub-pixels in the sub-pixel group 1076 in the first sub-pixel groups 1075 may be electrically connected to the gate driver circuitry 222 through a scan line 1091. The third sub-pixels may be scanned based on a signal S1 received from the gate driver circuitry 222 through the scan line 1091. The fourth sub-pixels (e.g., the sub-pixel 1052 and the sub-pixel 1053 in the sub-pixel group 1076) among the sub-pixels may be electrically connected to the gate driver circuitry 222 through a scan line 1092. The fourth sub-pixels may be scanned based on a signal S2 received from the gate driver circuitry 222 through the scan line 1092.

The scan line electrically connected to the first sub-pixels may be further electrically connected to the third sub-pixels. The first sub-pixels and the third sub-pixels may be alternately connected to the scan line. For example, the scan line 1091 electrically connected to the first sub-pixels in the sub-pixel group 1086 may be further electrically connected to the third sub-pixels in the sub-pixel group 1076.

The scan line electrically connected to the second sub-pixel may be further electrically connected to the fourth sub-pixels. The second sub-pixels and the fourth sub-pixels may be alternately connected to the scan line. For example, the scan line 1092 electrically connected to the second sub-pixels in the sub-pixel group 1086 may be further electrically connected to the fourth sub-pixels in the sub-pixel group 1076.

The second sub-pixel groups 1085 used for the privacy display mode in the display panel 160 according to the ninth example configuration may be more dispersed relative to the second sub-pixel groups 1080 used for the privacy display mode in the display panel 160 according to the eighth example configuration.

FIGS. 10A to 10D illustrate an example in which a ratio of the number of first sub-pixel groups to the number of second sub-pixel groups is 1:1, but this is only one embodiment. The ratio of the number of first sub-pixel groups to the number of second sub-pixel groups may be a:b (where a and b are natural numbers different from each other), unlike the illustration of FIGS. 10A to 10D. For example, the ratio of the number of first sub-pixel groups to the number of second sub-pixel groups may be 1:2, 1:3, 1:N (where N is a natural number greater than 1), or M:1 (where M is a natural number greater than 1).

Figure 11:
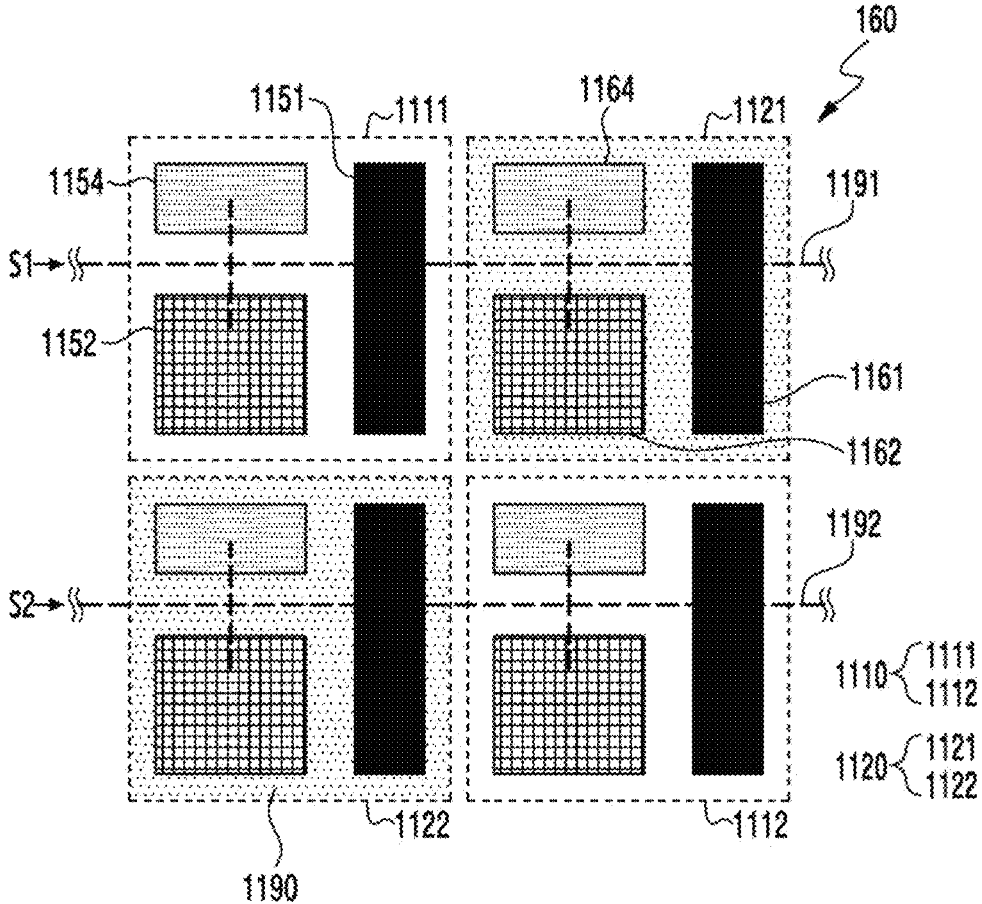
FIG. 11 illustrates a tenth example configuration of a display panel according to an embodiment of the disclosure.

FIG. 11 illustrates a tenth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 11.

Referring to FIG. 11, the display panel 160 may include a plurality of pixels. Each of the pixels may include sub-pixels.

The sub-pixels may include first sub-pixel groups 1110 and second sub-pixel groups 1120. The first sub-pixel groups 1110 and the second sub-pixel groups 1120 may be included in the display panel 160 in an interleaved arrangement as illustrated in FIG. 11.

The first sub-pixel groups 1110 may include a sub-pixel group 1111 and a sub-pixel group 1112. Each of the first sub-pixel groups 1110 may include a sub-pixel 1151 configured to emit light of the first color, a sub-pixel 1152 configured to emit light of the second color, and a sub-pixel 1154 configured to emit light of the third color.

The second sub-pixel groups 1120 may include a sub-pixel group 1121 and a sub-pixel group 1122. Each of the second sub-pixel groups 1120 may include a sub-pixel 1161 configured to emit light of the first color, a sub-pixel 1162 configured to emit light of the second color, and a sub-pixel 1164 configured to emit light of the third color.

In order to support the privacy display mode, light emitted from the second sub-pixel groups 1120 may be partially blocked by an opaque member 1190, such as the opaque member in the other layer described above. For example, a viewing angle according to light emitted from the second sub-pixel groups 1120 may be narrower than a viewing angle according to light emitted from the first sub-pixel groups 1110.

Sub-pixels included in the first sub-pixel groups 1110 of the display panel 160 according to the tenth example configuration and sub-pixels included in the second sub-pixel groups 1120 of the display panel 160 according to the tenth example configuration may be electrically connected to source driver circuit 223. The sub-pixels included in the first sub-pixel groups 1110 of the display panel 160 according to the tenth example configuration and the sub-pixels included in the second sub-pixel groups 1120 of the display panel 160 according to the tenth example configuration may be electrically connected to emission driver circuitry 224. The sub-pixels included in the first sub-pixel groups 1110 of the display panel 160 according to the tenth example configuration and the sub-pixels included in the second sub-pixel groups 1120 of the display panel 160 according to the tenth example configuration may be configured to be electrically connected to gate driver circuitry 222. The sub-pixels included in the first sub-pixel groups 1110 of the display panel 160 according to the tenth example configuration and the sub-pixels included in the second sub-pixel groups 1120 of the display panel 160 according to the tenth example configuration may be electrically connected to the gate driver circuitry 222 through scan lines (the scan lines described with reference to FIGS. 2 and 3).

Sub-pixels included in each of the second sub-pixel groups 1120 may be electrically connected to the gate driver circuitry 222 through a scan line (or a single scan line) (e.g., one of the scan lines).

For example, sub-pixels in the sub-pixel group 1121 in the second sub-pixel group 1120 may be electrically connected to the gate driver circuitry 222 through a scan line 1191. The sub-pixels may be scanned based on a signal S1 (e.g., the first signal 311, the second signal 312, the third signal 313, the fourth signal 314, or the fifth signal 315) received from the gate driver circuitry 222 through the scan line 1191.

For example, sub-pixels in the sub-pixel group 1122 in the second sub-pixel group 1120 may be electrically connected to the gate driver circuitry 222 through a scan line 1192. The sub-pixels may be scanned based on a signal S2 (e.g., the first signal 311, the second signal 312, the third signal 313, the fourth signal 314, or the fifth signal 315) received from the gate driver circuitry 222 through the scan line 1192.

The sub-pixels included in each of the first sub-pixel groups 1110 may be electrically connected to the gate driver circuitry 222 through a scan line (or a single scan line) (e.g., one of the scan lines).

For example, sub-pixels in the sub-pixel group 1111 in the first sub-pixel group 1110 may be electrically connected to the gate driver circuitry 222 through a scan line 1191. The sub-pixels may be scanned based on a signal S1 (e.g., the first signal 311, the second signal 312, the third signal 313, the fourth signal 314, or the fifth signal 315) received from the gate driver circuitry 222 through the scan line 1191.

For example, sub-pixels in the sub-pixel group 1112 in the first sub-pixel group 1110 may be electrically connected to the gate driver circuitry 222 through a scan line 1192. The sub-pixels may be scanned based on a signal S2 (e.g., the first signal 311, the second signal 312, the third signal 313, the fourth signal 314, or the fifth signal 315) received from the gate driver circuitry 222 through the scan line 1192.

The scan line 1191 electrically connected to the sub-pixels in the sub-pixel group 1121 may be further electrically connected to the sub-pixels in the sub-pixel group 1111. The scan line 1192 electrically connected to the sub-pixels in the sub-pixel group 1122 may be further electrically connected to the sub-pixels in the sub-pixel group 1112.

Figure 12:
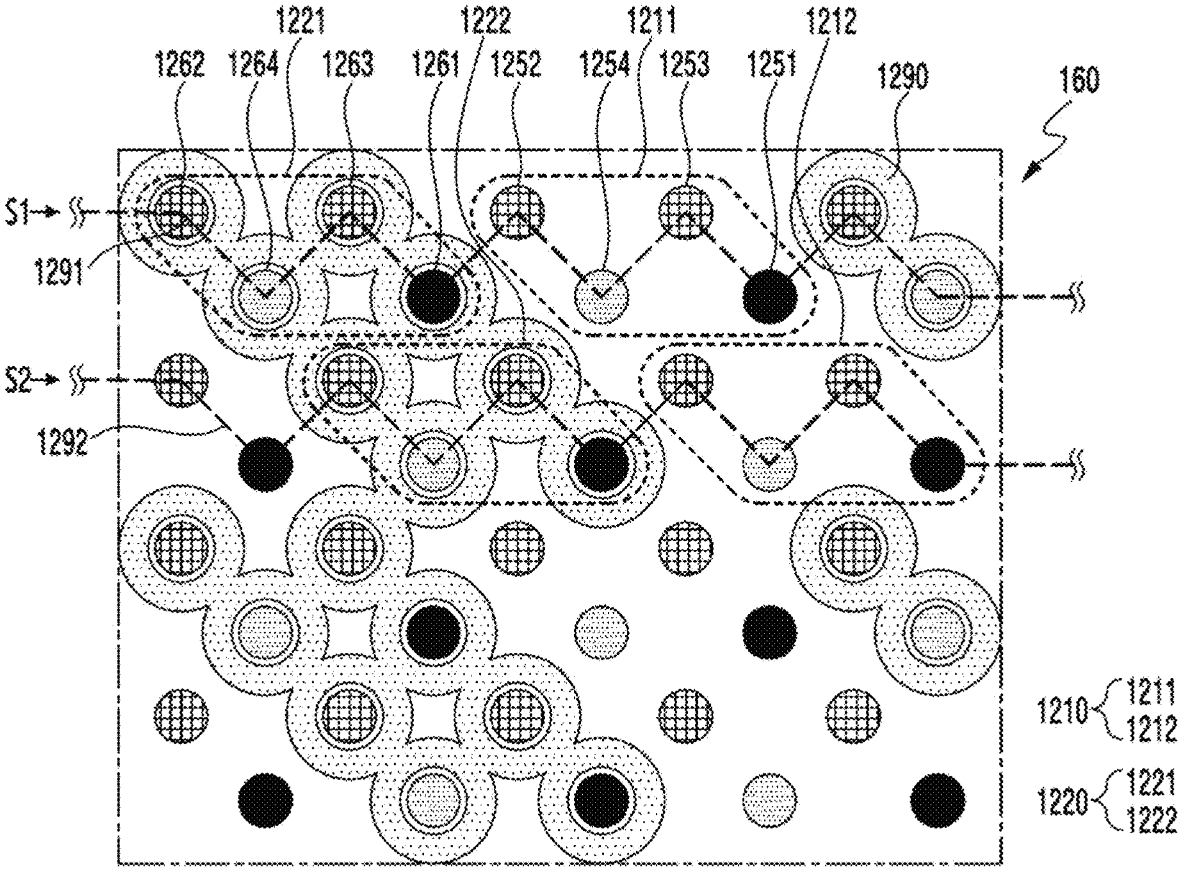
FIG. 12 illustrates an eleventh example configuration of a display panel according to an embodiment of the disclosure.

FIG. 12 illustrates an eleventh example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 12.

Referring to FIG. 12, the display panel 160 may include a plurality of pixels. Each of the pixels may include sub-pixels.

The sub-pixels may include first sub-pixel groups 1210 and second sub-pixel groups 1220. The first sub-pixel groups 1210 and the second sub-pixel groups 1220 may be included in the display panel 160 in an interleaved arrangement as illustrated in FIG. 12.

The first sub-pixel groups 1210 may include a sub-pixel group 1211 and a sub-pixel group 1212. Each of the first sub-pixel groups 1210 may include a sub-pixel 1251 configured to emit light of the first color, a sub-pixel 1252 configured to emit light of the second color, a sub-pixel 1253 configured to emit light of the second color, and a sub-pixel 1254 configured to emit light of the third color.

The second sub-pixel groups 1220 may include a sub-pixel group 1221 and a sub-pixel group 1222. Each of the second sub-pixel groups 1220 may include a sub-pixel 1261 configured to emit light of the first color, a sub-pixel 1262 configured to emit light of the second color, a sub-pixel 1263 configured to emit light of the second color, and a sub-pixel 1264 configured to emit light of the third color.

In order to support the privacy display mode, light emitted from the second sub-pixel groups 1220 may be partially blocked by an opaque member 1290, such as the opaque member in the other layer described above. For example, a viewing angle according to light emitted from the second sub-pixel groups 1220 may be narrower than a viewing angle according to light emitted from the first sub-pixel groups 1210.

Sub-pixels included in the first sub-pixel groups 1210 of the display panel 160 according to the eleventh example configuration and sub-pixels included in the second sub-pixel groups 1220 of the display panel 160 according to the eleventh example configuration may be electrically connected to source driver circuitry 223. The sub-pixels included in the first sub-pixel groups 1210 of the display panel 160 according to the eleventh example configuration and the sub-pixels included in the second sub-pixel groups 1220 of the display panel 160 according to the eleventh example configuration may be electrically connected to emission driver circuitry 224. The sub-pixels included in the first sub-pixel groups 1210 of the display panel 160 according to the eleventh example configuration and the sub-pixels included in the second sub-pixel groups 1220 of the display panel 160 according to the eleventh example configuration may be configured to be electrically connected to gate driver circuitry 222. The sub-pixels included in the first sub-pixel groups 1210 of the display panel 160 according to the eleventh example configuration and the sub-pixels included in the second sub-pixel groups 1220 of the display panel 160 according to the eleventh example configuration may be electrically connected to the gate driver circuitry 222 through scan lines (the scan lines described with reference to FIGS. 2 and 3).

Sub-pixels included in each of the second sub-pixel groups 1220 may be electrically connected to the gate driver circuitry 222 through a scan line (or a single scan line) (e.g., one of the scan lines).

For example, sub-pixels in the sub-pixel group 1221 in the second sub-pixel group 1220 may be electrically connected to the gate driver circuitry 222 through a scan line 1291. The sub-pixels may be scanned based on a signal S1 (e.g., the first signal 311, the second signal 312, the third signal 313, the fourth signal 314, or the fifth signal 315) received from the gate driver circuitry 222 through the scan line 1291.

For example, sub-pixels in the sub-pixel group 1222 in the second sub-pixel group 1220 may be electrically connected to the gate driver circuitry 222 through a scan line 1292. The sub-pixels may be scanned based on a signal S2 (e.g., the first signal 311, the second signal 312, the third signal 313, the fourth signal 314, or the fifth signal 315) received from the gate driver circuitry 222 through the scan line 1292.

Sub-pixels included in each of the first sub-pixel groups 1210 may be electrically connected to the gate driver circuitry 222 through a scan line (or a single scan line) (e.g., one of the scan lines).

For example, sub-pixels in the sub-pixel group 1211 in the first sub-pixel group 1210 may be electrically connected to the gate driver circuitry 222 through a scan line 1291. The sub-pixels may be scanned based on a signal S1 (e.g., the first signal 311, the second signal 312, the third signal 313, the fourth signal 314, or the fifth signal 315) received from the gate driver circuitry 222 through the scan line 1291.

For example, sub-pixels in the sub-pixel group 1212 in the first sub-pixel group 1210 may be electrically connected to the gate driver circuitry 222 through a scan line 1292. The sub-pixels may be scanned based on a signal S2 (e.g., the first signal 311, the second signal 312, the third signal 313, the fourth signal 314, or the fifth signal 315) received from the gate driver circuitry 222 through the scan line 1292.

The scan line 1291 electrically connected to the sub-pixels in the sub-pixel group 1221 may be further electrically connected to the sub-pixels in the sub-pixel group 1211. The scan line 1292 electrically connected to the sub-pixels in the sub-pixel group 1222 may be further electrically connected to the sub-pixels in the sub-pixel group 1212.

Since an arrangement of sub-pixels in the display panel 160 according to the eleventh example configuration is different from an arrangement of sub-pixels in the display panel 160 according to each of the above-described example configurations, a visual characteristic of a screen provided through the sub-pixels in the display panel 160 according to the eleventh example configuration may be at least partially different from a visual characteristic of a screen provided through the sub-pixels in the display panel 160 according to each of the above-described example configurations.

Figure 13:
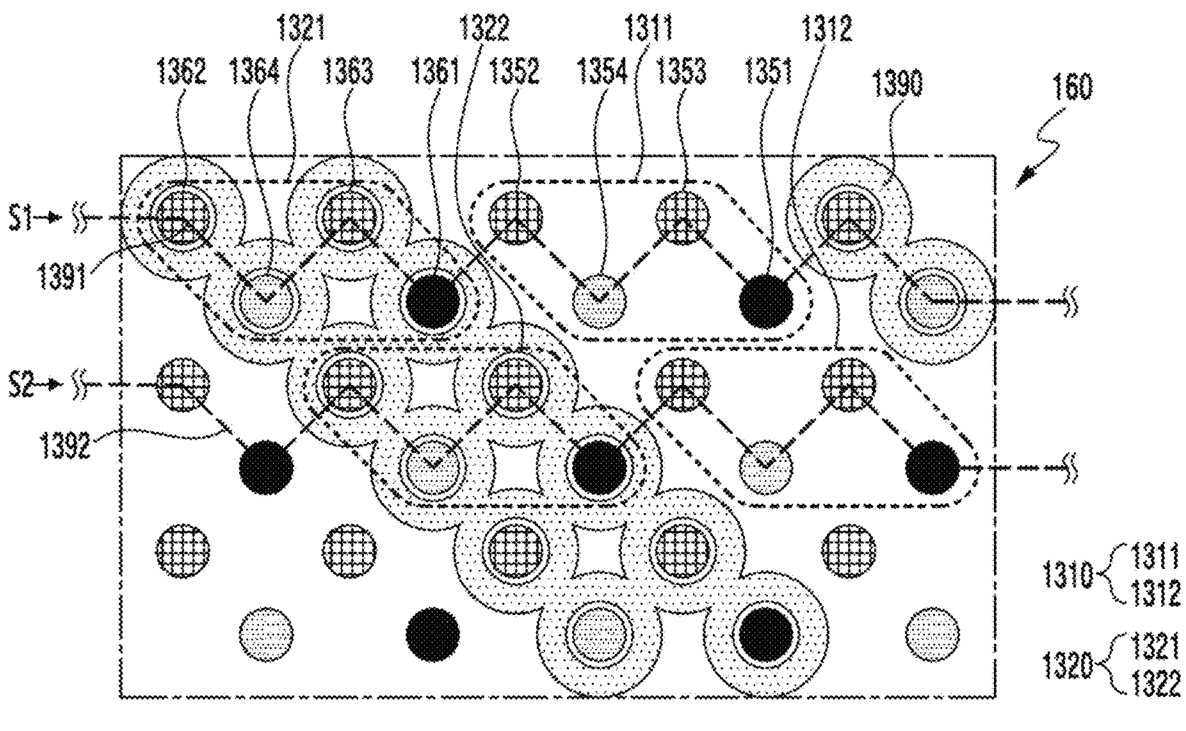
FIG. 13 illustrates a twelfth example configuration of a display panel according to an embodiment of the disclosure.

FIG. 13 illustrates a twelfth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 13.

Referring to FIG. 13, the display panel 160 may include a plurality of pixels. Each of the pixels may include sub-pixels.

The sub-pixels may include first sub-pixel groups 1310 and second sub-pixel groups 1320. The first sub-pixel groups 1310 and the second sub-pixel groups 1320 may be included in the display panel 160 in an interleaved arrangement as illustrated in FIG. 13.

The first sub-pixel groups 1310 may include a sub-pixel group 1311 and a sub-pixel group 1312. Each of the first sub-pixel groups 1310 may include a sub-pixel 1351 configured to emit light of the first color, a sub-pixel 1352 configured to emit light of the second color, a sub-pixel 1353 configured to emit light of the second color, and a sub-pixel 1354 configured to emit light of the third color.

The second sub-pixel groups 1320 may include a sub-pixel group 1321 and a sub-pixel group 1322. Each of the second sub-pixel groups 1320 may include a sub-pixel 1361 configured to emit light of the first color, a sub-pixel 1362 configured to emit light of the second color, a sub-pixel 1363 configured to emit light of the second color, and a sub-pixel 1364 configured to emit light of the third color.

In order to support the privacy display mode, light emitted from the second sub-pixel groups 1320 may be partially blocked by an opaque member 1390, such as the opaque member in the other layer described above. For example, a viewing angle according to light emitted from the second sub-pixel groups 1320 may be narrower than a viewing angle according to light emitted from the first sub-pixel groups 1310.

Sub-pixels included in the first sub-pixel groups 1310 of the display panel 160 according to the twelfth example configuration and sub-pixels included in the second sub-pixel groups 1320 of the display panel 160 according to the twelfth example configuration may be electrically connected to source driver circuitry 223. The sub-pixels included in the first sub-pixel groups 1310 of the display panel 160 according to the twelfth example configuration and the sub-pixels included in the second sub-pixel groups 1320 of the display panel 160 according to the twelfth example configuration may be electrically connected to emission driver circuitry 224. The sub-pixels included in the first sub-pixel groups 1310 of the display panel 160 according to the twelfth example configuration and the sub-pixels included in the second sub-pixel groups 1320 of the display panel 160 according to the twelfth example configuration may be configured to be electrically connected to gate driver circuitry 222. The sub-pixels included in the first sub-pixel groups 1310 of the display panel 160 according to the twelfth example configuration and the sub-pixels included in the second sub-pixel groups 1320 of the display panel 160 according to the twelfth example configuration may be electrically connected to the gate driver circuitry 222 through scan lines (the scan lines described with reference to FIGS. 2 and 3).

Sub-pixels included in each of the second sub-pixel groups 1320 may be electrically connected to the gate driver circuitry 222 through a scan line (or a single scan line) (e.g., one of the scan lines).

For example, sub-pixels in the sub-pixel group 1321 of the second sub-pixel group 1320 may be electrically connected to the gate driver circuitry 222 through a scan line 1391. The sub-pixels may be scanned based on a signal S1 (e.g., the first signal 311, the second signal 312, the third signal 313, the fourth signal 314, or the fifth signal 315) received from the gate driver circuitry 222 through the scan line 1391.

For example, sub-pixels in the sub-pixel group 1322 in the second sub-pixel group 1320 may be electrically connected to the gate driver circuitry 222 through a scan line 1392. The sub-pixels may be scanned based on a signal S2 (e.g., the first signal 311, the second signal 312, the third signal 313, the fourth signal 314, or the fifth signal 315) received from the gate driver circuitry 222 through the scan line 1392.

Sub-pixels included in each in the first sub-pixel groups 1310 may be electrically connected to the gate driver circuitry 222 through a scan line (or a single scan line) (e.g., one of the scan lines).

For example, sub-pixels in the sub-pixel group 1311 in the first sub-pixel group 1310 may be electrically connected to the gate driver circuitry 222 through a scan line 1391. The sub-pixels may be scanned based on a signal S1 (e.g., the first signal 311, the second signal 312, the third signal 313, the fourth signal 314, or the fifth signal 315) received from the gate driver circuitry 222 through the scan line 1391.

For example, sub-pixels in the sub-pixel group 1312 in the first sub-pixel group 1310 may be electrically connected to the gate driver circuitry 222 through a scan line 1392. The sub-pixels may be scanned based on a signal S2 (e.g., the first signal 311, the second signal 312, the third signal 313, the fourth signal 314, or the fifth signal 315) received from the gate driver circuitry 222 through the scan line 1392.

The scan line 1391 electrically connected to the sub-pixels in the sub-pixel group 1321 may be further electrically connected to the sub-pixels in the sub-pixel group 1311. The scan line 1392 electrically connected to the sub-pixels in the sub-pixel group 1322 may be further electrically connected to the sub-pixels in the sub-pixel group 1312.

Since an arrangement of sub-pixels in the display panel 160 according to the twelfth example configuration is different from an arrangement of sub-pixels in the display panel 160 according to each of the above-described example configurations, a visual characteristic of a screen provided through the sub-pixels in the display panel 160 according to the twelfth example configuration may be at least partially different from a visual characteristic of a screen provided through the sub-pixels in the display panel 160 according to each of the above-described example configurations.

Figure 14:
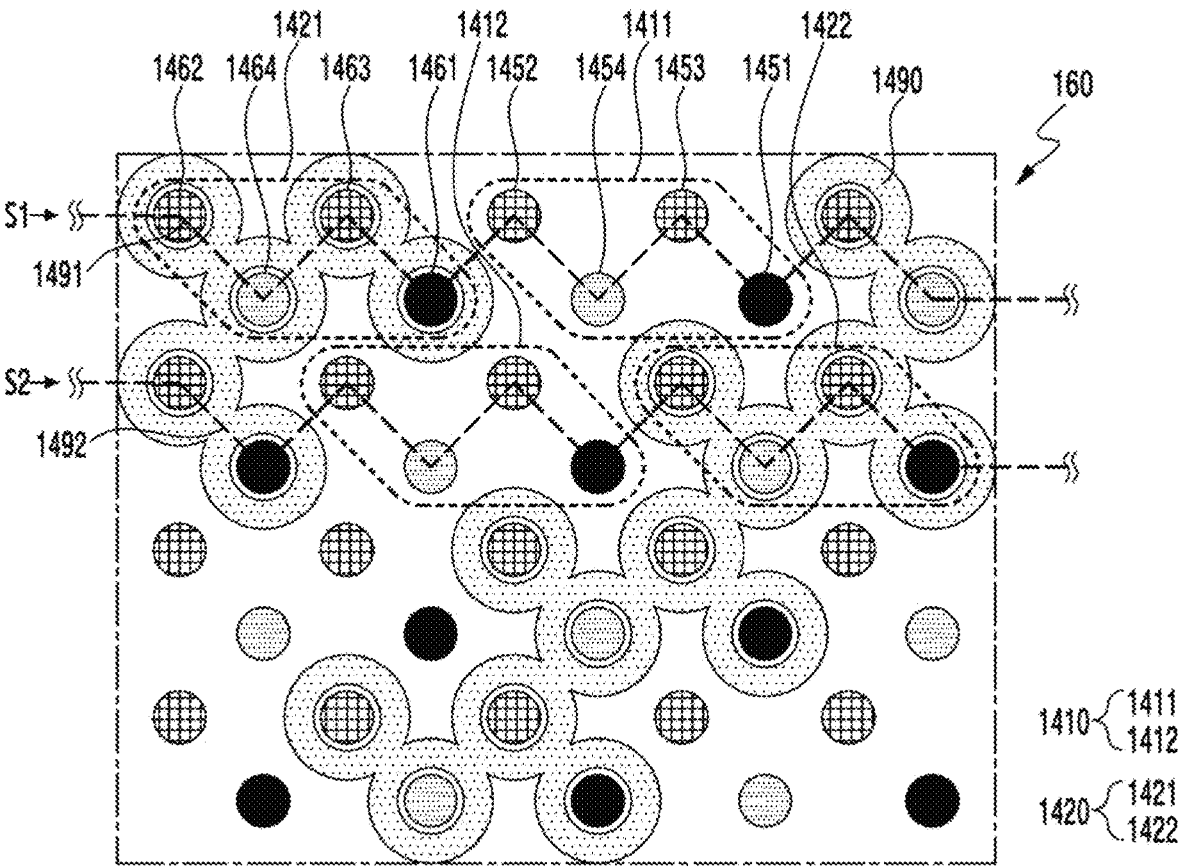
FIG. 14 illustrates a thirteenth example configuration of a display panel according to an embodiment of the disclosure.

FIG. 14 illustrates a thirteenth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 14.

Referring to FIG. 14, the display panel 160 may include a plurality of pixels. Each of the pixels may include sub-pixels.

The sub-pixels may include first sub-pixel groups 1410 and second sub-pixel groups 1420. The first sub-pixel groups 1410 and the second sub-pixel groups 1420 may be included in the display panel 160 in an interleaved arrangement as illustrated in FIG. 14.

The first sub-pixel groups 1410 may include a sub-pixel group 1411 and a sub-pixel group 1412. Each of the first sub-pixel groups 1410 may include a sub-pixel 1451 configured to emit light of the first color, a sub-pixel 1452 configured to emit light of the second color, a sub-pixel 1453 configured to emit light of the second color, and a sub-pixel 1454 configured to emit light of the third color.

The second sub-pixel groups 1420 may include a sub-pixel group 1421 and a sub-pixel group 1422. Each of the second sub-pixel groups 1420 may include a sub-pixel 1461 configured to emit light of the first color, a sub-pixel 1462 configured to emit light of the second color, a sub-pixel 1463 configured to emit light of the second color, and a sub-pixel 1464 configured to emit light of the third color.

In order to support the privacy display mode, light emitted from the second sub-pixel groups 1420 may be partially blocked by an opaque member 1490, such as the opaque member in the other layer described above. For example, a viewing angle according to light emitted from the second sub-pixel groups 1420 may be narrower than a viewing angle according to light emitted from the first sub-pixel groups 1410.

Sub-pixels included in the first sub-pixel groups 1410 of the display panel 160 according to the thirteenth example configuration and sub-pixels included in the second sub-pixel groups 1420 of the display panel 160 according to the thirteenth example configuration may be electrically connected to source driver circuitry 223. The sub-pixels included in the first sub-pixel groups 1410 of the display panel 160 according to the thirteenth example configuration and the sub-pixels included in the second sub-pixel groups 1420 of the display panel 160 according to the thirteenth example configuration may be electrically connected to emission driver circuitry 224. The sub-pixels included in the first sub-pixel groups 1410 of the display panel 160 according to the thirteenth example configuration and the sub-pixels included in the second sub-pixel groups 1420 of the display panel 160 according to the thirteenth example configuration may be configured to be electrically connected to gate driver circuitry 222. The sub-pixels included in the first sub-pixel groups 1410 of the display panel 160 according to the thirteenth example configuration and the sub-pixels included in the second sub-pixel groups 1420 of the display panel 160 according to the thirteenth example configuration may be electrically connected to the gate driver circuitry 222 through scan lines (the scan lines described with reference to FIGS. 2 and 3).

Sub-pixels included in each of the second sub-pixel groups 1420 may be electrically connected to the gate driver circuitry 222 through a scan line (or a single scan line) (e.g., one of the scan lines).

For example, sub-pixels in the sub-pixel group 1421 in the second sub-pixel group 1420 may be electrically connected to the gate driver circuitry 222 through a scan line 1491. The sub-pixels may be scanned based on a signal S1 (e.g., the first signal 311, the second signal 312, the third signal 313, the fourth signal 314, or the fifth signal 315) received from the gate driver circuitry 222 through the scan line 1491.

For example, sub-pixels in the sub-pixel group 1422 in the second sub-pixel group 1420 may be electrically connected to the gate driver circuitry 222 through a scan line 1492. The sub-pixels may be scanned based on a signal S2 (e.g., the first signal 311, the second signal 312, the third signal 313, the fourth signal 314, or the fifth signal 315) received from the gate driver circuitry 222 through the scan line 1492.

Sub-pixels included in each of the first sub-pixel groups 1410 may be electrically connected to the gate driver circuitry 222 through a scan line (or a single scan line) (e.g., one of the scan lines).

For example, sub-pixels in the sub-pixel group 1411 in the first sub-pixel group 1410 may be electrically connected to the gate driver circuitry 222 through a scan line 1491. The sub-pixels may be scanned based on a signal S1 (e.g., the first signal 311, the second signal 312, the third signal 313, the fourth signal 314, or the fifth signal 315) received from the gate driver circuitry 222 through the scan line 1491.

For example, sub-pixels in the sub-pixel group 1412 in the first sub-pixel group 1410 may be electrically connected to the gate driver circuitry 222 through a scan line 1492. The sub-pixels may be scanned based on a signal S2 (e.g., the first signal 311, the second signal 312, the third signal 313, the fourth signal 314, or the fifth signal 315) received from the gate driver circuitry 222 through the scan line 1492.

The scan line 1491 electrically connected to the sub-pixels in the sub-pixel group 1421 may be further electrically connected to the sub-pixels in the sub-pixel group 1411. The scan line 1492 electrically connected to the sub-pixels in the sub-pixel group 1422 may be further electrically connected to the sub-pixels in the sub-pixel group 1412.

Since an arrangement of sub-pixels in the display panel 160 according to the thirteenth example configuration is different from an arrangement of sub-pixels in the display panel 160 according to each of the above-described example configurations, a visual characteristic of a screen provided through the sub-pixels in the display panel 160 according to the thirteenth example configuration may be at least partially different from a visual characteristic of a screen provided through the sub-pixels in the display panel 160 according to each of the above-described example configurations.

Figure 15:
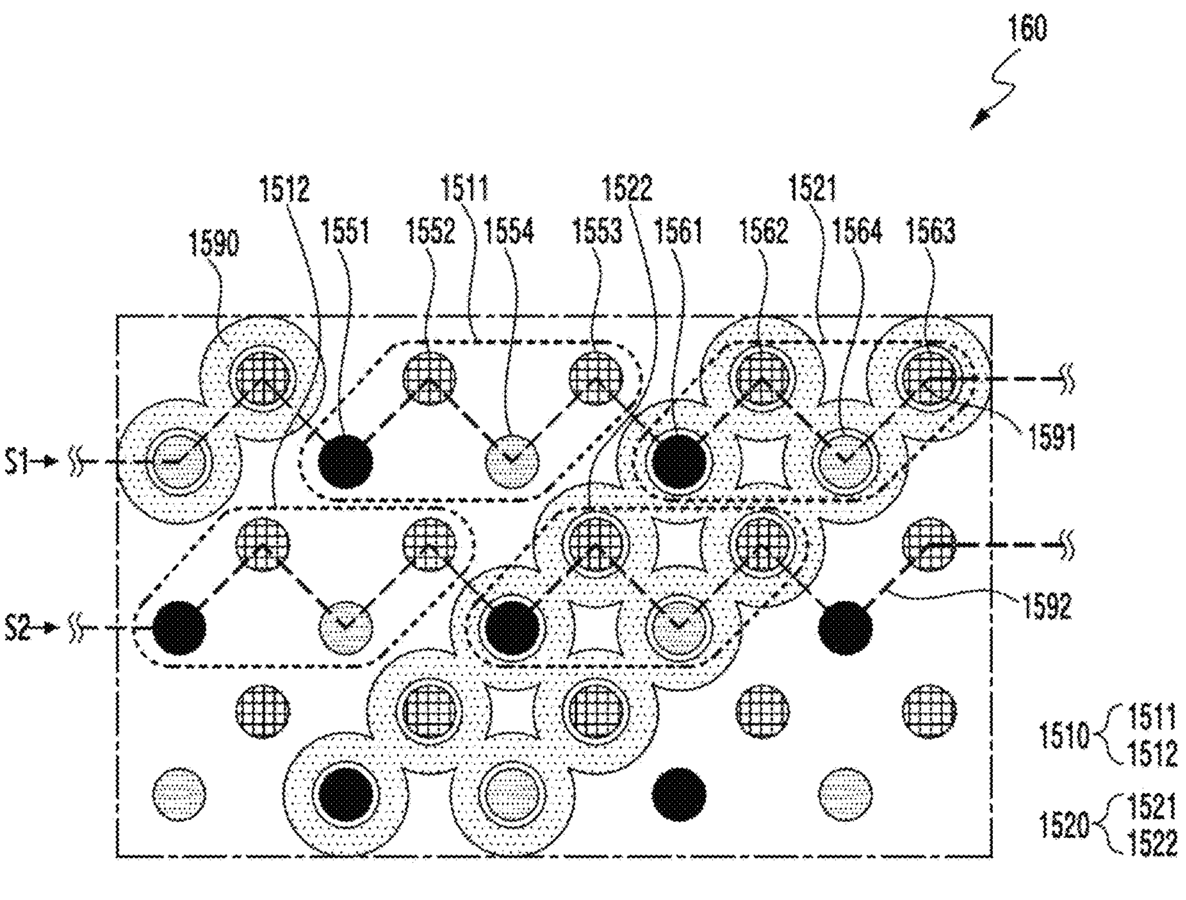
FIG. 15 illustrates a fourteenth example configuration of a display panel according to an embodiment of the disclosure.

FIG. 15 illustrates a fourteenth example configuration of a display panel according to an embodiment of the disclosure.

At least a portion of the structure of the display panel 160 and at least a portion of the operations of the display driver integrated circuitry 221 described with reference to FIGS. 1 to 6 may be applied to the display panel 160 illustrated in FIG. 15.

Referring to FIG. 15, the display panel 160 may include a plurality of pixels. Each of the pixels may include sub-pixels.

The sub-pixels may include first sub-pixel groups 1510 and second sub-pixel groups 1520. The first sub-pixel groups 1510 and the second sub-pixel groups 1520 may be included in the display panel 160 in an interleaved arrangement as illustrated in FIG. 15.

The first sub-pixel groups 1510 may include a sub-pixel group 1511 and a sub-pixel group 1512. Each of the first sub-pixel groups 1510 may include a sub-pixel 1551 configured to emit light of the first color, a sub-pixel 1552 configured to emit light of the second color, a sub-pixel 1553 configured to emit light of the second color, and a sub-pixel 1554 configured to emit light of the third color.

The second sub-pixel groups 1520 may include a sub-pixel group 1521 and a sub-pixel group 1522. Each of the second sub-pixel groups 1520 may include a sub-pixel 1561 configured to emit light of the first color, a sub-pixel 1562 configured to emit light of the second color, a sub-pixel 1563 configured to emit light of the second color, and a sub-pixel 1564 configured to emit light of the third color.

In order to support the privacy display mode, light emitted from the second sub-pixel groups 1520 may be partially blocked by an opaque member 1590, such as the opaque member in the other layer described above. For example, a viewing angle according to light emitted from the second sub-pixel groups 1520 may be narrower than a viewing angle according to light emitted from the first sub-pixel groups 1510.

Sub-pixels included in the first sub-pixel groups 1510 of the display panel 160 according to the fourteenth example configuration and sub-pixels included in the second sub-pixel groups 1520 of the display panel 160 according to the fourteenth example configuration may be electrically connected to source driver circuitry 223. The sub-pixels included in the first sub-pixel groups 1510 of the display panel 160 according to the fourteenth example configuration and the sub-pixels included in the second sub-pixel groups 1520 of the display panel 160 according to the fourteenth example configuration may be electrically connected to emission driver circuitry 224. The sub-pixels included in the first sub-pixel groups 1510 of the display panel 160 according to the fourteenth example configuration and the sub-pixels included in the second sub-pixel groups 1520 of the display panel 160 according to the fourteenth example configuration may be configured to be electrically connected to gate driver circuitry 222. The sub-pixels included in the first sub-pixel groups 1510 of the display panel 160 according to the fourteenth example configuration and the sub-pixels included in the second sub-pixel groups 1520 of the display panel 160 according to the fourteenth example configuration may be electrically connected to the gate driver circuitry 222 through scan lines (the scan lines described with reference to FIGS. 2 and 3).

Sub-pixels included in each of the second sub-pixel groups 1520 may be electrically connected to the gate driver circuitry 222 through a scan line (or a single scan line) (e.g., one of the scan lines).

For example, sub-pixels in the sub-pixel group 1521 in the second sub-pixel group 1520 may be electrically connected to the gate driver circuitry 222 through a scan line 1591. The sub-pixels may be scanned based on a signal S1 (e.g., the first signal 311, the second signal 312, the third signal 313, the fourth signal 314, or the fifth signal 315) received from the gate driver circuitry 222 through the scan line 1591.

For example, sub-pixels in the sub-pixel group 1522 in the second sub-pixel group 1520 may be electrically connected to the gate driver circuitry 222 through a scan line 1592. The sub-pixels may be scanned based on a signal S2 (e.g., the first signal 311, the second signal 312, the third signal 313, the fourth signal 314, or the fifth signal 315) received from the gate driver circuitry 222 through the scan line 1592.

Sub-pixels included in each of the first sub-pixel groups 1510 may be electrically connected to the gate driver circuitry 222 through a scan line (or a single scan line) (e.g., one of the scan lines).

For example, sub-pixels in the sub-pixel group 1511 in the first sub-pixel group 1510 may be electrically connected to the gate driver circuitry 222 through a scan line 1591. The sub-pixels may be scanned based on a signal S1 (e.g., the first signal 311, the second signal 312, the third signal 313, the fourth signal 314, or the fifth signal 315) received from the gate driver circuitry 222 through the scan line 1591.

For example, sub-pixels in the sub-pixel group 1512 in the first sub-pixel group 1510 may be electrically connected to the gate driver circuitry 222 through a scan line 1592. The sub-pixels may be scanned based on a signal S2 (e.g., the first signal 311, the second signal 312, the third signal 313, the fourth signal 314, or the fifth signal 315) received from the gate driver circuitry 222 through the scan line 1592.

The scan line 1591 electrically connected to the sub-pixels in the sub-pixel group 1521 may be further electrically connected to the sub-pixels in the sub-pixel group 1511. The scan line 1492 electrically connected to the sub-pixels in the sub-pixel group 1522 may be further electrically connected to the sub-pixels in the sub-pixel group 1512.

Since an arrangement of sub-pixels in the display panel 160 according to the fourteenth example configuration is different from an arrangement of sub-pixels in the display panel 160 according to each of the above-described example configurations, a visual characteristic of a screen provided through the sub-pixels in the display panel 160 according to the fourteenth example configuration may be at least partially different from a visual characteristic of a screen provided through the sub-pixels in the display panel 160 according to each of the above-described example configurations.

According to the structure illustrated in FIGS. 4, 5, 7A, 7B, 9, 10A, 10B, 10C, 10D, 11, 12, 13, 14, and 15, an FOI of light emitted from sub-pixels may be tapered to a narrower FOI at a center portion of a display area of the display panel 160 from a wider FOI at a peripheral portion of the display area of the display panel 160. As a non-limiting example, the tapering of the FOI may be applied to a portion of sub-pixels of the display panel 160. For example, the tapering of the FOI may be applied to a portion of sub-pixels (e.g., wide sub-pixels) used to emit light having a wider FOI. For example, the tapering of the FOI may be applied to a portion of sub-pixels (e.g., narrow sub-pixels) used to emit light having a narrower FOI.

The display panel 160 may be configured to provide or support a plurality of privacy display modes. For example, the display panel 160 may be configured to operate according to a privacy display mode among the plurality of privacy display modes. A privacy display mode provided or supported by the display panel 160 may be identified from among the plurality of privacy display modes. The privacy display mode provided or supported by the display panel 160 may be identified based on a state of the electronic device 100 identified by the electronic device 100, a situation of the electronic device 100 identified by the electronic device 100, a state of an environment around the electronic device 100 identified by the electronic device 100, and/or a situation of an environment around the electronic device 100 identified by the electronic device 100. As a non-limiting example, the plurality of privacy display modes may include a first privacy display mode providing a first viewing angle. The plurality of privacy display modes may include a second privacy display mode providing a second viewing angle wider than the first viewing angle. The plurality of privacy display modes may further include a third privacy display mode providing a third viewing angle wider than the second viewing angle. The first viewing angle, the second viewing angle, and the third viewing angle may be narrower than a viewing angle provided according to a normal display mode.

The display panel 160 may include a structure for supporting the plurality of privacy display modes. The structure is described with reference to FIGS. 16 to 20.

Figure 16:
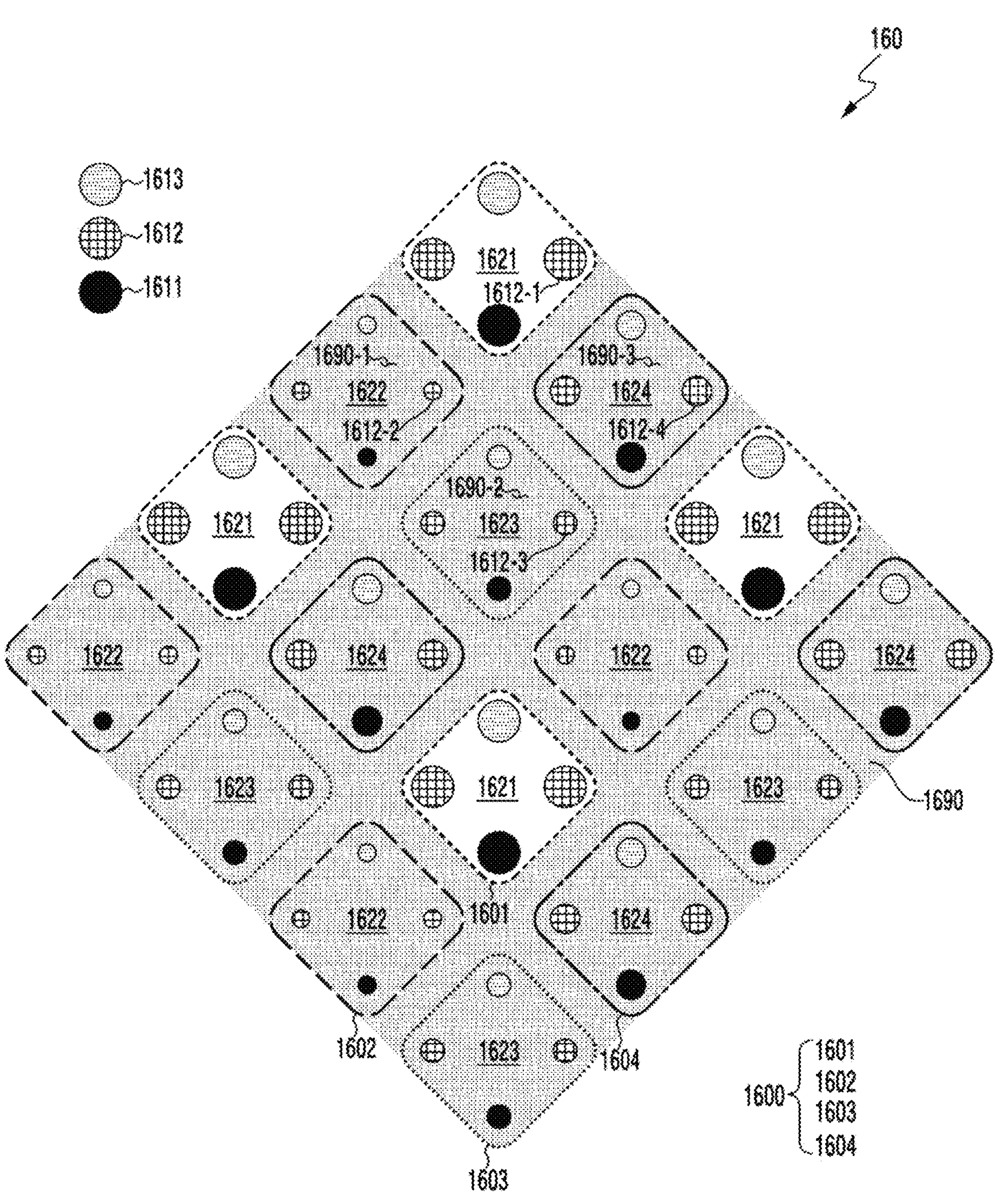
FIG. 16 illustrates a fifteenth example configuration of a display panel according to an embodiment of the disclosure.

FIG. 16 illustrates a fifteenth example configuration of a display panel according to an embodiment of the disclosure.

Referring to FIG. 16, the display panel 160 may include a plurality of sub-pixels. The sub-pixels may be classified into a plurality of sub-pixel groups 1600. For example, a first portion of the sub-pixels may be included in first sub-pixel groups 1601 among the plurality of sub-pixel groups 1600, a second portion of the sub-pixels may be included in second sub-pixel groups 1602 among the plurality of sub-pixel groups 1600, a third portion of the sub-pixels may be included in third sub-pixel groups 1603 among the plurality of sub-pixel groups 1600, and a fourth portion of the sub-pixels may be included in fourth sub-pixel groups 1604 among the plurality of sub-pixel groups 1600.

Each of the plurality of sub-pixel groups 1600 may include a first sub-pixel 1611 configured to emit light having the first color, a second sub-pixel 1612 configured to emit light having the second color, and a third sub-pixel 1613 configured to emit light having the third color. For example, each of the first sub-pixel groups 1601 may include the first sub-pixel 1611, the second sub-pixel 1612, and the third sub-pixel 1613. For example, each of the second sub-pixel groups 1602 may include the first sub-pixel 1611, the second sub-pixel 1612, and the third sub-pixel 1613. For example, each of the third sub-pixel groups 1603 may include the first sub-pixel 1611, the second sub-pixel 1612, and the third sub-pixel 1613. For example, each of the fourth sub-pixel groups 1604 may include the first sub-pixel 1611, the second sub-pixel 1612, and the third sub-pixel 1613.

The first sub-pixel groups 1601, the second sub-pixel groups 1602, the third sub-pixel groups 1603, and the fourth sub-pixel groups 1604 may alternate with each other as illustrated in FIG. 16. However, it is not limited thereto.

In order to support the plurality of privacy display modes and the normal display mode, a first FOI of light emitted from the first sub-pixel groups 1601, a second FOI of light emitted from the second sub-pixel groups 1602, a third FOI of light emitted from the third sub-pixel groups 1603, and a fourth FOI of light emitted from the fourth sub-pixel groups 1604 may be different from each other. The display panel 160 may include a first light transmittance portion 1621 disposed above the first sub-pixel groups 1601 and aligned with (or overlapped with) the first sub-pixel groups 1601, a second light transmittance portion 1622 disposed above the second sub-pixel groups 1602 and aligned with (or overlapped with) the second sub-pixel groups 1602, a third light transmittance portion 1623 disposed above the third sub-pixel groups 1603 and aligned with (or overlapped with) the third sub-pixel groups 1603, and a fourth light transmittance portion 1624 disposed above the fourth sub-pixel groups 1604 and aligned with (or overlapped with) the fourth sub-pixel groups 1604. The second light transmittance portion 1622 may include a first portion 1690-1 of an opaque member 1690 (or a black matrix 1690) described with reference to FIG. 17, the third light transmittance portion 1623 may include a second portion 1690-2 of the opaque member 1690, and the fourth light transmittance portion 1624 may include a third portion 1690-3 of the opaque member 1690. Since a width (or a size) of the first portion 1690-1 of the opaque member 1690 included in the second light transmittance portion 1622 is larger (or greater) than a width (or a size) of the second portion 1690-2 of the opaque member 1690 included in the third light transmittance portion 1623, the second FOI may be narrower than the third FOI. Since a width (or a size) of the second portion 1690-2 of the opaque member 1690 included in the third light transmittance portion 1623 is larger (or greater) than a width (or a size) of the third portion 1690-3 of the opaque member 1690 included in the fourth light transmittance portion 1624, the third FOI may be narrower than the fourth FOI.

As a non-limiting example, since the first light transmittance portion 1621 does not include the opaque member 1690 or includes a portion of the opaque member 1690 narrower than a width (or a size) of the third portion 1690-3 of the opaque member 1690, the first FOI may be wider than the fourth FOI.

The opaque member 1690 is described in more detail with reference to FIG. 17.

Figure 17:
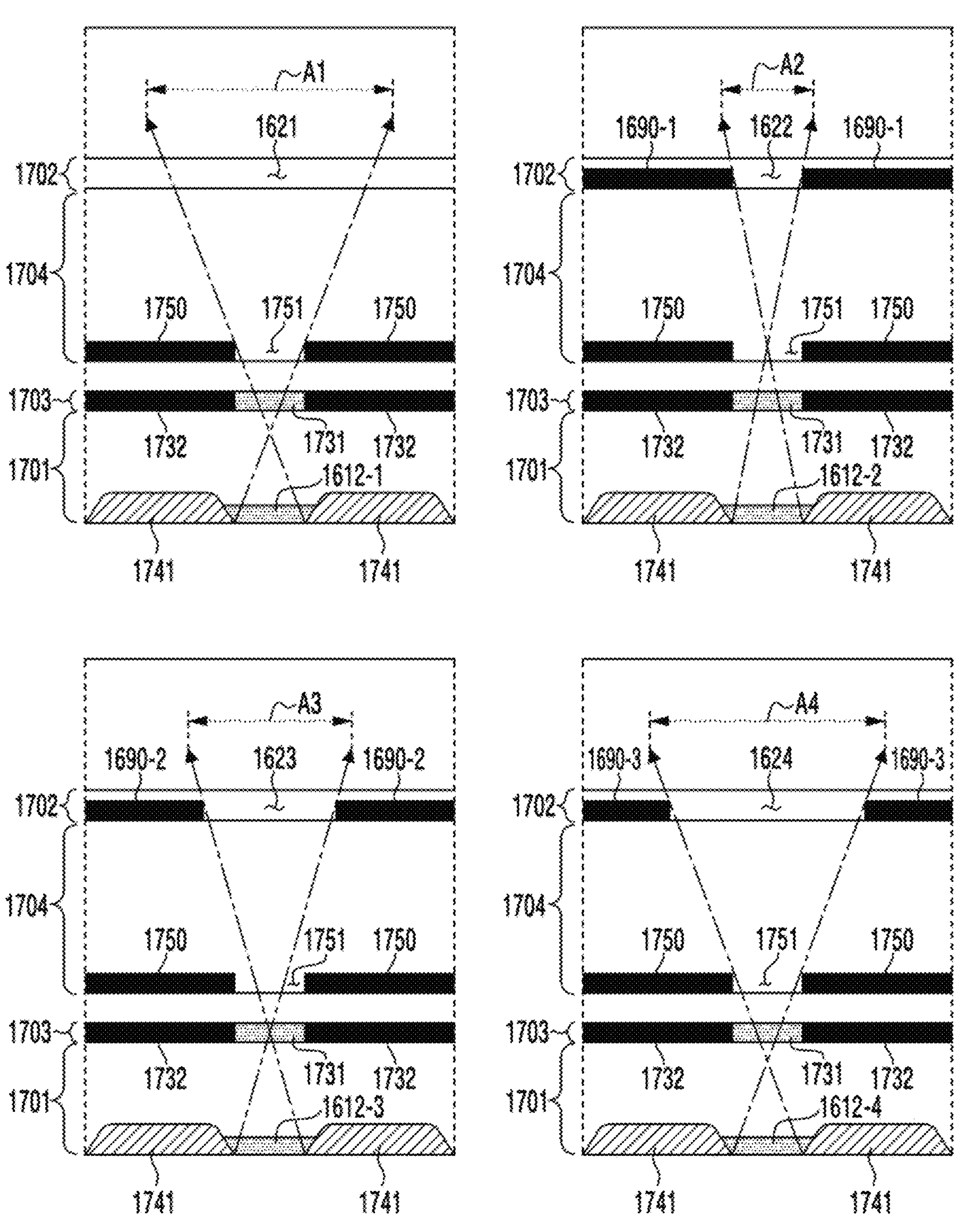
FIG. 17 is a cross-sectional view of a display panel according to a fifteenth example configuration according to an embodiment of the disclosure.

FIG. 17 is a cross-sectional view of a display panel according to a fifteenth example configuration according to an embodiment of the disclosure.

Referring to FIG. 17, a display panel 160 may include a first layer 1701 and a second layer 1702. The first layer 1701 may include the sub-pixels and a PDL 1741 defining a periphery of each of the sub-pixels. The second layer 1702 may be disposed above the first layer 1701. The second layer 1702 may include light transmittance portions defined by the opaque member 1690. The display panel 160 may include one or more layers disposed between the first layer 1701 and the second layer 1702. For example, the one or more layers may include a third layer 1703, which is disposed between the first layer 1701 and the second layer 1702 and includes a filter portion 1731 aligned with the sub-pixels and an opaque member 1732 defining a periphery of the filter portion 1731. The filter portion 1731 may be configured to pass a color corresponding to light emitted from the sub-pixels. The opaque member 1732 may be configured to block or reduce light. For example, the one or more layers may include a fourth layer 1704 disposed between the second layer 1702 and the third layer 1703. The fourth layer 1704 may be included in the display panel 160 to define or compensate for a thickness of the display panel 160. The fourth layer 1704 may include an opaque member 1750 for reducing light from a sub-pixel from being transmitted through a light transmittance portion disposed on an adjacent sub-pixel. The opaque member 1750 may define a path of light emitted from a sub-pixel.

The first layer 1701 may include a sub-pixel 1612-1 included in a sub-pixel group among the first sub-pixel groups 1601. The second layer 1702 may include a first light transmittance portion 1621 aligned with the sub-pixel group including the sub-pixel 1612-1. The third layer 1703 may include a filter portion 1731 aligned with the sub-pixel 1612-1 and an opaque member 1732 surrounding the filter portion 1731. The fourth layer 1704 may include an opaque member 1750 and a light transmittance portion 1751 (or a light path portion 1751) defined by the opaque member 1750. The light transmittance portion 1751 may be aligned with the sub-pixel 1612-1. Light from the sub-pixel 1612-1 may be emitted to a space in front of the display panel 160 through the filter portion 1731 aligned with the sub-pixel 1612-1, the light transmittance portion 1751 aligned with the sub-pixel 1612-1, and the first light transmittance portion 1621. The first FOI of light emitted from the sub-pixel 1612-1 through the filter portion 1731 aligned with the sub-pixel 1612-1, the light transmittance portion 1751 aligned with the sub-pixel 1612-1, and the first light transmittance portion 1621 may be represented as A1.

The first layer 1701 may include a sub-pixel 1612-2 included in a sub-pixel group among the second sub-pixel groups 1602. The second layer 1702 may include a second light transmittance portion 1622 aligned with the sub-pixel group including the sub-pixel 1612-2. The second light transmittance portion 1622 may include a first portion 1690-1 of the opaque member 1690. The third layer 1703 may include a filter portion 1731 aligned with the sub-pixel 1612-2 and an opaque member 1732 surrounding the filter portion 1731. The fourth layer 1704 may include an opaque member 1750 and a light transmittance portion 1751 (or a light path portion 1751) defined by the opaque member 1750. The light transmittance portion 1751 may be aligned with the sub-pixel 1612-2. Light from the sub-pixel 1612-2 may be emitted to a space in front of the display panel 160 through the filter portion 1731 aligned with the sub-pixel 1612-2, the light transmittance portion 1751 aligned with the sub-pixel 1612-2, and the second light transmittance portion 1622. The second FOI of light emitted from the sub-pixel 1612-2 through the filter portion 1731 aligned with the sub-pixel 1612-2, the light transmittance portion 1751 aligned with the sub-pixel 1612-2, and the second light transmittance portion 1622 may be represented as A2.

Since the second light transmittance portion 1622 includes the first portion 1690-1 of the opaque member 1690 and the first light transmittance portion 1621 does not include the opaque member 1690, A2 may be smaller than A1. Since a size of the first portion 1690-1 of the opaque member 1690 included in the second light transmittance portion 1622 is larger than a size of a portion of the opaque member 1690 included in the first light transmittance portion 1621, A2 may be smaller than A1.

The first layer 1701 may include a sub-pixel 1612-3 included in a sub-pixel group among the third sub-pixel groups 1603. The second layer 1702 may include a third light transmittance portion 1623 aligned with the sub-pixel group including the sub-pixel 1612-3. The third light transmittance portion 1623 may include a second portion 1690-2 of the opaque member 1690. The third layer 1703 may include a filter portion 1731 aligned with the sub-pixel 1612-3 and an opaque member 1732 surrounding the filter portion 1731. The fourth layer 1704 may include an opaque member 1750 and a light transmittance portion 1751 (or a light path portion 1751) defined by the opaque member 1750. The light transmittance portion 1751 may be aligned with the sub-pixel 1612-3. Light from the sub-pixel 1612-3 may be emitted to a space in front of the display panel 160 through the filter portion 1731 aligned with the sub-pixel 1612-3, the light transmittance portion 1751 aligned with the sub-pixel 1612-3, and the third light transmittance portion 1623. The third FOI of light emitted from the sub-pixel 1612-3 through the filter portion 1731 aligned with the sub-pixel 1612-3, the light transmittance portion 1751 aligned with the sub-pixel 1612-3, and the third light transmittance portion 1623 may be represented as A3.

Since the third light transmittance portion 1623 includes the second portion 1690-2 of the opaque member 1690 and the first light transmittance portion 1621 does not include the opaque member 1690, A3 may be smaller than A1. Since a size of the second portion 1690-2 of the opaque member 1690 included in the third light transmittance portion 1623 is larger than a size of a portion of the opaque member 1690 included in the first light transmittance portion 1621, A3 may be smaller than A1.

Since a size of the second portion 1690-2 of the opaque member 1690 included in the third light transmittance portion 1623 is smaller than a size of the first portion 1690-1 of the opaque member 1690 included in the second light transmittance portion 1622, A3 may be larger than A2.

The first layer 1701 may include a sub-pixel 1612-4 included in a sub-pixel group among the fourth sub-pixel groups 1604. The second layer 1702 may include a fourth light transmittance portion 1624 aligned with the sub-pixel group including the sub-pixel 1612-4. The fourth light transmittance portion 1624 may include a third portion 1690-3 of the opaque member 1690. The third layer 1703 may include a filter portion 1731 aligned with the sub-pixel 1612-4, and an opaque member 1732 surrounding the filter portion 1731. The fourth layer 1704 may include an opaque member 1750 and a light transmittance portion 1751 (or a light path portion 1751) defined by the opaque member 1750. The light transmittance portion 1751 may be aligned with the sub-pixel 1612-4. Light from the sub-pixel 1612-4 may be emitted into a space in front of the display panel 160 through the filter portion 1731 aligned with the sub-pixel 1612-4, the light transmittance portion 1751 aligned with the sub-pixel 1612-4, and the fourth light transmittance portion 1624. The fourth FOI of light emitted from the sub-pixel 1612-4 through the filter portion 1731 aligned with the sub-pixel 1612-4, the light transmittance portion 1751 aligned with the sub-pixel 1612-4, and the fourth light transmittance portion 1624 may be represented as A4.

Since the fourth light transmittance portion 1624 includes the third portion 1690-3 of the opaque member 1690 and the first light transmittance portion 1621 does not include the opaque member 1690, A4 may be smaller than A1. Since a size of the third portion 1690-3 of the opaque member 1690 included in the fourth light transmittance portion 1624 is larger than a size of a portion of the opaque member 1690 included in the first light transmittance portion 1621, A4 may be smaller than A1.

Since a size of the third portion 1690-3 of the opaque member 1690 included in the fourth light transmittance portion 1624 is smaller than a size of the second portion 1690-2 of the opaque member 1690 included in the third light transmittance portion 1623, A4 may be larger than A3.

Referring back to FIG. 16, as a non-limiting example, display driver integrated circuitry 221 may control the display panel 160 to emit light from the first sub-pixel groups 1601, the second sub-pixel groups 1602, the third sub-pixel groups 1603, and the fourth sub-pixel groups 1604 when providing the normal display mode. The display driver integrated circuitry 221 may control the display panel 160 to emit light from the second sub-pixel groups 1602 among the first sub-pixel groups 1601, the second sub-pixel groups 1602, the third sub-pixel groups 1603, and the fourth sub-pixel groups 1604 when providing the first privacy display mode. In the first privacy display mode, emission of light from the first sub-pixel groups 1601, the third sub-pixel groups 1603, and the fourth sub-pixel groups 1604 may be restricted. The display driver integrated circuitry 221 may control the display panel 160 to emit light from the second sub-pixel groups 1602 and the third sub-pixel groups 1603 among the first sub-pixel groups 1601, the second sub-pixel groups 1602, the third sub-pixel groups 1603, and the fourth sub-pixel groups 1604 when providing the second privacy display mode. In the second privacy display mode, emission of light from the first sub-pixel groups 1601 and the fourth sub-pixel groups 1604 may be restricted. The display driver integrated circuitry 221 may control the display panel 160 to emit light from the second sub-pixel groups 1602, the third sub-pixel groups 1603, and the fourth sub-pixel groups 1604 among the first sub-pixel groups 1601, the second sub-pixel groups 1602, the third sub-pixel groups 1603, and the fourth sub-pixel groups 1604 when providing the third privacy display mode. In the third privacy display mode, emission of light from the first sub-pixel groups 1601 may be restricted. However, it is not limited thereto.

FIG. 16 illustrates that an arrangement and a configuration of sub-pixels in the first sub-pixel groups 1601, an arrangement and a configuration of sub-pixels in the second sub-pixel groups 1602, an arrangement and a configuration in the third sub-pixel groups 1603, and an arrangement and a configuration in the fourth sub-pixel groups 1604 are the same as each other, but this is only one embodiment. The arrangement and the configuration of sub-pixels in the second sub-pixel groups 1602, the arrangement and the configuration in the third sub-pixel groups 1603, and/or the arrangement and the configuration in the fourth sub-pixel groups 1604 may be different from the arrangement and the configuration of sub-pixels in the first sub-pixel groups 1601. For example, the arrangement and the configuration of sub-pixels in the second sub-pixel groups 1602, the arrangement and the configuration in the third sub-pixel groups 1603, and/or the arrangement and the configuration in the fourth sub-pixel groups 1604 may be different from the illustration in FIG. 16. For example, an arrangement and the number of sub-pixels included in each of the second sub-pixel groups 1602 may be different from an arrangement and the number of sub-pixels included in each of the first sub-pixel groups 1601. For example, each of the second sub-pixel groups 1602 may include one second sub-pixel 1611, unlike each of the first sub-pixel groups 1601 including two second sub-pixels 1612. For example, an arrangement and the number of sub-pixels included in each of the third sub-pixel groups 1603 may be different from an arrangement and the number of sub-pixels included in each of the first sub-pixel groups 1601. For example, each of the third sub-pixel groups 1603 may include one second sub-pixel 1611, unlike each of the first sub-pixel groups 1601 including two second sub-pixels 1612. For example, an arrangement and the number of sub-pixels included in each of the fourth sub-pixel groups 1604 may be different from an arrangement and the number of sub-pixels included in each of the first sub-pixel groups 1601. For example, each of the fourth sub-pixel groups 1604 may include one second sub-pixel 1611, unlike each of the first sub-pixel groups 1601 including two second sub-pixels 1612.

The display panel 160 according to the fifteenth example configuration described with reference to FIG. 16 has a structure in which an FOI of light varies according to a sub-pixel group, but this is only one embodiment. The display panel 160 may have a structure in which an FOI of light varies according to a sub-pixel included in a sub-pixel group. This structure is described with reference to FIG. 18.

Figure 18:
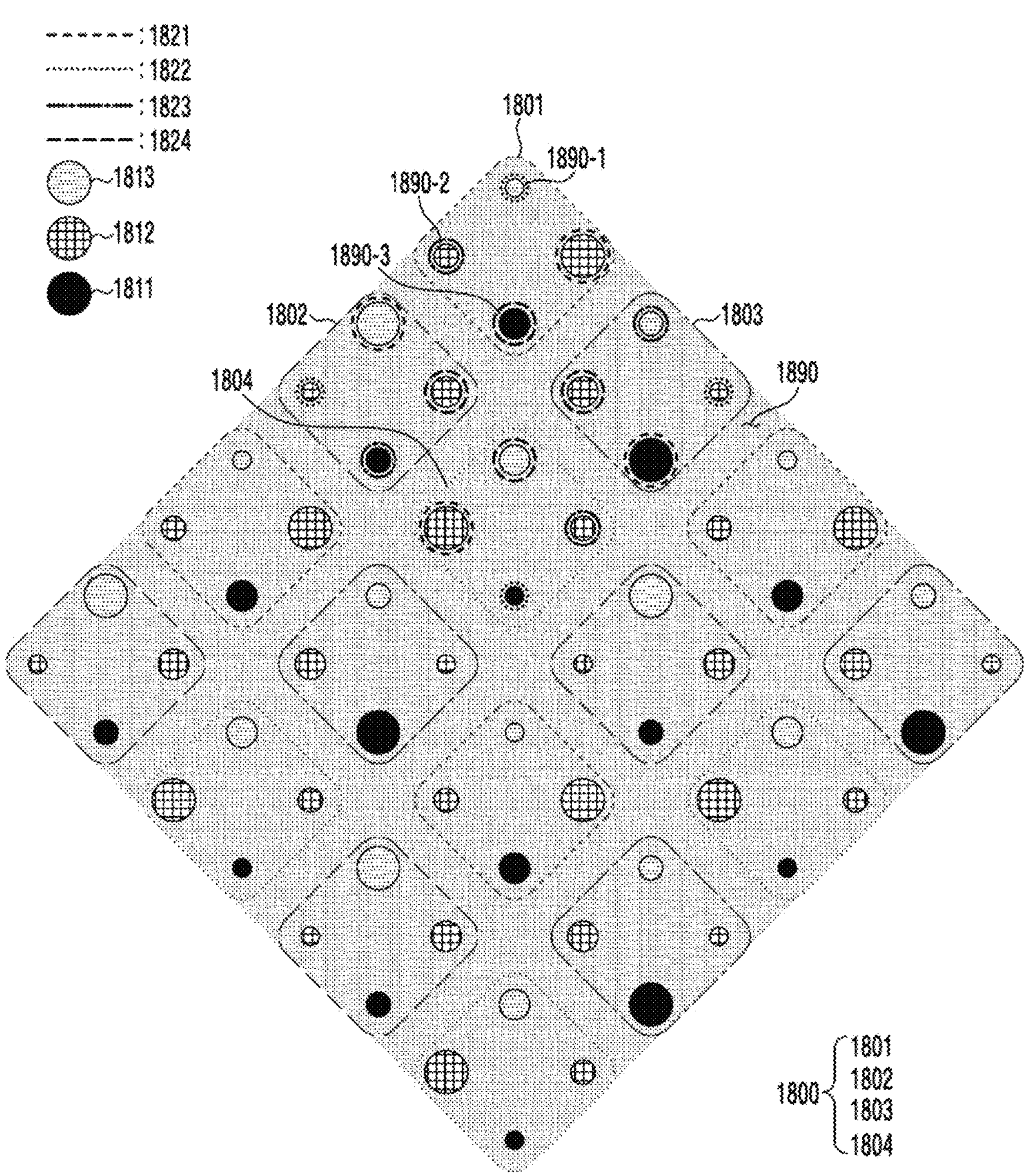
FIG. 18 illustrates a sixteenth example configuration of a display panel according to an embodiment of the disclosure.

FIG. 18 illustrates a sixteenth example configuration of a display panel according to an embodiment of the disclosure.

Referring to FIG. 18, the display panel 160 may include a plurality of sub-pixels. The sub-pixels may be classified into a plurality of sub-pixel groups 1800. For example, a first portion of the sub-pixels may be included in first sub-pixel groups 1801 among the plurality of sub-pixel groups 1800, a second portion of the sub-pixels may be included in second sub-pixel groups 1802 among the plurality of sub-pixel groups 1800, a third portion of the sub-pixels may be included in third sub-pixel groups 1803 among the plurality of sub-pixel groups 1800, and a fourth portion of the sub-pixels may be included in fourth sub-pixel groups 1804 among the plurality of sub-pixel groups 1800.

Each of the plurality of sub-pixel groups 1800 may include a first sub-pixel 1811 configured to emit light having the first color, a second sub-pixel 1812 configured to emit light having the second color, and a third sub-pixel 1813 configured to emit light having the third color. For example, each of the first sub-pixel groups 1801 may include the first sub-pixel 1811, the second sub-pixel 1812, and the third sub-pixel 1813. For example, each of the second sub-pixel groups 1802 may include the first sub-pixel 1811, the second sub-pixel 1812, and the third sub-pixel 1813. For example, each of the third sub-pixel groups 1803 may include the first sub-pixel 1811, the second sub-pixel 1812, and the third sub-pixel 1813. For example, each of the fourth sub-pixel groups 1804 may include the first sub-pixel 1811, the second sub-pixel 1812, and the third sub-pixel 1813.

The first sub-pixel groups 1801, the second sub-pixel groups 1802, the third sub-pixel groups 1803, and the fourth sub-pixel groups 1804 may alternate with each other, as illustrated in FIG. 18. However, it is not limited thereto.

In order to support the plurality of privacy display modes and the normal display mode, the display panel 160 may include a first light transmittance portion 1821 disposed above the second sub-pixel 1812 included in each of the first sub-pixel groups 1801 and aligned with the second sub-pixel 1812 included in each of the first sub-pixel groups 1801, a second light transmittance portion 1822 disposed above the third sub-pixel 1813 included in each of the first sub-pixel groups 1801 and aligned with the third sub-pixel 1813 included in each of the first sub-pixel groups 1801, a third light transmittance portion 1823 disposed above the second sub-pixel 1812 included in each of the first sub-pixel groups 1801 and aligned with the second sub-pixel 1812 included in each of the first sub-pixel groups 1801, and a fourth light transmittance portion 1824 disposed above the first sub-pixel 1811 included in each of the first sub-pixel groups 1801 and aligned with the first sub-pixel 1811 included in each of the first sub-pixel groups 1801.

In order to support the plurality of privacy display modes and the normal display mode, the display panel 160 may include a first light transmittance portion 1821 disposed above the third sub-pixel 1813 included in each of the second sub-pixel groups 1802 and aligned with the third sub-pixel 1813 included in each of the second sub-pixel groups 1802, a second light transmittance portion 1822 disposed above the second sub-pixel 1812 included in each of the second sub-pixel groups 1802 and aligned with the second sub-pixel 1812 included in each of the second sub-pixel groups 1802, a third light transmittance portion 1823 disposed above the first sub-pixel 1811 included in each of the second sub-pixel groups 1802 and aligned with the first sub-pixel 1811 included in each of the second sub-pixel groups 1802, and a fourth light transmittance portion 1824 disposed above the second sub-pixel 1812 included in each of the second sub-pixel groups 1802 and aligned with the second sub-pixel 1812 included in each of the second sub-pixel groups 1802.

In order to support the plurality of privacy display modes and the normal display mode, the display panel 160 may include a first light transmittance portion 1821 disposed above the first sub-pixel 1811 included in each of the third sub-pixel groups 1803 and aligned with the first sub-pixel 1811 included in each of the third sub-pixel groups 1803, a second light transmittance portion 1822 disposed above the second sub-pixel 1812 included in each of the third sub-pixel groups 1803 and aligned with the second sub-pixel 1812 included in each of the third sub-pixel groups 1803, a third light transmittance portion 1823 disposed above the third sub-pixel 1813 included in each of the third sub-pixel groups 1803 and aligned with the third sub-pixel 1813 included in each of the third sub-pixel groups 1803, and a fourth light transmittance portion 1824 disposed above the second sub-pixel 1812 included in each of the third sub-pixel groups 1803 and aligned with the second sub-pixel 1812 included in each of the third sub-pixel groups 1803.

In order to support the plurality of privacy display modes and the normal display mode, the display panel 160 may include a first light transmittance portion 1821 disposed above the second sub-pixel 1812 included in each of the fourth sub-pixel groups 1804 and aligned with the second sub-pixel 1812 included in each of the fourth sub-pixel groups 1804, a second light transmittance portion 1822 disposed above the first sub-pixel 1811 included in each of the fourth sub-pixel groups 1804 and aligned with the first sub-pixel 1811 included in each of the fourth sub-pixel groups 1804, a third light transmittance portion 1823 disposed above the second sub-pixel 1812 included in each of the fourth sub-pixel groups 1804 and aligned with the second sub-pixel 1812 included in each of the fourth sub-pixel groups 1804, and a fourth light transmittance portion 1824 disposed above the third sub-pixel 1813 included in each of the fourth sub-pixel groups 1804 and aligned with the third sub-pixel 1813 included in each of the fourth sub-pixel groups 1804.

The first light transmittance portion 1821 may not include the opaque member 1890. The second light transmittance portion 1822 may include a first portion 1890-1 of the opaque member 1890. The third light transmittance portion 1823 may include a second portion 1890-2 of the opaque member 1890. An area (or a size) of the second portion 1890-2 of the opaque member 1890 may be wider (or larger) than that of the first portion 1890-1 of the opaque member 1890. The fourth light transmittance portion 1824 may include a third portion 1890-3 of the opaque member 1890. An area (or size) of the third portion 1890-3 of the opaque member 1890 may be wider (or larger) than that of the second portion 1890-2 of the opaque member 1890.

As a non-limiting example, the first light transmittance portion 1821 may include a portion of the opaque member 1890. An area (or a size) of the portion of the opaque member 1890 included in the first light transmittance portion 1821 may be narrower (or smaller) than that of the third portion 1890-3 of the opaque member 1890.

For example, a first FOI of light emitted from the second sub-pixel 1812 included in each of the first sub-pixel groups 1801 and aligned with the first light transmittance portion 1821, a second FOI of light emitted from the second sub-pixel 1812 included in each of the second sub-pixel groups 1802 and aligned with the fourth light transmittance portion 1824, a third FOI of light emitted from the second sub-pixel 1812 included in each of the fourth sub-pixel groups 1804 and aligned with the third light transmittance portion 1823, and a fourth FOI of light emitted from the second sub-pixel 1812 included in each of the third sub-pixel groups 1803 and aligned with the second light transmittance portion 1822 may be different from each other. The first FOI may be wider than the second FOI. The second FOI may be wider than the third FOI. The third FOI may be wider than the fourth FOI.

For example, a first FOI of light emitted from the third sub-pixel 1813 included in each of the second sub-pixel groups 1802 and aligned with the first light transmittance portion 1821, a second FOI of light emitted from the third sub-pixel 1813 included in each of the fourth sub-pixel groups 1804 and aligned with the fourth light transmittance portion 1824, a third FOI of light emitted from the third sub-pixel 1813 included in each of the third sub-pixel groups 1803 and aligned with the third light transmittance portion 1823, and a fourth FOI of light emitted from the third sub-pixel 1813 included in each of the first sub-pixel groups 1801 and aligned with the second light transmittance portion 1822 may be different from each other. The first FOI may be wider than the second FOI. The second FOI may be wider than the third FOI. The third FOI may be wider than the fourth FOI.

For example, a first FOI of light emitted from the second sub-pixel 1812 included in each of the fourth sub-pixel groups 1804 and aligned with the first light transmittance portion 1821, a second FOI of light emitted from the second sub-pixel 1812 included in each of the third sub-pixel groups 1803 and aligned with the fourth light transmittance portion 1824, a third FOI of light emitted from the second sub-pixel 1812 included in each of the first sub-pixel groups 1801 and aligned with the third light transmittance portion 1823, and a fourth FOI of light emitted from the second sub-pixel 1812 included in each of the second sub-pixel groups 1802 and aligned with the second light transmittance portion 1822 may be different from each other. The first FOI may be wider than the second FOI. The second FOI may be wider than the third FOI. The third FOI may be wider than the fourth FOI.

For example, a first FOI of light emitted from the first sub-pixel 1811 included in each of the third sub-pixel groups 1803 and aligned with the first light transmittance portion 1821, a second FOI of light emitted from the first sub-pixel 1811 included in each of the first sub-pixel groups 1801 and aligned with the fourth light transmittance portion 1824, a third FOI of light emitted from the first sub-pixel 1811 included in each of the second sub-pixel groups 1802 and aligned with the third light transmittance portion 1823, and a fourth FOI of light emitted from the first sub-pixel 1811 included in each of the fourth sub-pixel groups 1804 and aligned with the second light transmittance portion 1822 may be different from each other. The first FOI may be wider than the second FOI. The second FOI may be wider than the third FOI. The third FOI may be wider than the fourth FOI.

Although not illustrated in FIG. 18, a sub-pixel aligned with the first light transmittance portion 1821 may have a structure corresponding to the sub-pixel 1612-1 of FIG. 17, a sub-pixel aligned with the second light transmittance portion 1822 may have a structure corresponding to the sub-pixel 1612-2 of FIG. 17, a sub-pixel aligned with the third light transmittance portion 1823 may have a structure corresponding to the sub-pixel 1612-3 of FIG. 17, and a sub-pixel aligned with the fourth light transmittance portion 1824 may have a structure corresponding to the sub-pixel 1612-4 of FIG. 17.

As a non-limiting example, the display driver integrated circuitry 221 may control the display panel 160 to emit light from a sub-pixel aligned with the first light transmittance portion 1821, a sub-pixel aligned with the second light transmittance portion 1822, a sub-pixel aligned with the third light transmittance portion 1823, and a sub-pixel aligned with the fourth light transmittance portion 1824, when providing the normal display mode. The display driver integrated circuitry 221 may control the display panel 160 to emit light from a sub-pixel aligned with the second light transmittance portion 1822 when providing the first privacy display mode. The display driver integrated circuitry 221 may control the display panel 160 to emit light from a sub-pixel aligned with the second light transmittance portion 1822 and a sub-pixel aligned with the third light transmittance portion 1823 when providing the second privacy display mode. The display driver integrated circuitry 221 may control the display panel 160 to emit light from a sub-pixel aligned with the second light transmittance portion 1822, a sub-pixel aligned with the third light transmittance portion 1823, and a sub-pixel aligned with the fourth light transmittance portion 1824 when providing the third privacy display mode.

The third sub-pixel groups 1603 may be omitted from the display panel 160 according to the fifteenth example configuration described with reference to FIG. 16. A structure in which the third sub-pixel groups 1603 are omitted from the display panel 160 according to the fifteenth example configuration is described with reference to FIG. 19.

Figure 19:
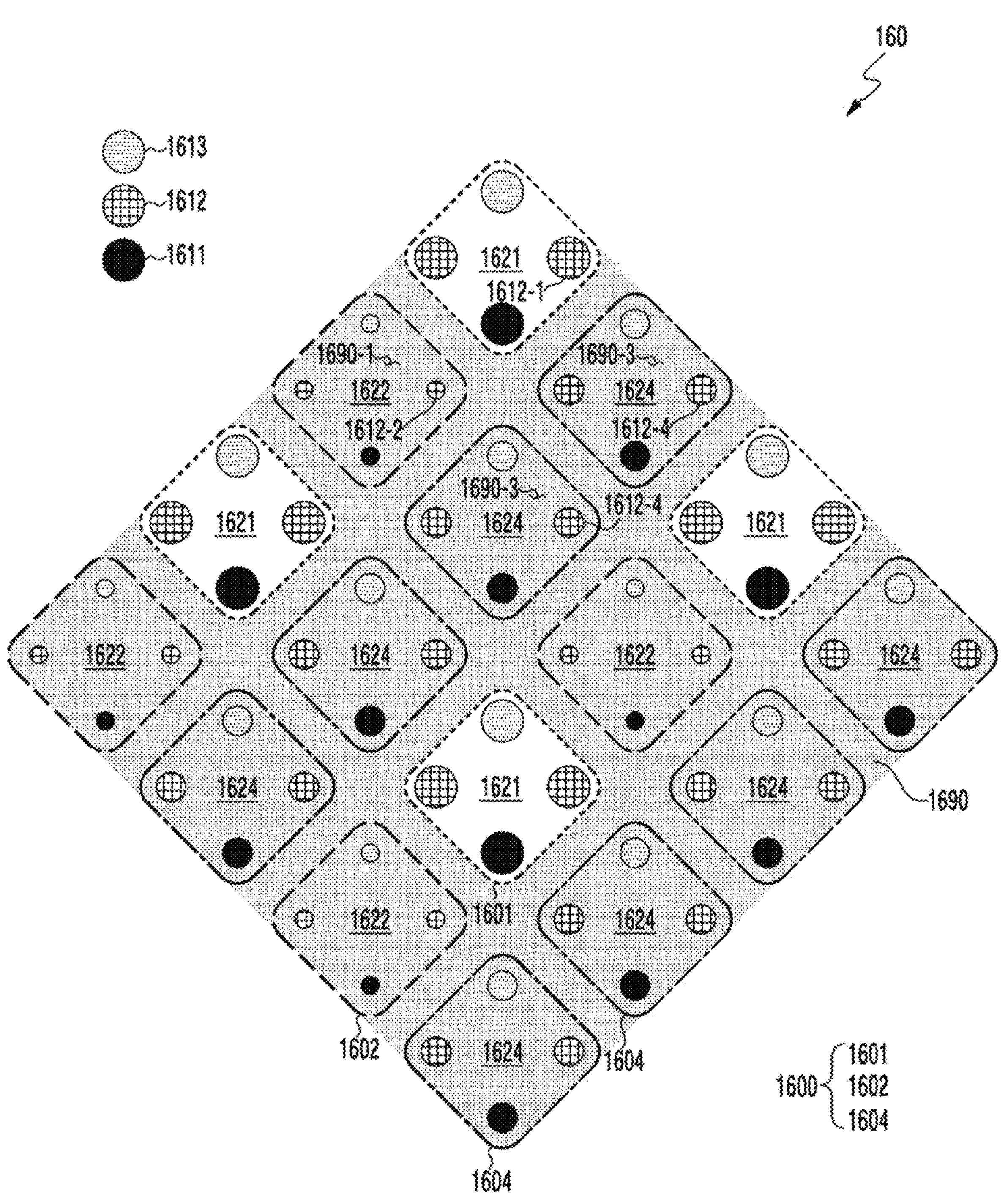
FIG. 19 illustrates a seventeenth example configuration of a display panel according to an embodiment of the disclosure.

FIG. 19 illustrates a seventeenth example configuration of a display panel according to an embodiment of the disclosure.

Referring to FIG. 19, the display panel 160 according to the seventeenth example configuration may further include fourth sub-pixel groups 1604 replacing third sub-pixel groups 1603, relative to the display panel 160 illustrated in FIG. 16 (or the display panel 160 according to the fifteenth example configuration). The display panel 160 according to the seventeenth example configuration may include fourth sub-pixel groups 1604 disposed between the first sub-pixel groups 1601, and fourth sub-pixel groups 1604 disposed between the second sub-pixel groups 1602. The number of fourth sub-pixel groups 1604 included in the display panel 160 according to the seventeenth example configuration may be greater than the number of fourth sub-pixel groups 1604 included in the display panel 160 according to the fifteenth example configuration. For example, the number of fourth sub-pixel groups 1604 included in the display panel 160 according to the seventeenth example configuration may be twice the number of fourth sub-pixel groups 1604 included in the display panel 160 according to the fifteenth example configuration.

The third light transmittance portion 1823 may be omitted from the display panel 160 according to the sixteenth example configuration described with reference to FIG. 18. A structure in which the third light transmittance portion 1823 is omitted from the display panel 160 according to the sixteenth example configuration is described with reference to FIG. 20.

Figure 20:
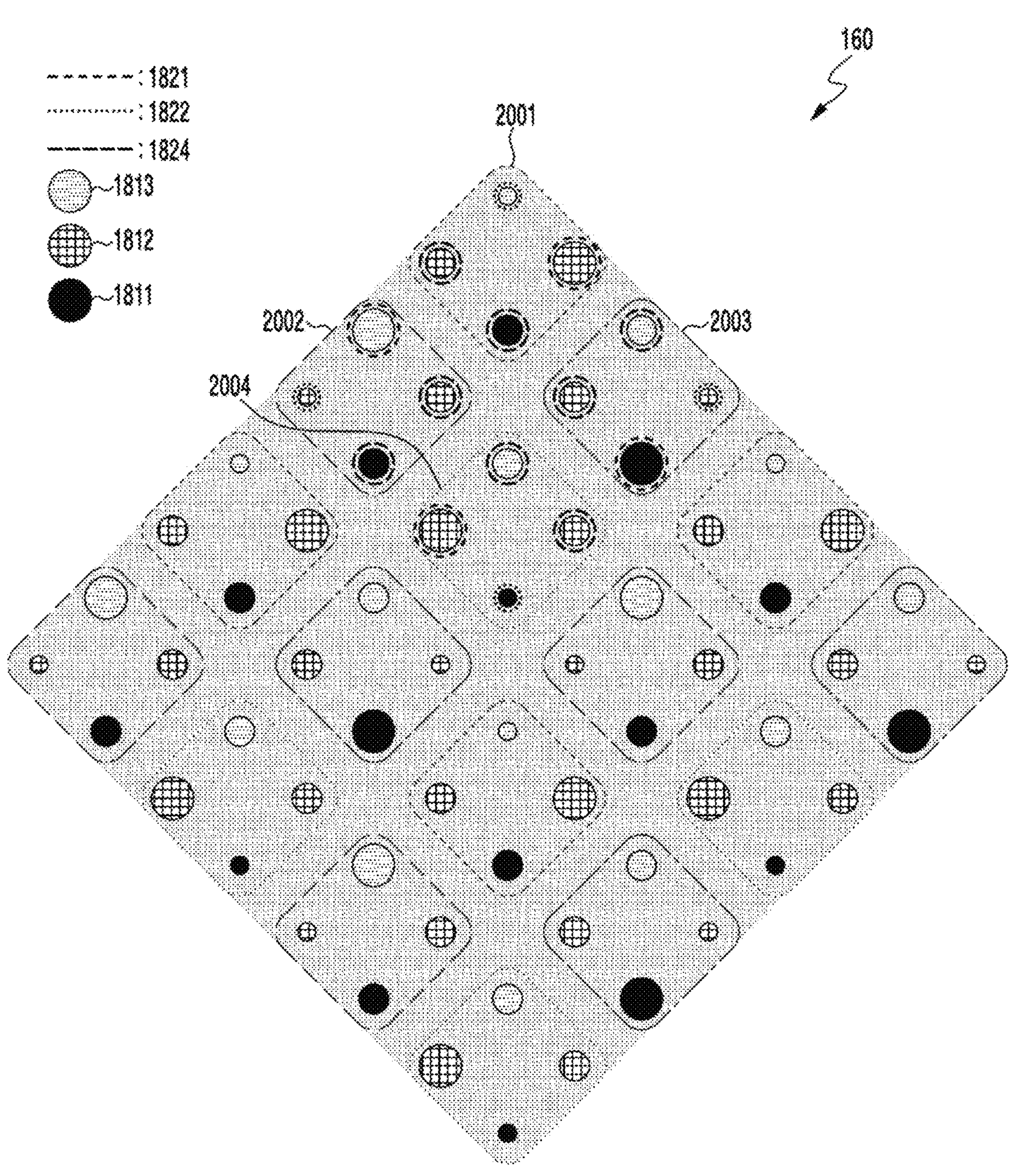
FIG. 20 illustrates an eighteenth example configuration of a display panel according to an embodiment of the disclosure.

FIG. 20 illustrates an eighteenth example configuration of a display panel according to an embodiment of the disclosure.

Referring to FIG. 20, the display panel 160 according to the eighteenth example configuration may further include a fourth light transmittance portion 1824 replacing a third light transmittance portion 1823, relative to the display panel 160 illustrated in FIG. 18 (or the display panel 160 according to the sixteenth example configuration). For example, the third light transmittance portion 1823 related to each of the first sub-pixel groups 1801 of the display panel 160 according to the sixteenth example configuration may be replaced with the fourth light transmittance portion 1824 within first sub-pixel groups 2001 of the display panel 160 according to the eighteenth example configuration. For example, the third light transmittance portion 1823 related to each of the second sub-pixel groups 1802 of the display panel 160 according to the sixteenth example configuration may be replaced with the fourth light transmittance portion 1824 within second sub-pixel groups 2002 of the display panel 160 according to the eighteenth example configuration. For example, the third light transmittance portion 1823 related to each of the third sub-pixel groups 1803 of the display panel 160 according to the sixteenth example configuration may be replaced with the fourth light transmittance portion 1824 within third sub-pixel groups 2003 of the display panel 160 according to the eighteenth example configuration. For example, the third light transmittance portion 1823 related to each of the fourth sub-pixel groups 1804 of the display panel 160 according to the sixteenth example configuration may be replaced with the fourth light transmittance portion 1824 within fourth sub-pixel groups 2004 of the display panel 160 according to the eighteenth example configuration.

The display panel 160 may have a structure to support or provide a privacy display mode that provides a biased viewing angle. The structure is described with reference to the drawings below.

Figure 21A:
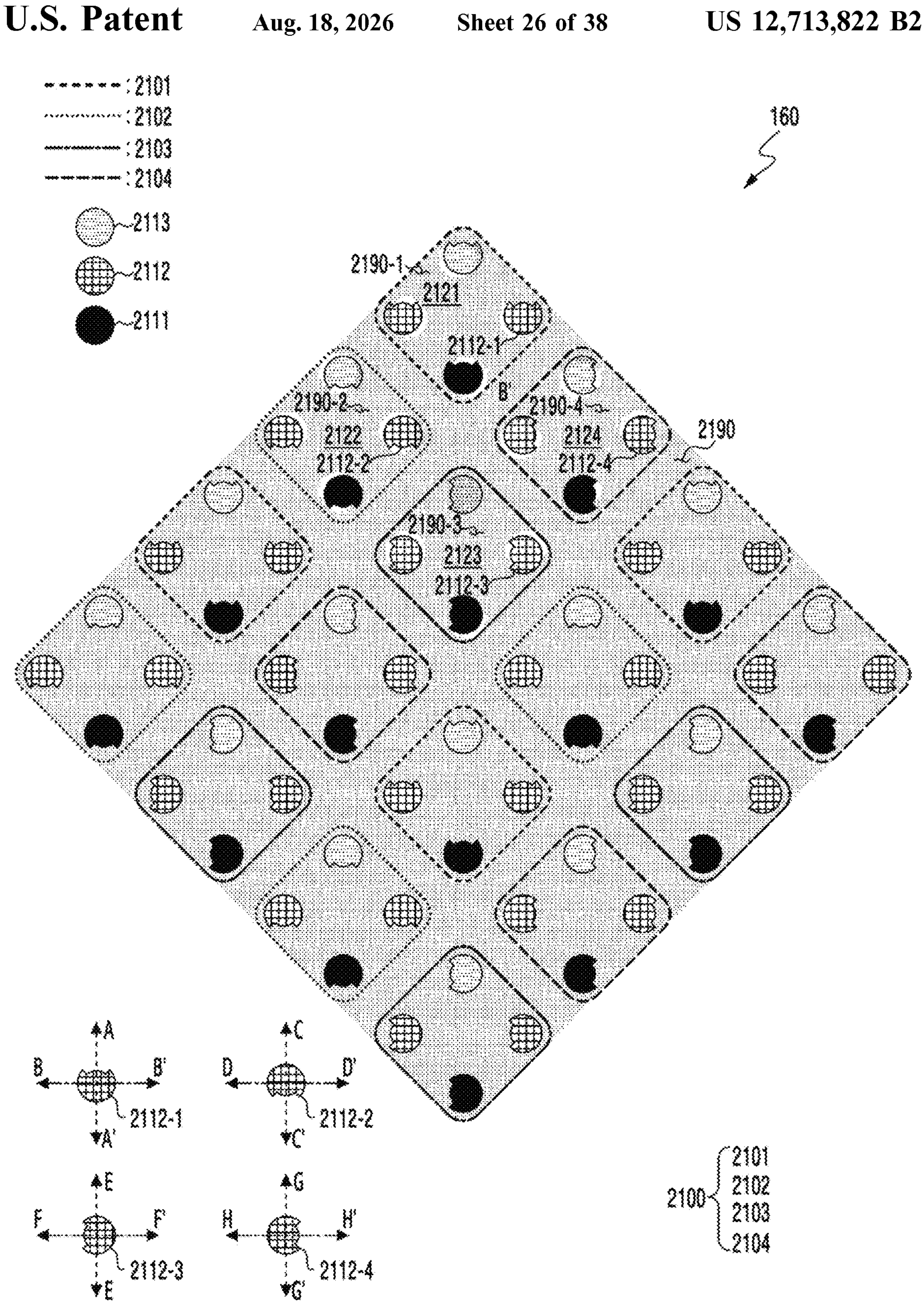
FIG. 21A illustrates a nineteenth example configuration of a display panel according to an embodiment of the disclosure.

FIG. 21A illustrates a nineteenth example configuration of a display panel according to an embodiment of the disclosure.

Referring to FIG. 21A, the display panel 160 may include a plurality of sub-pixels. The sub-pixels may be classified into a plurality of sub-pixel groups 2100. For example, a first portion of the sub-pixels may be included in first sub-pixel groups 2101 among the plurality of sub-pixel groups 2100, a second portion of the sub-pixels may be included in second sub-pixel groups 2102 among the plurality of sub-pixel groups 2100, a third portion of the sub-pixels may be included in third sub-pixel groups 2103 among the plurality of sub-pixel groups 2100, and a fourth portion of the sub-pixels may be included in fourth sub-pixel groups 2104 among the plurality of sub-pixel groups 2100.

Each of the plurality of sub-pixel groups 2100 may include a first sub-pixel 2111 configured to emit light having the first color, a second sub-pixel 2112 configured to emit light having the second color, and a third sub-pixel 2113 configured to emit light having the third color. For example, each of the first sub-pixel groups 2101 may include the first sub-pixel 2111, the second sub-pixel 2112, and the third sub-pixel 2113. For example, each of the second sub-pixel groups 2102 may include the first sub-pixel 2111, the second sub-pixel 2112, and the third sub-pixel 2113. For example, each of the third sub-pixel groups 2103 may include the first sub-pixel 2111, the second sub-pixel 2112, and the third sub-pixel 2113. For example, each of the fourth sub-pixel groups 2104 may include the first sub-pixel 2111, the second sub-pixel 2112, and the third sub-pixel 2113.

The first sub-pixel groups 2101, the second sub-pixel groups 2102, the third sub-pixel groups 2103, and the fourth sub-pixel groups 2104 may alternate with each other.

Each of the first sub-pixel groups 2101 may be disposed below a first light transmittance portion 2121 and may be aligned with the first light transmittance portion 2121. The first light transmittance portion 2121 may include a first portion 2190-1 of an opaque member 2190 biased toward a side (e.g., corresponding to a top side of the display panel 160) of each of sub-pixels in the first sub-pixel groups 2101. For example, light emitted from each of the sub-pixels included in each of the first sub-pixel groups 2101 through the first light transmittance portion 2121 may provide a biased viewing angle toward remaining sides (e.g., corresponding to a bottom side of the display panel 160, a left side of the display panel 160, and a right side of the display panel 160) of each of the sub-pixels, except for the side (e.g., corresponding to the top side of the display panel 160) of each of the sub-pixels.

Each of the second sub-pixel groups 2102 may be disposed below a second light transmittance portion 2122 and may be aligned with the second light transmittance portion 2122. The second light transmittance portion 2122 may include a second portion 2190-2 of an opaque member 2190 biased toward a side (e.g., corresponding to a bottom side of the display panel 160) of each of sub-pixels in the second sub-pixel groups 2102. For example, light emitted from each of the sub-pixels included in each of the second sub-pixel groups 2102 through the second light transmittance portion 2122 may provide a biased viewing angle toward remaining sides (e.g., corresponding to a top side of the display panel 160, a left side of the display panel 160, and a right side of the display panel 160) of each of the sub-pixels, except for the side (e.g., corresponding to the bottom side of the display panel 160) of each of the sub-pixels.

Each of the third sub-pixel groups 2103 may be disposed below a third light transmittance portion 2123 and may be aligned with the third light transmittance portion 2123. The third light transmittance portion 2123 may include a third portion 2190-3 of an opaque member 2190 biased toward a side (e.g., corresponding to a left side of the display panel 160) of each of sub-pixels in the third sub-pixel groups 2103. For example, light emitted from each of the sub-pixels included in each of the third sub-pixel groups 2103 through the third light transmittance portion 2123 may provide a biased viewing angle toward remaining sides (e.g., corresponding to a top side of the display panel 160, a bottom side of the display panel 160, and a right side of the display panel 160) of each of the sub-pixels, except for the side (e.g., corresponding to the left side of the display panel 160) of each of the sub-pixels.

Each of the fourth sub-pixel groups 2104 may be disposed below a fourth light transmittance portion 2124 and may be aligned with the fourth light transmittance portion 2124. The fourth light transmittance portion 2124 may include a fourth portion 2190-4 of an opaque member 2190 biased toward a side (e.g., corresponding to a right side of the display panel 160) of each of sub-pixels in the fourth sub-pixel groups 2104. For example, light emitted from each of the sub-pixels included in each of the fourth sub-pixel groups 2104 through the fourth light transmittance portion 2124 may provide a biased viewing angle toward remaining sides (e.g., corresponding to a top side of the display panel 160, a bottom side of the display panel 160, and a left side of the display panel 160) of each of the sub-pixels, except for the side (e.g., corresponding to the right side of the display panel 160) of each of the sub-pixels.

The first light transmittance portion 2121 arranged in relation to each of the first sub-pixel groups 2101, the second light transmittance portion 2122 arranged in relation to each of the second sub-pixel groups 2102, the third light transmittance portion 2123 arranged in relation to each of the third sub-pixel groups 2103, and the fourth light transmittance portion 2124 arranged in relation to each of the fourth sub-pixel groups 2104 are described in more detail with reference to FIGS. 22A to 22D.

Figure 22A:
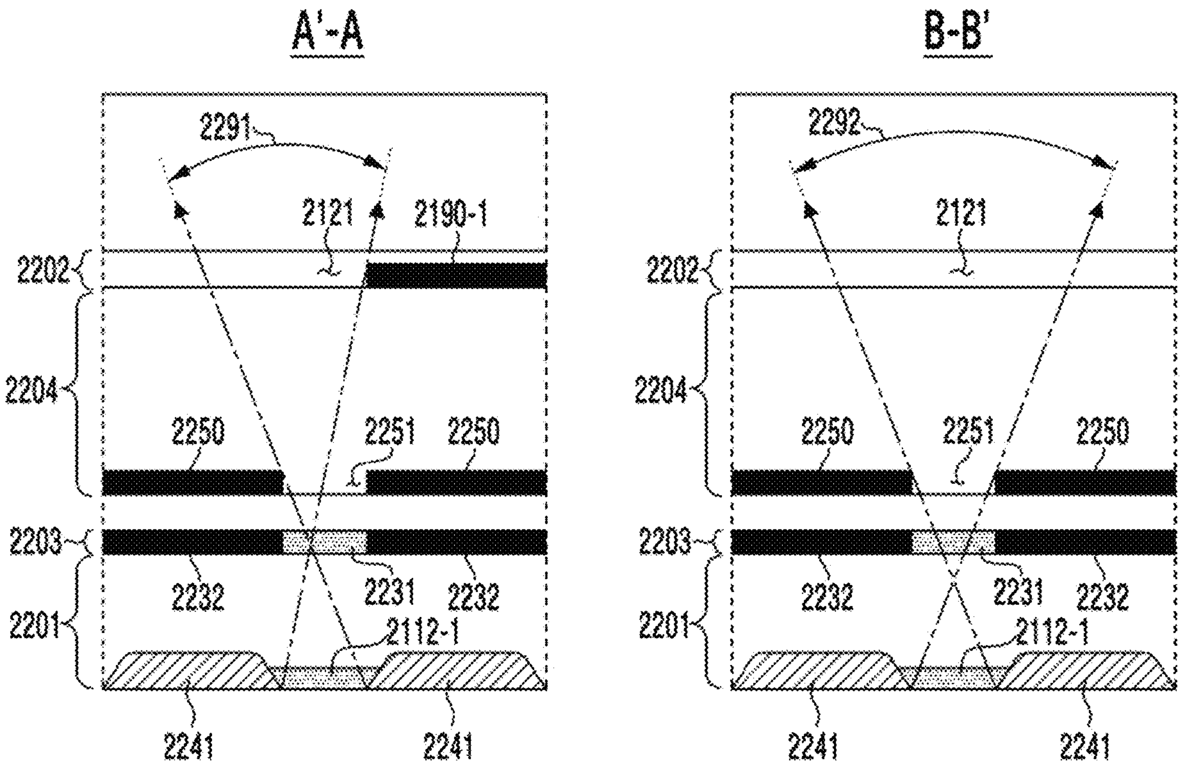
FIG. 22A illustrates a cross-sectional view cut along line A-A' of FIG. 21A and a cross-sectional view cut along line B-B' of FIG. 21A according to an embodiment of the disclosure.

FIG. 22A illustrates a cross-sectional view cut along line A-A' of FIG. 21A and a cross-sectional view cut along line B-B' of FIG. 21A according to an embodiment of the disclosure.

Figure 22B:
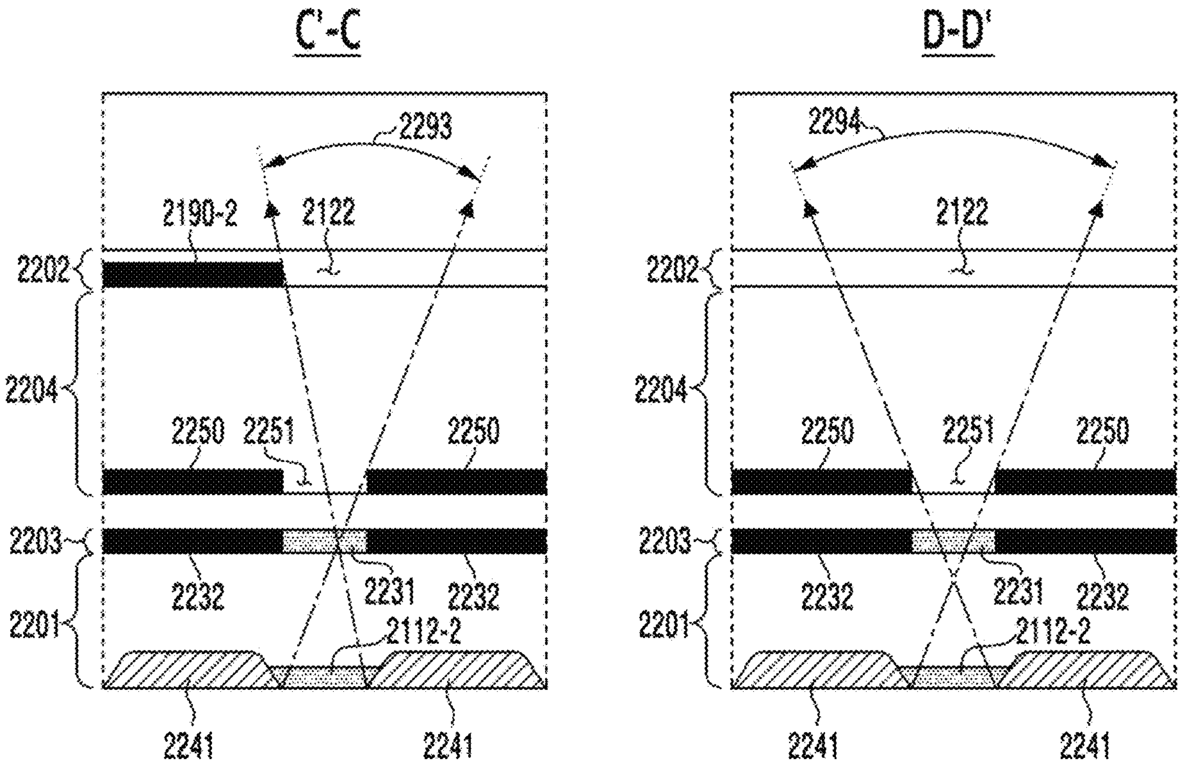
FIG. 22B illustrates a cross-sectional view cut along line C-C' of FIG. 21A and a cross-sectional view cut along line D-D' of FIG. 21A according to an embodiment of the disclosure.

FIG. 22B illustrates a cross-sectional view cut along line C-C' of FIG. 21A and a cross-sectional view cut along line D-D' of FIG. 21A according to an embodiment of the disclosure.

Figure 22C:
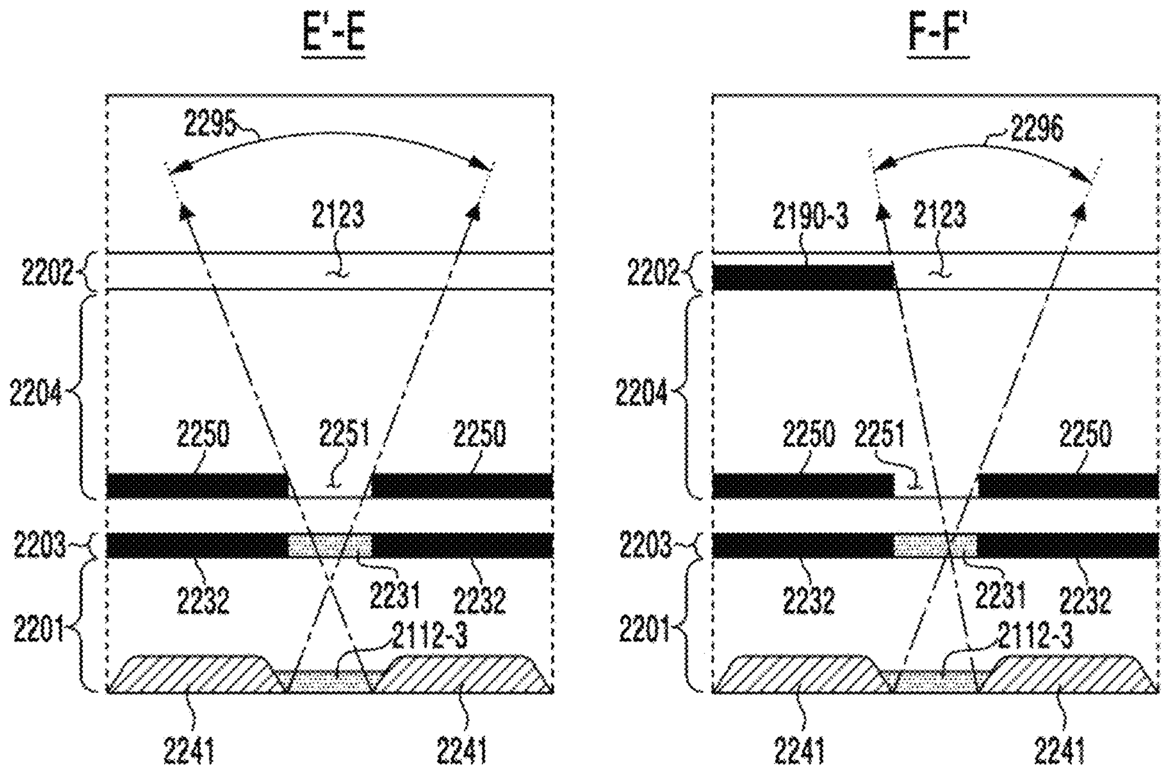
FIG. 22C illustrates a cross-sectional view cut along line E-E' of FIG. 21A and a cross-sectional view cut along line F-F' of FIG. 21A according to an embodiment of the disclosure.

FIG. 22C illustrates a cross-sectional view cut along line E-E' of FIG. 21A and a cross-sectional view cut along line F-F' of FIG. 21A according to an embodiment of the disclosure.

Figure 22D:
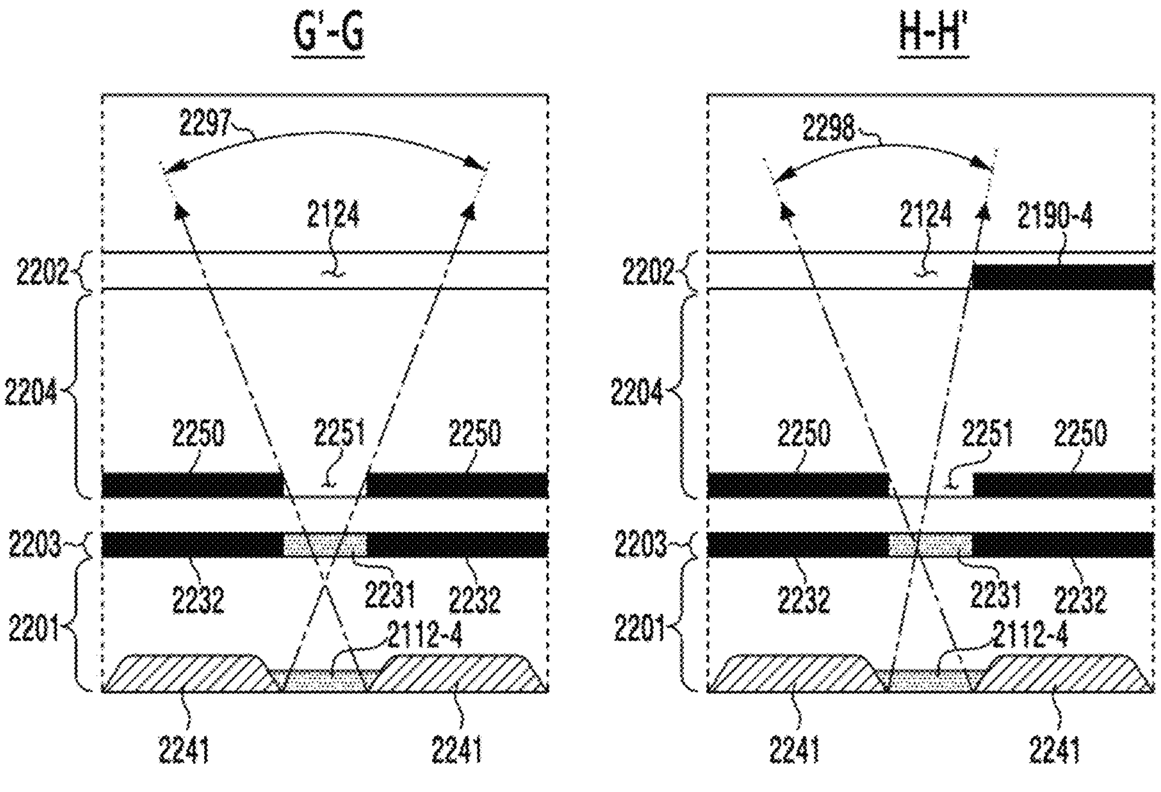
FIG. 22D illustrates a cross-sectional view cut along line G-G' of FIG. 21A and a cross-sectional view cut along line H-H' of FIG. 21A according to an embodiment of the disclosure.

FIG. 22D illustrates a cross-sectional view cut along line G-G' of FIG. 21A and a cross-sectional view cut along line H-H' of FIG. 21A according to an embodiment of the disclosure.

Referring to FIGS. 22A to 22D, the display panel 160 may include a first layer 2201 and a second layer 2202. The first layer 2201 may include the sub-pixels and a PDL 2241 defining a periphery of each of the sub-pixels. The second layer 2202 may be disposed above the first layer 2201. The second layer 2202 may include light transmittance portions defined by an opaque member 2190. The display panel 160 may include one or more layers disposed between the first layer 2201 and the second layer 2202. For example, the one or more layers may include a third layer 2203 disposed between the first layer 2201 and the second layer 2202 and including a filter portion 2231 aligned with the sub-pixels and an opaque member 2232 defining a periphery of the filter portion 2231. The filter portion 2231 may be configured to pass a color corresponding to light emitted from the sub-pixels. The opaque member 2232 may be configured to block or reduce light. For example, the one or more layers may include a fourth layer 2204 disposed between the second layer 2202 and the third layer 2203. The fourth layer 2204 may be included in the display panel 160 to define or compensate for a thickness of the display panel 160. The fourth layer 2204 may include an opaque member 2250 for reducing light from a sub-pixel from being transmitted through a light transmittance portion disposed on an adjacent sub-pixel. The opaque member 2250 may define a path of light emitted from the sub-pixel.

Referring to FIG. 22A, the first layer 2201 may include a sub-pixel 2112-1 included in a sub-pixel group among first sub-pixel groups 2101. The second layer 2202 may include a first light transmittance portion 2121 aligned with the sub-pixel group including the sub-pixel 2112-1. The third layer 2203 may include a filter portion 2231 aligned with the sub-pixel 2112-1 and an opaque member 2232 surrounding the filter portion 2231. The fourth layer 2204 may include an opaque member 2250 and a light transmittance portion 2251 (or a light path portion 2251) defined by the opaque member 2250. The light transmittance portion 2251 may be aligned with the sub-pixel 2112-1.

The first light transmittance portion 2121 may include a first portion 2190-1 of the opaque member 2190 biased toward a first side (e.g., corresponding to a top side of the display panel 160) of the sub-pixel 2112-1, as in a cross-sectional view of A-A'. Since the first light transmittance portion 2121 includes the first portion 2190-1 of the opaque member 2190, light emitted from the sub-pixel 2112-1 may be biased toward remaining sides (e.g., corresponding to a bottom side of the display panel 160, a left side of the display panel 160, and a right side of the display panel 160) of the sub-pixel 2112-1, except for the first side of the sub-pixel 2112-1, as indicated by an indication 2291 and an indication 2292.

As a non-limiting example, an FOI of light indicated by the indication 2291 and the indication 2292 may be tapered to a narrower FOI at a center portion of a display area of the display panel 160 from a wider FOI at a peripheral portion of the display area of the display panel 160. As a non-limiting example, the tapering of the FOI may also be applied to a portion of the sub-pixels of the display panel 160.

Referring to FIG. 22B, the first layer 2201 may include a sub-pixel 2112-2 included in a sub-pixel group among second sub-pixel groups 2102. The second layer 2202 may include a second light transmittance portion 2122 aligned with the sub-pixel group including the sub-pixel 2112-2. The third layer 2203 may include a filter portion 2231 aligned with the sub-pixel 2112-2 and an opaque member 2232 surrounding the filter portion 2231. The fourth layer 2204 may include an opaque member 2250 and a light transmittance portion 2251 (or a light path portion 2251) defined by the opaque member 2250. The light transmittance portion 2251 may be aligned with the sub-pixel 2112-2.

The second light transmittance portion 2122 may include a second portion 2190-2 of the opaque member 2190 biased toward a second side (e.g., corresponding to a bottom side of the display panel 160) of the sub-pixel 2112-2, as in a cross-sectional view of C-C'. Since the second light transmittance portion 2122 includes the second portion 2190-2 of the opaque member 2190, light emitted from the sub-pixel 2112-2 may be biased toward remaining sides (e.g., a top side of the display panel 160, a left side of the display panel 160, and a right side of the display panel 160) of the sub-pixel 2112-2, except for the second side of the sub-pixel 2112-2, as indicated by an indication 2293 and an indication 2294.

As a non-limiting example, an FOI of light indicated by the indication 2293 and the indication 2294 may be tapered to a narrower FOI at a center portion of a display area of the display panel 160 from a wider FOI at a peripheral portion of the display area of the display panel 160. As a non-limiting example, the tapering of the FOI may be applied to a portion of sub-pixels of the display panel 160.

Referring to FIG. 22C, the first layer 2201 may include a sub-pixel 2112-3 included in a sub-pixel group among third sub-pixel groups 2103. The second layer 2202 may include a third light transmittance portion 2123 aligned with the sub-pixel group including the sub-pixel 2112-3. The third layer 2203 may include a filter portion 2231 aligned with the sub-pixel 2112-3 and an opaque member 2232 surrounding the filter portion 2231. The fourth layer 2204 may include an opaque member 2250 and a light transmittance portion 2251 (or a light path portion 2251) defined by the opaque member 2250. The light transmittance portion 2251 may be aligned with the sub-pixel 2112-3.

The third light transmittance portion 2123 may include a third portion 2190-3 of an opaque member 2190 biased toward a third side (e.g., corresponding to a left side of the display panel 160) of the sub-pixel 2112-3, as in a cross-sectional view of F-F'. Since the third light transmittance portion 2123 may include the third portion 2190-3 of the opaque member 2190, light emitted from the sub-pixel 2112-3 may be biased toward remaining sides (e.g., a top side of the display panel 160, a bottom side of the display panel 160, and a right side of the display panel 160) of the sub-pixel 2112-3, except for the third side of the sub-pixel 2112-3, as indicated by an indication 2295 and an indication 2296.

As a non-limiting example, an FOI of light indicated by the indication 2295 and the indication 2296 may be tapered to a narrower FOI at a center portion of a display area of the display panel 160 from a wider FOI at a peripheral portion of the display area of the display panel 160. As a non-limiting example, the tapering of the FOI may also be applied to a portion of the sub-pixels of the display panel 160.

Referring to FIG. 22D, the first layer 2201 may include a sub-pixel 2112-4 included in a sub-pixel group among fourth sub-pixel groups 2104. The second layer 2202 may include a fourth light transmittance portion 2124 aligned with the sub-pixel group including the sub-pixel 2112-4. The third layer 2203 may include a filter portion 2231 aligned with the sub-pixel 2112-4 and an opaque member 2232 surrounding the filter portion 2231. The fourth layer 2204 may include an opaque member 2250 and a light transmittance portion 2251 (or a light path portion 2251) defined by the opaque member 2250. The light transmittance portion 2251 may be aligned with the sub-pixel 2112-4.

The fourth light transmittance portion 2124 may include a fourth portion 2190-4 of the opaque member 2190 biased toward a fourth side (e.g., corresponding to a right side of the display panel 160) of the sub-pixel 2112-4, as in a cross-sectional view of H-H'. Since the fourth light transmittance portion 2124 may include the fourth portion 2190-4 of the opaque member 2190, light emitted from the sub-pixel 2112-4 may be biased toward remaining sides (e.g., corresponding to a top side of the display panel 160, a bottom side of the display panel 160, and a left side of the display panel 160) of the sub-pixel 2112-4, except for the fourth side of the sub-pixel 2112-4, as indicated by an indication 2297 and an indication 2298.

As a non-limiting example, an FOI of light indicated by the indication 2297 and the indication 2298 may be tapered to a narrower FOI at a center portion of a display area of the display panel 160 from a wider FOI at a peripheral portion of the display area of the display panel 160. As a non-limiting example, the tapering of the FOI may be applied to a portion of sub-pixels of the display panel 160.

The structure illustrated in FIGS. 22A to 22D is only one embodiment. For example, an FOI of light emitted from a sub-pixel may be adjusted through a light path control material disposed along a first portion of a path of the light positioned in the second layer 2202, the third layer 2203, and/or the fourth layer 2204. For example, a first refractive index of a first portion of a layer including the light path control material may be different from a second refractive index of a second portion of the layer disposed along a second portion of the path without including the light path control material.

Referring back to FIG. 21A, as a non-limiting example, the display driver integrated circuitry 221 may control the display panel 160 to emit light from the first sub-pixel groups 2101, the second sub-pixel groups 2102, the third sub-pixel groups 2103, and the fourth sub-pixel groups 2104 when providing the normal display mode. The display driver integrated circuitry 221 may control the display panel 160 to emit light from the first sub-pixel groups 2101 among the first sub-pixel groups 2101, the second sub-pixel groups 2102, the third sub-pixel groups 2103, and the fourth sub-pixel groups 2104, when providing a privacy display mode for reducing visibility from a top side of the display panel 160. The display driver integrated circuitry 221 may control the display panel 160 to emit light from the second sub-pixel groups 2102 among the first sub-pixel groups 2101, the second sub-pixel groups 2102, the third sub-pixel groups 2103, and the fourth sub-pixel groups 2104, when providing a privacy display mode for reducing visibility from a bottom side of the display panel 160. The display driver integrated circuitry 221 may control the display panel 160 to emit light from the third sub-pixel groups 2103 among the first sub-pixel groups 2101, the second sub-pixel groups 2102, the third sub-pixel groups 2103, and the fourth sub-pixel groups 2104, when providing a privacy display mode for reducing visibility from a left side of the display panel 160. The display driver integrated circuitry 221 may control the display panel 160 to emit light from the fourth sub-pixel groups 2104 among the first sub-pixel groups 2101, the second sub-pixel groups 2102, the third sub-pixel groups 2103, and the fourth sub-pixel groups 2104, when providing a privacy display mode for reducing visibility from a right side of the display panel 160.

The display panel 160 may include some groups among the first sub-pixel groups 2101, the second sub-pixel groups 2102, the third sub-pixel groups 2103, and the fourth sub-pixel groups 2104. The display panel 160 including some groups is described with reference to FIG. 21B.

Figure 21B:
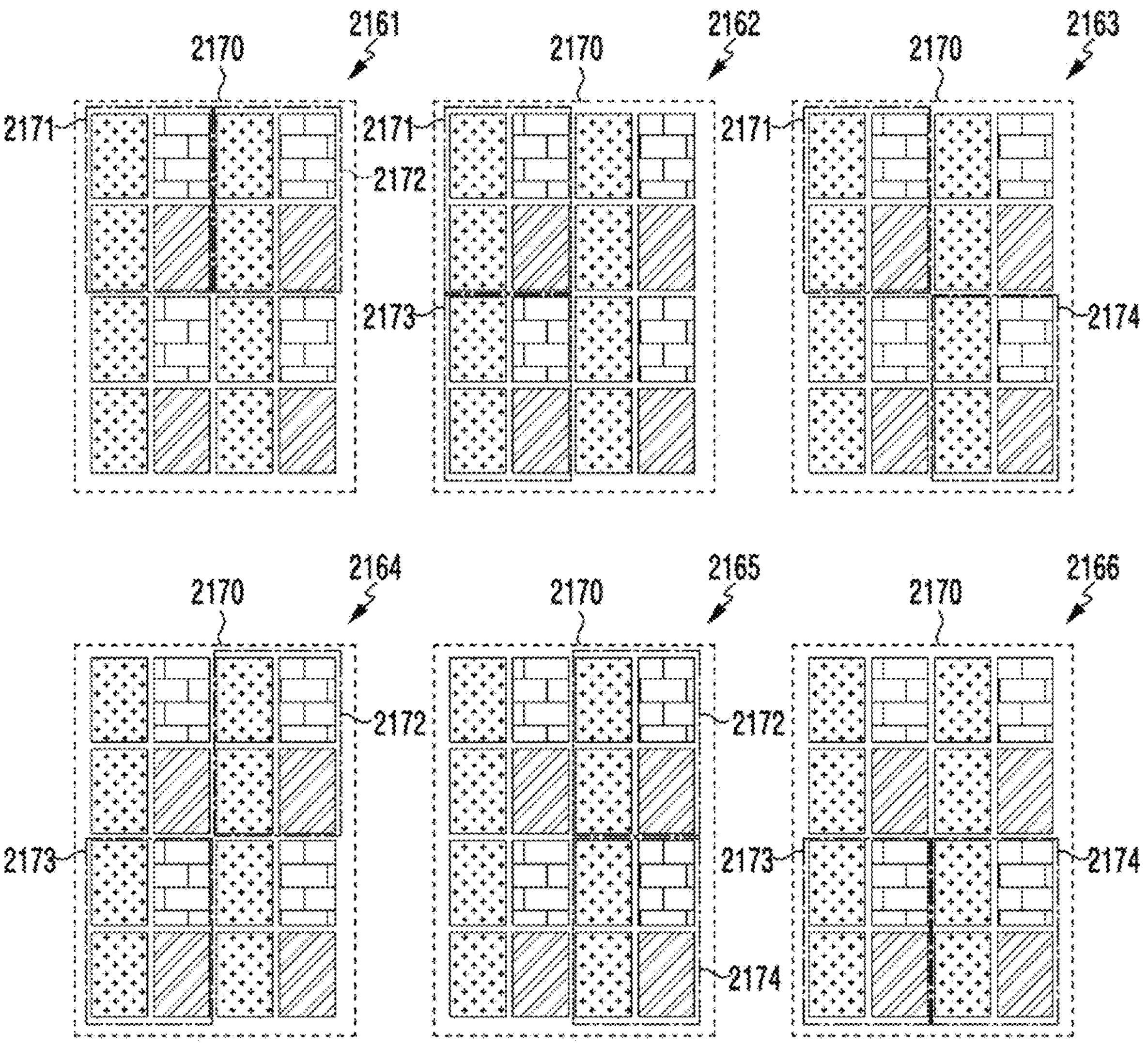
FIG. 21B illustrates a twentieth example configuration, a twenty-first example configuration, a twenty-second example configuration, a twenty-third example configuration, a twenty-fourth example configuration, and a twenty-fifth example configuration of a display panel 160 according to an embodiment of the disclosure.

FIG. 21B illustrates a twentieth example configuration, a twenty-first example configuration, a twenty-second example configuration, a twenty-third example configuration, a twenty-fourth example configuration, and a twenty-fifth example configuration of a display panel 160 according to an embodiment of the disclosure.

Referring to FIG. 21B, the display panel 160 may include groups 2170 including four sub-pixel groups.

A sub-pixel group included in a top-left area 2171 of each of the groups 2170 in the display panel 160 according to the twentieth example configuration 2161 and a sub-pixel group included in a top-right area 2172 of each of the groups 2170 in the display panel 160 according to the twentieth example configuration 2161 may be different from each other. For example, the sub-pixel group included in the top-left area 2171 of each of the groups 2170 in the display panel 160 according to the twentieth example configuration 2161 may be one of the first sub-pixel groups 2101, and the sub-pixel group included in the top-right area 2172 of each of the groups 2170 in the display panel 160 according to the twentieth example configuration 2161 may be one of the second sub-pixel groups 2102. However, it is not limited thereto. As a non-limiting example, sub-pixel groups included in a remaining area of each of the groups 2170 in the display panel 160 according to the twentieth example configuration 2161 may provide a wider viewing angle than the first sub-pixel groups 2101, the second sub-pixel groups 2102, the third sub-pixel groups 2103, and the fourth sub-pixel groups 2104.

A sub-pixel group included in a top-left area 2171 of each of the groups 2170 in the display panel 160 according to the twenty-first example configuration 2162 and a sub-pixel group included in a bottom-left area 2173 of each of the groups 2170 in the display panel 160 according to the twenty-first example configuration 2162 may be different from each other. For example, the sub-pixel group included in the top-left area 2171 of each of the groups 2170 in the display panel 160 according to the twenty-first example configuration 2162 may be one of the first sub-pixel groups 2101, and the sub-pixel group included in the bottom-left area 2173 of each of the groups 2170 in the display panel 160 according to the twenty-first example configuration 2162 may be one of the second sub-pixel groups 2102.

However, it is not limited thereto. As a non-limiting example, sub-pixel groups included in a remaining area of each of the groups 2170 in the display panel 160 according to the twenty-first example configuration 2162 may provide a wider viewing angle than the first sub-pixel groups 2101, the second sub-pixel groups 2102, the third sub-pixel groups 2103, and the fourth sub-pixel groups 2104.

A sub-pixel group included in a top-left area 2171 of each of the groups 2170 in the display panel 160 according to the twenty-second example configuration 2163 and a sub-pixel group included in a bottom-right area 2174 of each of the groups 2170 in the display panel 160 according to the twenty-second example configuration 2163 may be different from each other. For example, the sub-pixel group included in the top-left area 2171 of each of the groups 2170 in the display panel 160 according to the twenty-second example configuration 2163 may be one of the first sub-pixel groups 2101, and the sub-pixel group included in the bottom-right area 2174 of each of the groups 2170 in the display panel 160 according to the twenty-second example configuration 2163 may be one of the second sub-pixel groups 2102. However, it is not limited thereto. As a non-limiting example, sub-pixel groups included in a remaining area of each of the groups 2170 in the display panel 160 according to the twenty-second example configuration 2163 may provide a wider viewing angle than the first sub-pixel groups 2101, the second sub-pixel groups 2102, the third sub-pixel groups 2103, and the fourth sub-pixel groups 2104.

A sub-pixel group included in a top-right area 2172 of each of the groups 2170 in the display panel 160 according to the twenty-third example configuration 2164 and a sub-pixel group included in a bottom-left area 2173 of each of the groups 2170 in the display panel 160 according to the twenty-third example configuration 2164 may be different from each other. For example, the sub-pixel group included in the top-right area 2172 of each of the groups 2170 in the display panel 160 according to the twenty-third example configuration 2164 may be one of the first sub-pixel groups 2101, and the sub-pixel group included in the bottom-left area 2173 of each of the groups 2170 in the display panel 160 according to the twenty-third example configuration 2164 may be one of the second sub-pixel groups 2102. However, it is not limited thereto. As a non-limiting example, sub-pixel groups included in a remaining area of each of the groups 2170 in the display panel 160 according to the twenty-third example configuration 2164 may provide a wider viewing angle than the first sub-pixel groups 2101, the second sub-pixel groups 2102, the third sub-pixel groups 2103, and the fourth sub-pixel groups 2104.

A sub-pixel group included in a top-right area 2172 of each of the groups 2170 in the display panel 160 according to the twenty-fourth example configuration 2165 and a sub-pixel group included in a bottom-right area 2174 of each of the groups 2170 in the display panel 160 according to the twenty-fourth example configuration 2165 may be different from each other. For example, the sub-pixel group included in the top-right area 2172 of each of the groups 2170 in the display panel 160 according to the twenty-fourth example configuration 2165 may be one of the first sub-pixel groups 2101, and the sub-pixel group included in the bottom-right area 2174 of each of the groups 2170 in the display panel 160 according to the twenty-fourth example configuration 2165 may be one of the second sub-pixel groups 2102. However, it is not limited thereto. As a non-limiting example, sub-pixel groups included in a remaining area of each of the groups 2170 in the display panel 160 according to the twenty-fourth example configuration 2165 may provide a wider viewing angle than the first sub-pixel groups 2101, the second sub-pixel groups 2102, the third sub-pixel groups 2103, and the fourth sub-pixel groups 2104.

A sub-pixel group included in a bottom-left area 2173 of each of the groups 2170 in the display panel 160 according to the twenty-fifth example configuration 2166 and a sub-pixel group included in a bottom-right area 2174 of each of the groups 2170 in the display panel 160 according to the twenty-fifth example configuration 2166 may be different from each other. For example, the sub-pixel group included in the bottom-left area 2173 of each of the groups 2170 in the display panel 160 according to the twenty-fifth example configuration 2166 may be one of the first sub-pixel groups 2101, and the sub-pixel group included in the bottom-right area 2174 of each of the groups 2170 in the display panel 160 according to the twenty-fifth example configuration 2166 may be one of the second sub-pixel groups 2102. However, it is not limited thereto. As a non-limiting example, sub-pixel groups included in a remaining area of each of the groups 2170 in the display panel 160 according to the twenty-fifth example configuration 2166 may provide a wider viewing angle than the first sub-pixel groups 2101, the second sub-pixel groups 2102, the third sub-pixel groups 2103, and the fourth sub-pixel groups 2104.

The display panel 160 may include first sub-pixels and second sub-pixels. Each of the first sub-pixels may be described as a sub-pixel arranged in relation to a first light transmittance portion having a structure for reducing visibility from a first side (e.g., corresponding to a top side of the display panel 160) of each of the first sub-pixels and a second side (e.g., corresponding to a bottom side of the display panel 160) of each of the first sub-pixels, and for (substantially) maintaining visibility from a third side (e.g., corresponding to a left side of the display panel 160) of each of the first sub-pixels and a fourth side (e.g., corresponding to a right side of the display panel 160) of each of the first sub-pixels. Each of the second sub-pixels may be described as a sub-pixel arranged in relation to a second light transmittance portion having a structure for (substantially) maintaining visibility from a first side (e.g., corresponding to a top side of the display panel 160) of each of the second sub-pixels and a second side (e.g., corresponding to a bottom side of the display panel 160) of each of the second sub-pixels, and for reducing visibility from a third side (e.g., corresponding to a left side of the display panel 160) of each of the second sub-pixels and a fourth side (e.g., corresponding to a right side of the display panel 160) of each of the second sub-pixels. This structure may be described with reference to FIG. 23.

Figure 23:
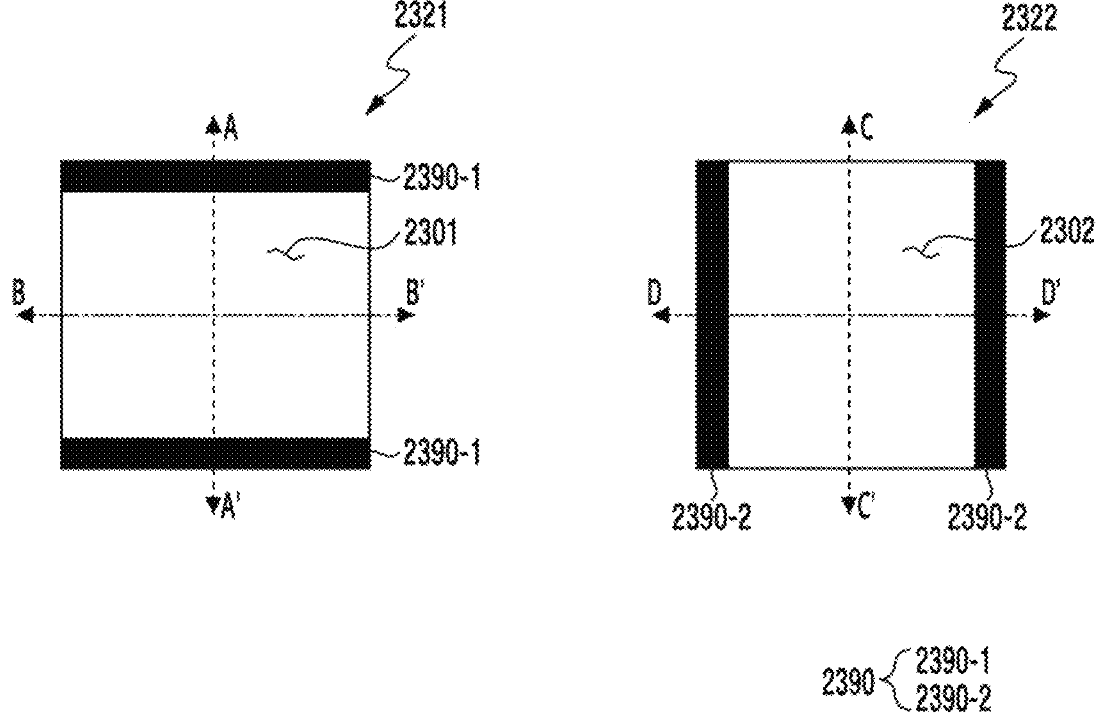
FIG. 23 illustrates a first light transmittance portion having a structure for reducing visibility from a first side and a second side and maintaining visibility from a third side and a fourth side, and a second light transmittance portion having a structure for reducing visibility from the third side and the fourth side and maintaining visibility from the first side and the second side according to an embodiment of the disclosure.

FIG. 23 illustrates a first light transmittance portion having a structure for reducing visibility from a first side and a second side and maintaining visibility from a third side and a fourth side, and a second light transmittance portion having a structure for reducing visibility from the third side and the fourth side and maintaining visibility from the first side and the second side according to an embodiment of the disclosure.

Referring to FIG. 23, the display panel 160 may include first sub-pixels 2301 and second sub-pixels 2302. Each of the first sub-pixels 2301 may be described as a sub-pixel disposed below a first light transmittance portion 2321 and aligned with the first light transmittance portion 2321. Each of the second sub-pixels 2302 may be described as a sub-pixel disposed below a second light transmittance portion 2322 and aligned with the second light transmittance portion 2322.

The first light transmittance portion 2321 may include a first portion 2390-1 of an opaque member 2390 disposed above a first side (e.g., corresponding to a top side of the display panel 160) and a second side (e.g., corresponding to a bottom side of the display panel 160) of each of the first sub-pixels 2301. Light emitted from each of the first sub-pixels 2301 may be biased toward a third side and a fourth side of each of the first sub-pixels 2301, except for the first side and the second side of each of the first sub-pixels 2301, by the first portion 2390-1 of the opaque member 2390 in the first light transmittance portion 2321.

The second light transmittance portion 2322 may include a second portion 2390-2 of an opaque member 2390 disposed above a third side (e.g., corresponding to a left side of the display panel 160) and a fourth side (e.g., corresponding to a right side of the display panel 160) of each of the second sub-pixels 2302. Light emitted from each of the second sub-pixels 2302 may be biased toward a first side and a second side of each of the second sub-pixels 2302, except for the third side and the fourth side of each of the second sub-pixels 2302, by the second portion 2390-2 of the opaque member 2390 in the second light transmittance portion 2322. The first light transmittance portion 2321 and the second light transmittance portion 2322 may be described in more detail with reference to FIGS. 24A and 24B.

Figure 24A:
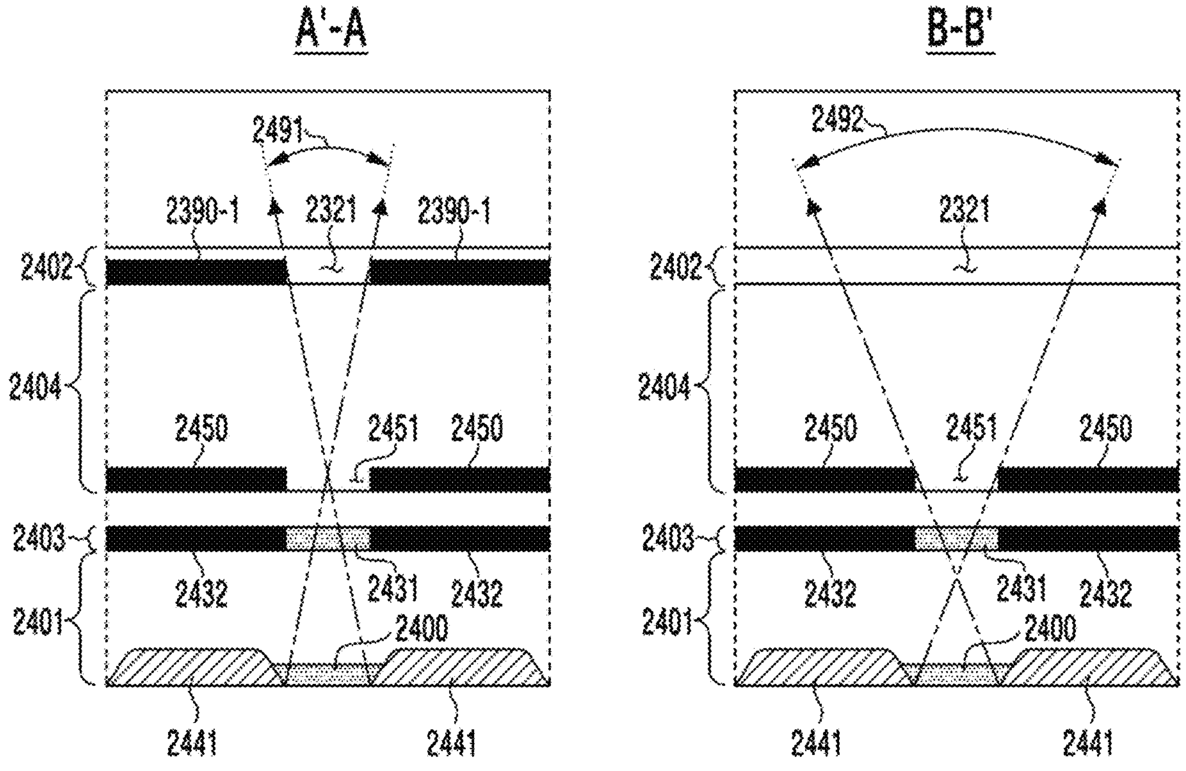
FIG. 24A illustrates a cross-sectional view cut along line A-A' of FIG. 23 and a cross-sectional view cut along line B-B' of FIG. 23 according to an embodiment of the disclosure.

FIG. 24A illustrates a cross-sectional view cut along line A-A' of FIG. 23 and a cross-sectional view cut along line B-B' of FIG. 23 according to an embodiment of the disclosure.

Figure 24B:
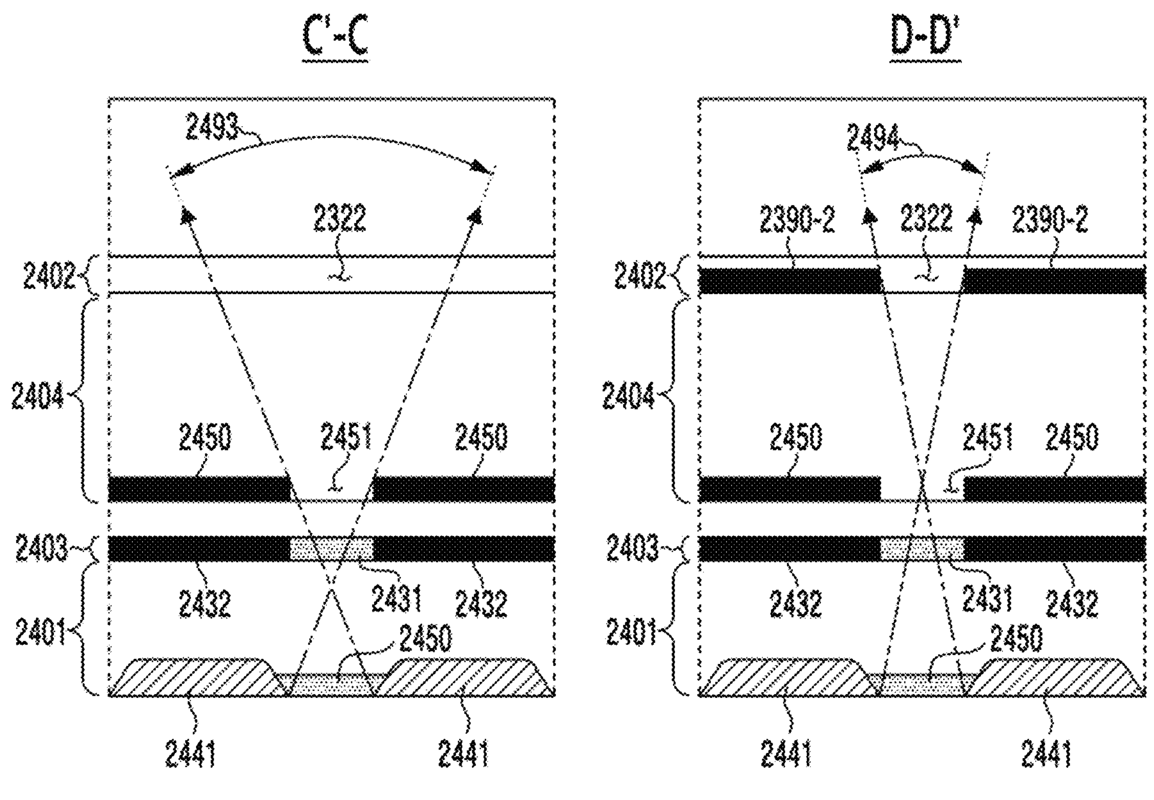
FIG. 24B illustrates a cross-sectional view cut along line C-C' of FIG. 23 and a cross-sectional view cut along line D-D' of FIG. 23 according to an embodiment of the disclosure.

FIG. 24B illustrates a cross-sectional view cut along line C-C' of FIG. 23 and a cross-sectional view cut along line D-D' of FIG. 23 according to an embodiment of the disclosure.

Referring to FIGS. 24A and 24B, the display panel 160 may include a first layer 2401 and a second layer 2402. The first layer 2401 may include sub-pixels including the first sub-pixels 2301 and the second sub-pixels 2302, and a PDL 2441 defining a periphery of each of the sub-pixels. The second layer 2402 may be disposed above the first layer 2401. The second layer 2402 may include light transmittance portions defined by an opaque member 2390. The display panel 160 may include one or more layers disposed between the first layer 2401 and the second layer 2402. For example, the one or more layers may include a third layer 2403, disposed between the first layer 2401 and the second layer 2402, including a filter portion 2431 aligned with the sub-pixels and an opaque member 2432 defining a periphery of the filter portion 2431. The filter portion 2431 may be configured to pass a color corresponding to light emitted from the sub-pixels. The opaque member 2432 may be configured to block or reduce light. For example, the one or more layers may include a fourth layer 2404 disposed between the second layer 2402 and the third layer 2403. The fourth layer 2404 may be included in the display panel 160 to define or compensate for a thickness of the display panel 160. The fourth layer 2404 may include an opaque member 2450 for reducing light from a sub-pixel from being transmitted through a light transmittance portion disposed above an adjacent sub-pixel. The opaque member 2450 may define a path of light emitted from the sub-pixel.

Referring to FIG. 24A, the first layer 2401 may include a sub-pixel 2400, which is a sub-pixel among the first sub-pixels 2301. The second layer 2402 may include a first light transmittance portion 2321 aligned with the sub-pixel 2400. The third layer 2403 may include a filter portion 2431 aligned with the sub-pixel 2400, and an opaque member 2432 surrounding the filter portion 2431. The fourth layer 2404 may include an opaque member 2450 and a light transmittance portion 2451 (or a light path portion 2451) defined by the opaque member 2450. The light transmittance portion 2451 may be aligned with the sub-pixel 2400.

The first light transmittance portion 2321 may include a first portion 2390-1 of the opaque member 2390, which is biased toward a first side (e.g., corresponding to a top side of the display panel 160) of the sub-pixel 2400 and a second side (e.g., corresponding to a bottom side of the display panel 160) of the sub-pixel 2400, as in a cross-sectional view of A-A'. Since the first light transmittance portion 2321 includes the first portion 2390-1 of the opaque member 2390, light emitted from the sub-pixel 2400 may be biased toward a third side and a fourth side of the sub-pixel 2400 (e.g., corresponding to a left side of the display panel 160 and a right side of the display panel 160), except for the first side and the second side of the sub-pixel 2400, as indicated by an indication 2491 and an indication 2492.

Referring to FIG. 24B, the first layer 2401 may include a sub-pixel 2400, which is a sub-pixel among the second sub-pixels 2302. The second layer 2402 may include a second light transmittance portion 2322 aligned with the sub-pixel 2400. The third layer 2403 may include a filter portion 2431 aligned with the sub-pixel 2400 and an opaque member 2432 surrounding the filter portion 2431. The fourth layer 2404 may include an opaque member 2450 and a light transmittance portion 2451 (or a light path portion 2451) defined by the opaque member 2450. The light transmittance portion 2451 may be aligned with the sub-pixel 2460.

The second light transmittance portion 2322 may include a second portion 2390-2 of the opaque member 2390 biased toward a third side (e.g., corresponding to a left side of the display panel 160) and a fourth side (e.g., corresponding to a right side of the display panel 160) of the sub-pixel 2460, as in a cross-sectional view of D-D'. Since the second light transmittance portion 2322 includes the second portion 2390-2 of the opaque member 2390, light emitted from the sub-pixel 2460 may be biased toward a first side and a second side of the sub-pixel 2460 (e.g., corresponding to a top side of the display panel 160 and a bottom side of the display panel 160), except for the third side and the fourth side of the sub-pixel 2460, as indicated by an indication 2493 and an indication 2494.

The first light transmittance portion, the second light transmittance portion, the first sub-pixels, and the second sub-pixels described with reference to FIG. 23, FIG. 24A, and FIG. 24B may be variously arranged in the display panel 160. This arrangement is described with reference to FIG. 25.

Figure 25:
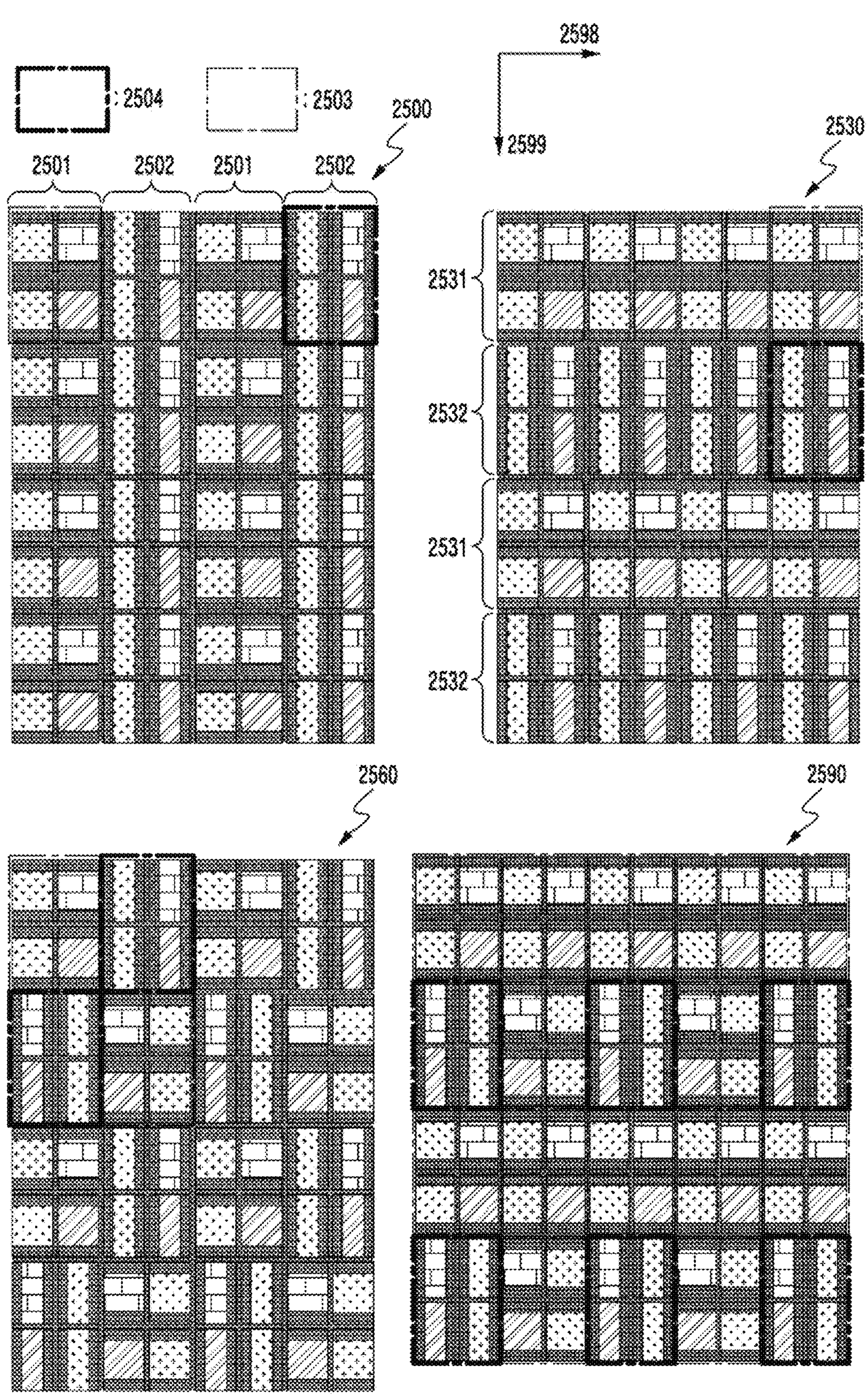
FIG. 25 illustrates a twenty-sixth example configuration, a twenty-seventh example configuration, a twenty-eighth example configuration, and a twenty-ninth example configuration of a display panel according to an embodiment of the disclosure.

FIG. 25 illustrates a twenty-sixth example configuration, a twenty-seventh example configuration, a twenty-eighth example configuration, and a twenty-ninth example configuration of a display panel according to an embodiment of the disclosure.

Referring to FIG. 25, four sub-pixels among first sub-pixels 2301 in the display panel 160 according to the twenty-sixth example configuration 2500 may be included in each of groups 2503, and four sub-pixels among second sub-pixels 2302 in the display panel 160 according to the twenty-sixth example configuration 2500 may be included in each of groups 2504. First sub-pixel groups 2501 may include the groups 2503, and second sub-pixel groups 2502 may include the groups 2504. Each of the first sub-pixel groups 2501 may include the groups 2503 arranged in a direction 2599 (or a vertical direction 2599). Each of the second sub-pixel groups 2502 may include the groups 2504 arranged in the direction 2599. The first sub-pixel groups

2501 and the second sub-pixel groups 2502 may alternate with each other in a direction 2598 (or a horizontal direction 2598).

Four sub-pixels among the first sub-pixels 2301 in the display panel 160 according to the twenty-seventh example configuration 2530 may be included in each of the groups 2503, and four sub-pixels among the second sub-pixels 2302 in the display panel 160 according to the twenty-seventh example configuration 2530 may be included in each of the groups 2504. The first sub-pixel groups 2531 may include the groups 2503, and the second sub-pixel groups 2532 may include the groups 2504. Each of the first sub-pixel groups 2531 may include the groups 2503 arranged in the direction 2598. Each of the second sub-pixel groups 2532 may include the groups 2504 arranged in the direction 2598. The first sub-pixel groups 2531 and the second sub-pixel groups 2532 may alternate with each other in the direction 2599.

Four sub-pixels among the first sub-pixels 2301 in the display panel 160 according to the twenty-eighth example configuration 2560 may be included in each of the groups 2503, and four sub-pixels among the second sub-pixels 2302 in the display panel 160 according to the twenty-eighth example configuration 2560 may be included in each of the groups 2504. The groups 2503 and the groups 2504 may alternate with each other. For example, a first portion of the groups 2503 and a first portion of the groups 2504 may alternate in the direction 2598, and a second portion of the groups 2503 and a second portion of the groups 2504 may alternate in the direction 2599.

The number of the first sub-pixels 2301 in the display panel 160 according to the twenty-ninth example configuration 2590 and the number of the second sub-pixels 2302 in the display panel 160 according to the twenty-ninth example configuration 2590 may be different from each other. As a non-limiting example, as illustrated in FIG. 25, the number of the first sub-pixels 2301 in the display panel 160 according to the twenty-ninth example configuration 2590 may be greater than the number of the second sub-pixels 2302 in the display panel 160 according to the twenty-ninth example configuration 2590. Although not illustrated in FIG. 25, the number of the first sub-pixels 2301 in the display panel 160 according to the twenty-ninth example configuration 2590 may be smaller than the number of the second sub-pixels 2302 in the display panel 160 according to the twenty-ninth example configuration 2590.

At least a portion of arrangements illustrated in FIG. 25 may be combined in the display panel 160. For example, the display panel 160 may include a first display area according to the twenty-sixth example configuration 2500, a second display area according to the twenty-seventh example configuration 2530, a third display area according to the twenty-eighth example configuration 2560, and/or a fourth display area according to the twenty-ninth example configuration 2590.

FIG. 25 illustrates a display panel 160 including both the first sub-pixels 2301 and the second sub-pixels 2302, but it is only one embodiment. The display panel 160 may include the first sub-pixels 2301 among the first sub-pixels 2301 and the second sub-pixels 2302, or may include the second sub-pixels 2302 among the first sub-pixels 2301 and the second sub-pixels 2302. The display panel 160 including the first sub-pixels 2301 among the first sub-pixels 2301 and the second sub-pixels 2302 may further include sub-pixels providing a wider viewing angle than the first sub-pixels 2301. The display panel 160 including the second sub-pixels 2302 among the first sub-pixels 2301 and the second sub-pixels 2302 may further include sub-pixels providing a wider viewing angle than the second sub-pixels 2302.

One or more of the example configurations described above may be combined. For example, the display panel 160 may include a first display area of the display panel 160 to which an example configuration among the example configurations is applied, and a second display area of the display panel 160 to which another example configuration among the example configurations is applied.

The electronic device 100 may be a foldable electronic device. The foldable electronic device 100 may include a housing including a first housing part and a second housing part rotatably coupled to the first housing part. A display panel 160 of the foldable electronic device 100 may be flexible. The flexible display panel 160 may include a bendable portion when the first housing part and the second housing part are folded. The flexible display panel 160 may include a first display area corresponding to the first housing part and a second display area, extending from the first display area, corresponding to the second housing part. An angle between the first display area and the second display area may vary according to a state of the foldable electronic device 100. The state of the electronic device 100 may include a folded state of the electronic device 100, a half-folded state (or a partially folded state) of the electronic device 100, and an unfolded state of the electronic device 100.

Since the angle varies according to a state of the foldable electronic device 100, a privacy display mode provided through the first display area may be different from a privacy display mode provided through the second display area. In order to provide the privacy display mode provided through the first display area and the privacy display mode provided through the second display area differently from each other, the flexible display panel 160 may have a first structure according to an example configuration among the example configurations described above in relation to the first display area, and may have a second structure according to another example configuration among the example configurations described above in relation to the second display area. Combining the example configuration for the first structure and the other example configuration for the second structure is described with reference to FIG. 26.

Figure 26:
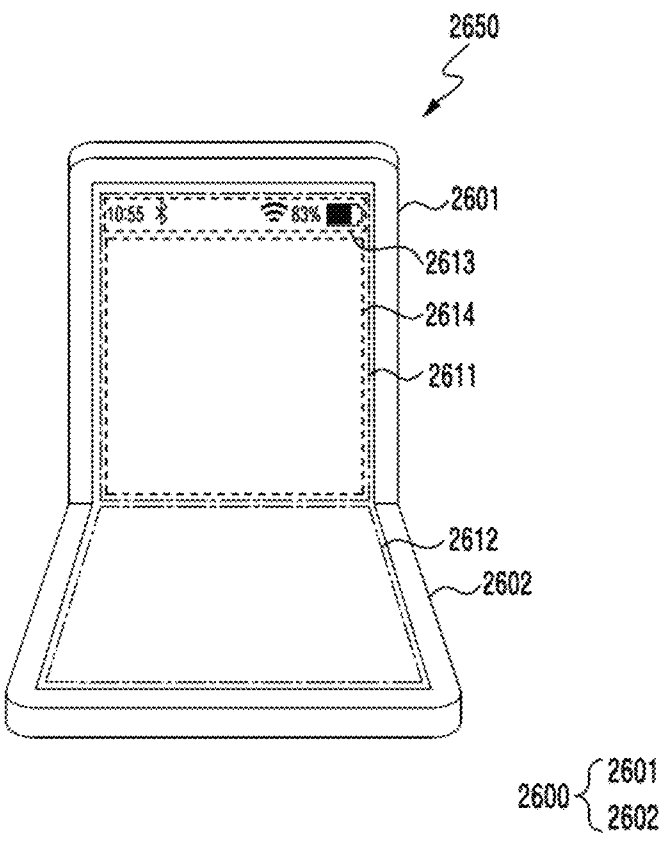
FIG. 26 illustrates a method of providing a privacy display mode reducing visibility of a display panel 160 from a first side and/or a second side through a first display area and providing a privacy display mode reducing visibility of the display panel 160 from a third side and/or a fourth side through a second display area according to an embodiment of the disclosure.

FIG. 26 illustrates a method of providing a privacy display mode reducing visibility of a display panel 160 from a first side and/or a second side through a first display area and providing a privacy display mode reducing visibility of the display panel 160 from a third side and/or a fourth side through a second display area according to an embodiment of the disclosure.

Referring to FIG. 26, a foldable electronic device 100 may include a housing 2600 including a first housing part 2601 and a second housing part 2602 rotatably coupled with the first housing part 2601. The foldable electronic device 100 may be in an unfolded state of the foldable electronic device 100 in which the first housing part 2601 and the second housing part 2602 are (fully) unfolded, a folded state of the electronic device 100 in which the first housing part 2601 and the second housing part 2602 are (fully) folded, or a partially folded state 2650 of the electronic device 100 between the unfolded state and the folded state. The partially folded state 2650 may be described as a half-folded state 2650.

The display panel 160 may include a first display area 2611 corresponding to the first housing part 2601 and a second display area 2612, corresponding to the second housing part 2602, connected to the first display area 2611.

An angle between the first display area 2611 and the second display area 2612 may vary according to a state of the electronic device 100.

As a non-limiting example, at least one processor 210 of the electronic device 100 may transmit, to the display driver integrated circuitry 221, a command to provide a privacy display mode that reduces visibility from a top side of the first display area 2611 and a bottom side of the first display area 2611 and reduces visibility from a left side of the second display area 2612 and a right side of the second display area 2612, based on identifying the partially folded state 2650 of the electronic device 100, a posture of the first housing part 2601 relative to the ground, and/or a posture of the second housing part 2602 relative to the ground, or based on a user input. Based on the command, the display driver integrated circuitry 221 may provide the privacy display mode by controlling the display panel 160 to emit light from a portion (e.g., the first sub-pixel groups 2101 and the second sub-pixel groups 2102 of FIG. 21A, or the first sub-pixels 2301 of FIG. 23) of sub-pixels included in the first display area 2611 and to emit light from a portion (e.g., the third sub-pixel groups 2103 and the fourth sub-pixel groups 2104 of FIG. 21A, or the second sub-pixels 2302 of FIG. 23) of sub-pixels included in the second display area 2612.

As a non-limiting example, the first display area 2611 of the display panel 160 may include a third display area 2613 used as an indicator area. The display driver integrated circuitry 221 may provide a privacy display mode that further reduces visibility from a top side of the third display area 2613 by further controlling to emit light from a portion (e.g., the first sub-pixel groups 2101 of FIG. 21A) of sub-pixels included in the third display area 2613.

The display 220 described above may be included in an electronic device 2701 of FIG. 27.

FIG. 27 is a block diagram illustrating an electronic device in a network environment according to an embodiment of the disclosure.

Referring to FIG. 27, an electronic device 2701 in a network environment 2700 may communicate with an electronic device 2702 via a first network 2798 (e.g., a short-range wireless communication network), or at least one of an electronic device 2704 or a server 2708 via a second network 2799 (e.g., a long-range wireless communication network). According to an embodiment, the electronic device 2701 may communicate with the electronic device 2704 via the server 2708. According to an embodiment, the electronic device 2701 may include a processor 2720, memory 2730, an input module 2750, a sound output module 2755, a display module 2760, an audio module 2770, a sensor module 2776, an interface 2777, a connecting terminal 2778, a haptic module 2779, a camera module 2780, a power management module 2788, a battery 2789, a communication module 2790, a subscriber identification module(SIM) 2796, or an antenna module 2797. In some embodiments, at least one of the components (e.g., the connecting terminal 2778) may be omitted from the electronic device 2701, or one or more other components may be added in the electronic device 2701. In some embodiments, some of the components (e.g., the sensor module 2776, the camera module 2780, or the antenna module 2797) may be implemented as a single component (e.g., the display module 2760).

The processor 2720 may execute, for example, software (e.g., a program 2740) to control at least one other component (e.g., a hardware or software component) of the electronic device 2701 coupled with the processor 2720, and may perform various data processing or computation. According to an embodiment, as at least part of the data processing or computation, the processor 2720 may store a command or data received from another component (e.g., the sensor module 2776 or the communication module 2790) in volatile memory 2732, process the command or the data stored in the volatile memory 2732, and store resulting data in non-volatile memory 2734. According to an embodiment, the processor 2720 may include a main processor 2721 (e.g., a central processing unit (CPU) or an application processor (AP)), or an auxiliary processor 2723 (e.g., a graphics processing unit (GPU), a neural processing unit (NPU), an image signal processor (ISP), a sensor hub processor, or a communication processor (CP)) that is operable independently from, or in conjunction with, the main processor 2721. For example, when the electronic device 2701 includes the main processor 2721 and the auxiliary processor 2723, the auxiliary processor 2723 may be adapted to consume less power than the main processor 2721, or to be specific to a specified function. The auxiliary processor 2723 may be implemented as separate from, or as part of the main processor 2721.

The auxiliary processor 2723 may control at least some of functions or states related to at least one component (e.g., the display module 2760, the sensor module 2776, or the communication module 2790) among the components of the electronic device 2701, instead of the main processor 2721 while the main processor 2721 is in an inactive (e.g., sleep) state, or together with the main processor 2721 while the main processor 2721 is in an active state (e.g., executing an application). According to an embodiment, the auxiliary processor 2723 (e.g., an image signal processor or a communication processor) may be implemented as part of another component (e.g., the camera module 2780 or the communication module 2790) functionally related to the auxiliary processor 2723. According to an embodiment, the auxiliary processor 2723 (e.g., the neural processing unit) may include a hardware structure specified for artificial intelligence model processing. An artificial intelligence model may be generated by machine learning. Such learning may be performed, e.g., by the electronic device 2701 where the artificial intelligence is performed or via a separate server (e.g., the server 2708). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 2730 may store various data used by at least one component (e.g., the processor 2720 or the sensor module 2776) of the electronic device 2701. The various data may include, for example, software (e.g., the program 2740) and input data or output data for a command related thereto. The memory 2730 may include the volatile memory 2732 or the non-volatile memory 2734.

The program 2740 may be stored in the memory 2730 as software, and may include, for example, an operating system (OS) 2742, middleware 2744, or an application 2746.

The input module 2750 may receive a command or data to be used by another component (e.g., the processor 2720)

of the electronic device 2701, from the outside (e.g., a user) of the electronic device 2701. The input module 2750 may include, for example, a microphone, a mouse, a keyboard, a key (e.g., a button), or a digital pen (e.g., a stylus pen).

The sound output module 2755 may output sound signals to the outside of the electronic device 2701. The sound output module 2755 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 2760 may visually provide information to the outside (e.g., a user) of the electronic device 2701. The display module 2760 may include, for example, a display, a hologram device, or a projector and control circuitry to control a corresponding one of the display, hologram device, and projector. According to an embodiment, the display module 2760 may include a touch sensor adapted to detect a touch, or a pressure sensor adapted to measure the intensity of force incurred by the touch.

The audio module 2770 may convert a sound into an electrical signal and vice versa. According to an embodiment, the audio module 2770 may obtain the sound via the input module 2750, or output the sound via the sound output module 2755 or a headphone of an external electronic device (e.g., an electronic device 2702) directly (e.g., wiredly) or wirelessly coupled with the electronic device 2701.

The sensor module 2776 may detect an operational state (e.g., power or temperature) of the electronic device 2701 or an environmental state (e.g., a state of a user) external to the electronic device 2701, and then generate an electrical signal or data value corresponding to the detected state. According to an embodiment, the sensor module 2776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2777 may support one or more specified protocols to be used for the electronic device 2701 to be coupled with the external electronic device (e.g., the electronic device 2702) directly (e.g., wiredly) or wirelessly. According to an embodiment, the interface 2777 may include, for example, a high definition multimedia interface (HDMI), a universal serial bus (USB) interface, a secure digital (SD) card interface, or an audio interface.

A connecting terminal 2778 may include a connector via which the electronic device 2701 may be physically connected with the external electronic device (e.g., the electronic device 2702). According to an embodiment, the connecting terminal 2778 may include, for example, an HDMI connector, a USB connector, an SD card connector, or an audio connector (e.g., a headphone connector).

The haptic module 2779 may convert an electrical signal into a mechanical stimulus (e.g., a vibration or a movement) or electrical stimulus which may be recognized by a user via his tactile sensation or kinesthetic sensation. According to an embodiment, the haptic module 2779 may include, for example, a motor, a piezoelectric element, or an electric stimulator.

The camera module 2780 may capture a still image or moving images. According to an embodiment, the camera module 2780 may include one or more lenses, image sensors, image signal processors, or flashes.

The power management module 2788 may manage power supplied to the electronic device 2701. According to an embodiment, the power management module 2788 may be implemented as at least part of, for example, a power management integrated circuit (PMIC).

The battery 2789 may supply power to at least one component of the electronic device 2701. According to an embodiment, the battery 2789 may include, for example, a primary cell which is not rechargeable, a secondary cell which is rechargeable, or a fuel cell.

The communication module 2790 may support establishing a direct (e.g., wired) communication channel or a wireless communication channel between the electronic device 2701 and the external electronic device (e.g., the electronic device 2702, the electronic device 2704, or the server 2708) and performing communication via the established communication channel. The communication module 2790 may include one or more communication processors that are operable independently from the processor 2720 (e.g., the application processor (AP)) and supports a direct (e.g., wired) communication or a wireless communication. According to an embodiment, the communication module 2790 may include a wireless communication module 2792 (e.g., a cellular communication module, a short-range wireless communication module, or a global navigation satellite system (GNSS) communication module) or a wired communication module 2794 (e.g., a local area network (LAN) communication module or a power line communication (PLC) module). A corresponding one of these communication modules may communicate with the external electronic device via the first network 2798 (e.g., a short-range communication network, such as Bluetooth™, wireless-fidelity (Wi-Fi) direct, or infrared data association (IrDA)) or the second network 2799 (e.g., a long-range communication network, such as a legacy cellular network, a fifth generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 2792 may identify and authenticate the electronic device 2701 in a communication network, such as the first network 2798 or the second network 2799, using subscriber information (e.g., international mobile subscriber identity (IMSI)) stored in the subscriber identification module 2796.

The wireless communication module 2792 may support a 5G network, after a fourth generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 2792 may support a high-frequency band (e.g., the millimeter wave (mmWave) band) to achieve, e.g., a high data transmission rate. The wireless communication module 2792 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 2792 may support various requirements specified in the electronic device 2701, an external electronic device (e.g., the electronic device 2704), or a network system (e.g., the second network 2799). According to an embodiment, the wireless communication module 2792 may support a peak data rate (e.g., 20 Gbps or more) for implementing eMBB, loss coverage (e.g., 2764 dB or less) for implementing mMTC, or U-plane latency (e.g., 0.5 ms or less for each of downlink (DL) and uplink (UL), or a round trip of 27 ms or less) for implementing URLLC.

The antenna module 2797 may transmit or receive a signal or power to or from the outside (e.g., the external electronic device) of the electronic device 2701. According to an embodiment, the antenna module 2797 may include an antenna including a radiating element composed of a conductive material or a conductive pattern formed in or on a substrate (e.g., a printed circuit board (PCB)). According to an embodiment, the antenna module 2797 may include a plurality of antennas (e.g., array antennas). In such a case, at least one antenna appropriate for a communication scheme used in the communication network, such as the first network 2798 or the second network 2799, may be selected, for example, by the communication module 2790 (e.g., the wireless communication module 2792) from the plurality of antennas. The signal or the power may then be transmitted or received between the communication module 2790 and the external electronic device via the selected at least one antenna. According to an embodiment, another component (e.g., a radio frequency integrated circuit (RFIC)) other than the radiating element may be additionally formed as part of the antenna module 2797.

According to various embodiments, the antenna module 2797 may form a mmWave antenna module. According to an embodiment, the mmWave antenna module may include a printed circuit board, an RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 2701 and the external electronic device 2704 via the server 2708 coupled with the second network 2799. Each of the electronic devices 2702 or 2704 may be a device of a same type as, or a different type, from the electronic device 2701. According to an embodiment, all or some of operations to be executed at the electronic device 2701 may be executed at one or more of the external electronic devices 2702 or 2704 or server 2708. For example, if the electronic device 2701 should perform a function or a service automatically, or in response to a request from a user or another device, the electronic device 2701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2701. The electronic device 2701 may provide the outcome, with or without further processing of the outcome, as at least part of a reply to the request. To that end, a cloud computing, distributed computing, mobile edge computing (MEC), or client-server computing technology may be used, for example. The electronic device 2701 may provide ultra low-latency services using, e.g., distributed computing or mobile edge computing. In another embodiment, the external electronic device 2704 may include an internet-of-things (IoT) device. The server 2708 may be an intelligent server using machine learning and/or a neural network. According to an embodiment, the external electronic device 2704 or the server 2708 may be included in the second network 2799. The electronic device 2701 may be applied to intelligent services (e.g., smart home, smart city, smart car, or healthcare) based on 5G communication technology or IoT-related technology.

FIG. 28 is a block diagram illustrating a display module according to an embodiment of the disclosure.

Referring to FIG. 28, a block diagram 2800 illustrates a display module 2760 may include a display 2810 and a display driver integrated circuit (DDI) 2830 to control the display 2810. The DDI 2830 may include an interface module 2831, memory 2833 (e.g., buffer memory), an image processing module 2835, or a mapping module 2837. The DDI 2830 may receive image information that contains image data or an image control signal corresponding to a command to control the image data from another component of the electronic device 2701 via the interface module 2831. For example, according to an embodiment, the image information may be received from the processor 2720 (e.g., the main processor 2721 (e.g., an application processor)) or the auxiliary processor 2723 (e.g., a graphics processing unit) operated independently from the function of the main processor 2721. The DDI 2830 may communicate, for example, with touch circuitry 2850 or the sensor module 2776 via the interface module 2831. The DDI 2830 may also store at least part of the received image information in the memory 2833, for example, on a frame by frame basis. The image processing module 2835 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 2810. The mapping module 2837 may generate a voltage value or a current value corresponding to the image data pre-processed or post-processed by the image processing module 2835. According to an embodiment, the generating of the voltage value or current value may be performed, for example, based at least in part on one or more attributes of the pixels (e.g., an array, such as a red, green, and blue (RGB) stripe or a pentile structure, of the pixels, or the size of each subpixel). At least some pixels of the display 2810 may be driven, for example, based at least in part on the voltage value or the current value such that visual information (e.g., a text, an image, or an icon) corresponding to the image data may be displayed via the display 2810.

According to an embodiment, the display module 2760 may further include the touch circuitry 2850. The touch circuitry 2850 may include a touch sensor 2851 and a touch sensor IC 2853 to control the touch sensor 2851. The touch sensor IC 2853 may control the touch sensor 2851 to sense a touch input or a hovering input with respect to a certain position on the display 2810. To achieve this, for example, the touch sensor 2851 may detect (e.g., measure) a change in a signal (e.g., a voltage, a quantity of light, a resistance, or a quantity of one or more electric charges) corresponding to the certain position on the display 2810. The touch circuitry 2850 may provide input information (e.g., a position, an area, a pressure, or a time) indicative of the touch input or the hovering input detected via the touch sensor 2851 to the processor 2720. According to an embodiment, at least part (e.g., the touch sensor IC 2853) of the touch circuitry 2850 may be formed as part of the display 2810 or the DDI 2830, or as part of another component (e.g., the auxiliary processor 2723) disposed outside the display module 2760.

According to an embodiment, the display module 2760 may further include at least one sensor (e.g., a fingerprint sensor, an iris sensor, a pressure sensor, or an illuminance sensor) of the sensor module 2776 or a control circuit for the at least one sensor. In such a case, the at least one sensor or the control circuit for the at least one sensor may be embedded in one portion of a component (e.g., the display 2810, the DDI 2830, or the touch circuitry 2850)) of the display module 2760. For example, when the sensor module 2776 embedded in the display module 2760 includes a biometric sensor (e.g., a fingerprint sensor), the biometric sensor may obtain biometric information (e.g., a fingerprint image) corresponding to a touch input received via a portion of the display 2810. As another example, when the sensor module 2776 embedded in the display module 2760 includes a pressure sensor, the pressure sensor may obtain pressure information corresponding to a touch input received via a partial or whole area of the display 2810. According to an embodiment, the touch sensor 2851 or the sensor module 2776 may be disposed between pixels in a pixel layer of the display 2810, or over or under the pixel layer.

The technical problems to be achieved in this document are not limited to those described above, and other technical problems not mentioned herein will be clearly understood by those having ordinary knowledge in the art to which the disclosure belongs, from the following description.

As described above, an electronic device (e.g., the electronic device 100) may comprise a display (e.g., the display 220) including first pixel groups and second pixel groups. When viewed from outside the display, the first pixel groups (e.g., the sub-pixel group 421) may be viewable based on a first viewing angle, and the second pixel groups (e.g., the sub-pixel group 411) may be viewable based on a second viewing angle wider than the first viewing angle. When viewed in a direction substantially perpendicular to the display, a center (e.g., one of the centers 455) of a pixel group among the first pixel groups surrounded by a plurality of pixel groups among the second pixel groups may substantially coincide with a center of a virtual polygon that connects centers (e.g., centers corresponding to the center 454) of the plurality of pixel groups among the second pixel groups.

The virtual polygon may be a virtual quadrilateral having a rhombus (diamond) shape.

The center of the pixel group among the first pixel groups may be defined by a center of another virtual polygon that connects centers of a first plurality of sub-pixels included in the pixel group.

The other virtual polygon may be a virtual quadrilateral having a rhombus (diamond) shape.

The first plurality of sub-pixels may include a first sub-pixel configured to emit light of a first color, a second sub-pixel configured to emit light of a second color different from the first color, a third sub-pixel configured to emit light of a third color different from the first color and the second color, and a fourth sub-pixel configured to emit light of the third color.

The first color may be blue, the second color may be red, and the third color may be green.

Each of the centers of the plurality of pixel groups among the second pixel groups may be defined by a center of another virtual polygon that connects centers of a second plurality of sub-pixels included in each of the plurality of pixel groups.

The second plurality of sub-pixels may include a fifth sub-pixel configured to emit light of a fourth color, a sixth sub-pixel configured to emit light of a fifth color different from the fourth color, a seventh sub-pixel configured to emit light of a sixth color different from the fourth color and the fifth color, and an eighth sub-pixel configured to emit light of the sixth color.

The fourth color may be blue, the fifth color may be red, and the sixth color may be green.

When viewed in a direction substantially perpendicular to the display, a center of a pixel group among the second pixel groups surrounded by a plurality of pixel groups among the first pixel groups may substantially coincide with a center of yet another virtual polygon that connects centers of the plurality of pixel groups among the first pixel groups.

The display may include a plurality of scan lines electrically connected to the first pixel groups and the second pixel groups. At least a portion of the first plurality of sub-pixels and at least a portion of the second plurality of sub-pixels may be electrically connected to a first scan line among the plurality of scan lines, and at least another portion of the first plurality of sub-pixels and at least another portion of the second plurality of sub-pixels may be electrically connected to a second scan line among the plurality of scan lines.

The second scan line may be disposed after the first scan line among the plurality of scan lines.

Each of the first plurality of sub-pixels and the second plurality of sub-pixels may include four sub-pixels, and three sub-pixels among the first plurality of sub-pixels and one sub-pixel among the second plurality of sub-pixels may be electrically connected to the first scan line (e.g., the scan line 491), and remaining one sub-pixel among the first plurality of sub-pixels and remaining three sub-pixels among the second plurality of sub-pixels may be electrically connected to the second scan line (e.g., the scan line 492).

The first sub-pixel, the second sub-pixel, the third sub-pixel, and the fifth sub-pixel may be electrically connected to the first scan line, and the fourth sub-pixel, the sixth sub-pixel, the seventh sub-pixel, and the eighth sub-pixel may be electrically connected to the second scan line.

Each of the first plurality of sub-pixels and the second plurality of sub-pixels may include four sub-pixels, and two sub-pixels among the first plurality of sub-pixels and two sub-pixels among the second plurality of sub-pixels may be electrically connected to the first scan line (e.g., the scan line 991), and remaining two sub-pixels among the first plurality of sub-pixels and remaining two sub-pixels among the second plurality of sub-pixels may be electrically connected to the second scan line (e.g., the scan line 992).

The first sub-pixel, the third sub-pixel, the fifth sub-pixel, and the seventh sub-pixel may be electrically connected to the first scan line, and the second sub-pixel, the fourth sub-pixel, the sixth sub-pixel, and the eighth sub-pixel may be electrically connected to the second scan line.

As light emitted from a first plurality of sub-pixels included in each of the first pixel groups is at least partially blocked by a first opaque member positioned above (or on) a first pixel definition layer (PDL) formed between the first plurality of sub-pixels, each of the first pixel groups may be viewable based on the first viewing angle from outside of the display.

As an opaque member is not disposed on a second PDL formed between a second plurality of sub-pixels included in each of the second pixel groups or light emitted from the second plurality of sub-pixels is at least partially blocked by a second opaque member positioned above the second PDL and having a narrower width than the first opaque member, each of the second pixel groups may be viewable based on the second viewing angle from outside of the display.

As described above, a display (e.g., the display 220) may comprise gate driver circuitry (e.g., the gate driver circuitry 222) and a display panel (e.g., the display panel 160). The display panel may include a first layer including a black matrix (BM) that defines first light transmittance portions and second light transmittance portions. The first light transmittance portions and the second light transmittance portions may alternate with each other. Each of the second light transmittance portions may include third light transmittance portions, smaller than the first light transmittance portions. The display panel may include a second layer, disposed below the first layer, including light emitting diodes (LEDs). The LEDs may include first groups of LEDs that are respectively disposed below the first light transmittance portions, and second groups of LEDs. Each of the second groups of LEDs may include LEDs respectively disposed below the third light transmittance portions included in each of the second light transmittance portions. Sub-pixels, respectively including the LEDs included in each of the second groups of LEDs, may include a first sub-pixel electrically connected to the gate driver circuitry through a scan line, and second sub-pixels electrically connected to the gate driver circuitry through another scan line positioned alongside the scan line electrically connected to the first sub-pixel.

Sub-pixels, respectively including LEDs included in each of the first groups of LEDs, may include a third sub-pixel electrically connected to the gate driver circuitry through a scan line, and fourth sub-pixels electrically connected to the gate driver circuitry through another scan line positioned alongside the scan line electrically connected to the third sub-pixel.

The scan line electrically connected to the first sub-pixel may be electrically connected to the fourth sub-pixels. The scan line electrically connected to the third sub-pixel may be electrically connected to the second sub-pixels.

The number of the sub-pixels respectively including the LEDs included in each of the first groups of LEDs may be 4. The number of the sub-pixels respectively including the LEDs included in each of the second groups of LEDs may be 4. The number of the second sub-pixels may be 3. The number of the fourth sub-pixels may be 3.

The display may comprise source driver circuitry (e.g., the source driver circuitry 223), and display driver integrated circuitry (DDIC) (e.g., the display driver integrated circuitry 221) configured to provide a privacy display mode by disabling to emit light from the LEDs included in each of the first groups of LEDs. Disabling to emit light from the LEDs included in each of the first groups of LEDs may be performed based on controlling the source driver circuitry to provide a data voltage corresponding to a black color to the fourth sub-pixels before controlling the gate driver circuitry to perform a scan through a scan line electrically connected to the first sub-pixel and the fourth sub-pixels, and controlling the source driver circuitry to provide the data voltage to the third sub-pixel before controlling the gate driver circuitry to perform a scan through a scan line electrically connected to the second sub-pixels and the third sub-pixel.

The display may comprise emission driver circuitry (e.g., the emission driver circuitry 224), and display driver integrated circuitry (DDIC) (e.g., display driver integrated circuitry 221) configured to provide a privacy display mode by disabling to emit light from the LEDs included in each of the first groups of LEDs. Disabling to emit light from the LEDs included in each of the first groups of LEDs may be performed based on controlling the emission driver circuitry to bypass providing an emission signal to the fourth sub-pixels after controlling the gate driver circuitry to perform a scan through a scan line electrically connected to the first sub-pixel and the fourth sub-pixels, and controlling the emission driver circuitry to bypass providing an emission signal to the third sub-pixel after controlling the gate driver circuitry to perform a scan through a scan line electrically connected to the second sub-pixels and the third sub-pixel.

The first sub-pixel may include an LED configured to emit light of a first color. The second sub-pixels may respectively include an LED configured to emit light of a second color, an LED configured to emit light of the second color, and an LED configured to emit light of a third color. The third sub-pixel may include an LED configured to emit light of the first color. The fourth sub-pixels may include an LED configured to emit light of the second color, an LED configured to emit light of the second color, and an LED configured to emit light of the third color.

The first sub-pixel may include an LED configured to emit light of a second color. The second sub-pixels may respectively include an LED configured to emit light of a first color, an LED configured to emit light of the second color, and an LED configured to emit light of a third color. The third sub-pixel may include an LED configured to emit light of the second color. The fourth sub-pixels may include an LED configured to emit light of the first color, an LED configured to emit light of the second color, and an LED configured to emit light of the third color.

A center of one of the first light transmittance portions may substantially correspond to a center of a polygon defined by connecting centers of some of the second light transmittance portions surrounding the one of the first light transmittance portions.

A center of one of the second light transmittance portions may substantially correspond to a center of a polygon defined by connecting centers of some of the first light transmittance portions surrounding the one of the second light transmittance portions.

The polygon may comprise a rhombus or a square.

A center of one of the first groups of LEDs may substantially correspond to a center of a polygon defined by connecting centers of some of the second groups of LEDs surrounding the one of the first groups of LEDs.

The center of the one of the first groups of LEDs may substantially correspond to a center of a polygon defined by connecting centers of LEDs included in the one of the first groups of LEDs.

A center of one of the second groups of LEDs may substantially correspond to a center of a polygon defined by connecting centers of some of the first groups of LEDs surrounding the one of the second groups of LEDs.

The polygon may comprise a rhombus or a square.

Light transmitted through the first light transmittance portions from the LEDs included in the first groups of LEDs may have a first viewing angle. Light transmitted through the third light transmittance portions from the LEDs included in the second groups of LEDs may have a second viewing angle narrower than the first viewing angle.

As described above, an electronic device (e.g., the electronic device 100) may comprise gate driver circuitry (e.g., the gate driver circuitry 222) and a display panel (e.g., the display panel 160). The display panel may include a first layer including a black matrix (BM) defining first light transmittance portions and second light transmittance portions. The first light transmittance portions and the second light transmittance portions may alternate with each other. Each of the second light transmittance portions may include third light transmittance portions smaller than the first light transmittance portions. The display panel may include a second layer, disposed below the first layer, including light emitting diodes (LEDs). The LEDs may include first groups of LEDs respectively disposed below the first light transmittance portions, and second groups of LEDs, and each of the second groups of LEDs may include LEDs respectively disposed below the third light transmittance portions included in the second light transmittance portions. Sub-pixels respectively including the LEDs included in each of the second groups of LEDs may include a first sub-pixel electrically connected to the gate driver circuitry through a scan line, and second sub-pixels electrically connected to the gate driver circuitry through another scan line positioned alongside the scan line electrically connected to the first sub-pixel.

Sub-pixels, respectively including the LEDs included in each of the first groups of LEDs, may include a third sub-pixel electrically connected to the gate driver circuitry through a scan line, and fourth sub-pixels electrically connected to the gate driver circuitry through another scan line positioned alongside the scan line electrically connected to the third sub-pixel.

The scan line electrically connected to the first sub-pixel may be electrically connected to the fourth sub-pixels. The scan line electrically connected to the third sub-pixel may be electrically connected to the second sub-pixels.

The number of the sub-pixels respectively including the LEDs included in each of the first groups of LEDs may be 4. The number of the sub-pixels respectively including the LEDs included in each of the second groups of LEDs may be 4. The number of the second sub-pixels may be 3. The number of the fourth sub-pixels may be 3.

As described above, an electronic device (e.g., the electronic device 100) may include a display (e.g., the display 220) configured to provide a first display mode viewable based on a first viewing angle and a second display mode viewable based on a second viewing angle narrower than the first viewing angle. The display may include a pixel layer (e.g., the layer 601) including a first pixel group including a first sub-pixel configured to emit light of a designated color and a second pixel group including a second sub-pixel configured to emit light of the designated color, and a light blocking layer (e.g., the other layer 602) that defines a first light transmittance portion, disposed above the first sub-pixel, having a first width corresponding to the first viewing angle, and a second light transmittance portion, disposed above the second sub-pixel, having a second width corresponding to the second viewing angle, the second width smaller than the first width.

As a first example, to the Nth and (N+1)th data lines (e.g., the Nth data line 1093 and the (N+1)th data line 1094 of FIG. 10B that are connected to the source driver circuitry 222), the first pixel group may be connected and the second pixel group may not be connected, and to the (N+2)th data line (e.g., the (N+2)th data line 1096 of FIG. 10B that is connected to the source driver circuitry 222), the first pixel group may not be connected and the second pixel group may be connected.

As a second example, to the Nth scan line (e.g., the scan line 1092 of FIG. 10C), the first pixel group may be connected and the second pixel group may not be connected, and to the (N+1)th scan line (e.g., the scan line 1091 of FIG. 10C), the first pixel group may not be connected and the second pixel group may be connected.

As a third example, as illustrated in FIG. 10D, to a scan line, a sub-pixel included in the first pixel group and a sub-pixel included in the second pixel group may be alternately connected.

As described above, an electronic device (e.g., the electronic device 100) may comprise a display (e.g., the display 220) configured to provide a first display mode viewable based on a first viewing angle and a second display mode viewable based on at least one of a second viewing angle narrower than the first viewing angle or a third viewing angle narrower than the second viewing angle. The display may include a pixel layer (e.g., the first layer 1701 of FIG. 17) including a first pixel group (e.g., first sub-pixel groups 1601) including a first sub-pixel configured to emit light of a designated color, a second pixel group (e.g., second sub-pixel groups 1602) including a second sub-pixel configured to emit light of the designated color, and a third pixel group (e.g., third sub-pixel groups 1603) including a third sub-pixel configured to emit light of the designated color, and a light blocking layer (e.g., the second layer 1702) defining a first light transmittance portion (e.g., the first light transmittance portion 1621), disposed above the first sub-pixel, having a first width corresponding to the first viewing angle, a second light transmittance portion (e.g., the second light transmittance portion 1622), disposed above the second sub-pixel, having a second width corresponding to the second viewing angle and narrower than the first width, and a third light transmittance portion (e.g., the third light transmittance portion 1623), disposed above the third sub-pixel, having a third width corresponding to the third viewing angle and narrower than the second width.

As an example, the second display mode may be viewable based on at least one of the second viewing angle, the third viewing angle, or a fourth viewing angle narrower than the third viewing angle. The pixel layer may include a fourth pixel group (e.g., the fourth sub-pixel groups 1604) including a fourth sub-pixel configured to emit light of the designated color. The light blocking layer may define a fourth light transmittance portion (e.g., the fourth light transmittance portion 1624), disposed above the fourth sub-pixel, having a fourth width corresponding to the fourth viewing angle and narrower than the third width.

As described above, an electronic device (e.g., the electronic device 100) may comprise a display (e.g., the display 220) configured to provide a first display mode viewable based on a first viewing angle and a second display mode viewable based on a second viewing angle narrower than the first viewing angle. The display may include a pixel layer (e.g., the first layer 2201) including a first pixel group including a first sub-pixel configured to emit light of a designated color, a second pixel group (e.g., the first sub-pixel groups 2101 or the third sub-pixel groups 2103) including a second sub-pixel configured to emit light of the designated color, and a third pixel group (e.g., the second sub-pixel groups 2102 or the fourth sub-pixel groups 2104) including a third sub-pixel configured to emit light of the designated color, and a light blocking layer (e.g., the second layer 2202) defining a first light transmittance portion disposed above the first sub-pixel and having a first width corresponding to the first viewing angle, a second light transmittance portion (e.g., the first light transmittance portion 2121 or the third light transmittance portion 2123) disposed above the second sub-pixel, having a second width corresponding to the second viewing angle and narrower than the first width, and a third light transmittance portion (e.g., the second light transmittance portion 2122 or the fourth light transmittance portion 2124), disposed above the third sub-pixel, having a third width corresponding to the second viewing angle narrower than the first width. The light blocking layer may include a first light blocking portion disposed in a first direction with respect to the second light transmittance portion and a second light blocking portion disposed in a second direction different from the first direction with respect to the third light transmittance portion. With respect to the second light transmittance portion, a light blocking portion may not be disposed adjacent in the second direction, and with respect to the third light transmittance portion, a light blocking portion may not be disposed adjacent in the first direction.

As an example, the first direction and the second direction may be opposite to each other.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of or all possible combinations of the items enumerated together in a corresponding one of the phrases. As used herein, such terms as "1$^{st}$" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," or "connected with" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 2740) including one or more instructions that are stored in a storage medium (e.g., internal memory 2736 or external memory 2738) that is readable by a machine (e.g., the electronic device 2701). For example, a processor (e.g., the processor 2720) of the machine (e.g., the electronic device 2701) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between a case in which data is semi-permanently stored in the storage medium and a case in which the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A display comprising:

gate driver circuitry; and a display panel including:

a first layer including a black matrix (BM) that defines first light transmittance portions and second light transmittance portions, wherein the first light transmittance portions and the second transmittance portions alternate with each other, and wherein each of the second light transmittance portions includes third light transmittance portions, smaller than the first light transmittance portions, and a second layer, disposed below the first layer, including light emitting diodes (LEDs), the LEDs including:

first groups of LEDs that are respectively disposed below the first light transmittance portions, and second groups of LEDs, wherein each of the second groups of LEDs includes LEDs respectively disposed below the third light transmittance portions included in each of the second light transmittance portions, wherein sub-pixels, respectively including the LEDs included in each of the second groups of LEDs, include:

a first sub-pixel electrically connected to the gate driver circuitry through a scan line, and second sub-pixels electrically connected to the gate driver circuitry through another scan line positioned alongside the scan line electrically connected to the first sub-pixel.

2. The display of claim 1, wherein sub-pixels, respectively including LEDs included in each of the first groups of LEDs, include:

a third sub-pixel electrically connected to the gate driver circuitry through a scan line; and fourth sub-pixels electrically connected to the gate driver circuitry through another scan line positioned alongside the scan line electrically connected to the third sub-pixel.

3. The display of claim 2, wherein a scan line electrically connected to the first sub-pixel is further electrically connected to the fourth sub-pixels, and wherein a scan line electrically connected to the third sub-pixel is further electrically connected to the second sub-pixels.

4. The display of claim 3, wherein the number of the sub-pixels respectively including the LEDs included in each of the first groups of LEDs is 4, wherein the number of the sub-pixels respectively including the LEDs included in each of the second groups of LEDs is 4, wherein the number of the second sub-pixels is 3, and wherein the number of the fourth sub-pixels is 3.

5. The display of claim 3, further comprising:

source driver circuitry; and display driver integrated circuitry (DDIC) configured to provide a privacy display mode by disabling to emit light from the LEDs included in each of the first groups of LEDs, wherein disabling to emit light from the LEDs included in each of the first groups of LEDs is performed based on:

controlling the source driver circuitry to provide a data voltage corresponding to a black color to the fourth sub-pixels before controlling the gate driver circuitry to perform a scan through a scan line electrically connected to the first sub-pixel and the fourth sub-pixels, and controlling the source driver circuitry to provide the data voltage to the third sub-pixel before controlling the gate driver circuitry to perform a scan through a scan line electrically connected to the second sub-pixels and the third sub-pixel.

6. The display of claim 3, further comprising:

emission driver circuitry; and display driver integrated circuitry (DDIC) configured to provide a privacy display mode by disabling to emit light from the LEDs included in each of the first groups of LEDs, wherein disabling to emit light from the LEDs included in each of the first groups of LEDs is performed based on:

controlling the emission driver circuitry to bypass providing an emission signal to the fourth sub-pixels after controlling the gate driver circuitry to perform a scan through a scan line electrically connected to the first sub-pixel and the fourth sub-pixels, and controlling the emission driver circuitry to bypass providing an emission signal to the third sub-pixel after controlling the gate driver circuitry to perform a scan through a scan line electrically connected to the second sub-pixels and the third sub-pixel.

7. The display of claim 3, wherein the first sub-pixel includes an LED configured to emit light of a first color, wherein the second sub-pixels respectively include:

an LED configured to emit light of a second color, an LED configured to emit light of the second color, and an LED configured to emit light of a third color, wherein the third sub-pixel includes an LED configured to emit light of the first color, and wherein the fourth sub-pixels include:

an LED configured to emit light of the second color, an LED configured to emit light of the second color, and an LED configured to emit light of the third color.

8. The display of claim 3, wherein the first sub-pixel includes an LED configured to emit light of a second color, wherein the second sub-pixels respectively include:

an LED configured to emit light of a first color, an LED configured to emit light of the second color, and an LED configured to emit light of a third color, wherein the third sub-pixel includes an LED configured to emit light of the second color, and wherein the fourth sub-pixels include:

an LED configured to emit light of the first color, an LED configured to emit light of the second color, and an LED configured to emit light of the third color.

9. The display of claim 3, wherein a center of one of the first light transmittance portions substantially corresponds to a center of a polygon defined by connecting centers of some of the second light transmittance portions surrounding the one of the first light transmittance portions.

10. The display of claim 9, wherein a center of one of the second light transmittance portions substantially corresponds to a center of a polygon defined by connecting centers of some of the first light transmittance portions surrounding the one of the second light transmittance portions.

11. The display of claim 10, wherein the polygon comprises a rhombus or a square.

12. The display of claim 3, wherein a center of one of the first groups of LEDs substantially corresponds to a center of a polygon defined by connecting centers of some of the second groups of LEDs surrounding the one of the first groups of LEDs.

13. The display of claim 12, wherein the center of the one of the first groups of LEDs substantially corresponds to a center of a polygon defined by connecting centers of LEDs included in the one of the first groups of LEDs.

14. The display of claim 12, wherein a center of one of the second groups of LEDs substantially corresponds to a center of a polygon defined by connecting centers of some of the first groups of LEDs surrounding the one of the second groups of LEDs.

15. The display of claim 12, wherein the polygon comprises a rhombus or a square.

16. The display of claim 1, wherein light, transmitted from LEDs included in the first groups of LEDs through the first light transmittance portions, has a first viewing angle, and wherein light, transmitted from the LEDs included in the second groups of LEDs through the third light transmittance portions, has a second viewing angle narrower than the first viewing angle.

17. An electronic device comprising:

gate driver circuitry; and a display panel including:

a first layer including a black matrix (BM) that defines first light transmittance portions and second light transmittance portions, wherein the first light transmittance portions and the second light transmittance portions alternate with each other, and wherein each of the second light transmittance portions includes third light transmittance portions, smaller than the first light transmittance portions, and a second layer, disposed below the first layer, including light emitting diodes (LEDs), the LEDs including:

first groups of LEDs that are respectively disposed below the first light transmittance portions, and second groups of LEDs, wherein each of the second groups of LEDs includes LEDs respectively disposed below the third light transmittance portions included in each of the second light transmittance portions, wherein sub-pixels, respectively including the LEDs included in each of the second groups of LEDs, include:

a first sub-pixel electrically connected to the gate driver circuitry through a scan line, and second sub-pixels electrically connected to the gate driver circuitry through another scan line positioned alongside the scan line electrically connected to the first sub-pixel.

18. The electronic device of claim 17, wherein sub-pixels, respectively including LEDs included in each of the first groups of LEDs, include:

a third sub-pixel electrically connected to the gate driver circuitry through a scan line; and fourth sub-pixels electrically connected to the gate driver circuitry through another scan line positioned alongside the scan line electrically connected to the third sub-pixel.

19. The electronic device of claim 18, wherein a scan line electrically connected to the first sub-pixel is further electrically connected to the fourth sub-pixels, and wherein a scan line electrically connected to the third sub-pixel is further electrically connected to the second sub-pixels.

20. The electronic device of claim 19, wherein the number of the sub-pixels respectively including the LEDs included in each of the first groups of LEDs is 4, wherein the number of the sub-pixels respectively including the LEDs included in each of the second groups of LEDs is 4, wherein the number of the second sub-pixels is 3, and wherein the number of the fourth sub-pixels is 3.

* * * * *